United States Patent
Sirinorakul

(10) Patent No.: US 10,242,934 B1
(45) Date of Patent: Mar. 26, 2019

(54) SEMICONDUCTOR PACKAGE WITH FULL PLATING ON CONTACT SIDE SURFACES AND METHODS THEREOF

(71) Applicant: UTAC Headquarters PTE. LTD., Singapore (SG)

(72) Inventor: Saravuth Sirinorakul, Bangkok (TH)

(73) Assignee: Utac Headquarters PTE Ltd., Singapore (SG)

( * ) Notice: Subject to any disclaimer, the term of this patent is extended or adjusted under 35 U.S.C. 154(b) by 64 days.

(21) Appl. No.: 15/649,466

(22) Filed: Jul. 13, 2017

Related U.S. Application Data

(63) Continuation-in-part of application No. 15/601,963, filed on May 22, 2017, which is a continuation of application No. 15/042,050, filed on Feb. 11, 2016, now Pat. No. 9,741,642, which is a continuation-in-part of application No. 14/706,864, filed on May 7, 2015, now Pat. No. 9,773,722.

(60) Provisional application No. 62/429,314, filed on Dec. 2, 2016, provisional application No. 62/126,262, filed on Feb. 27, 2015, provisional application No. 61/990,040, filed on May 7, 2014.

(51) Int. Cl.
*H01L 23/31* (2006.01)
*H01L 23/495* (2006.01)

(52) U.S. Cl.
CPC .... *H01L 23/49541* (2013.01); *H01L 23/3114* (2013.01); *H01L 23/49503* (2013.01)

(58) Field of Classification Search
CPC ............. H01L 23/3107; H01L 23/4952; H01L 23/49524; H01L 23/49582; H01L 21/56–21/568; H01L 23/28–23/3192; H01L 23/495–23/49596; H01L 21/78
See application file for complete search history.

(56) References Cited

U.S. PATENT DOCUMENTS

| | | |
|---|---|---|
| 3,611,061 A | 10/1971 | Segerson |
| 4,411,719 A | 10/1983 | Lindberg |

(Continued)

OTHER PUBLICATIONS

Non-Final Office Action dated May 26, 2011, U.S. Appl. No. 12/579,600, filed Oct. 15, 2009, Woraya Benjavasukul et al.

(Continued)

*Primary Examiner* — William F Kraig
*Assistant Examiner* — Khatib A Rahman
(74) *Attorney, Agent, or Firm* — Haverstock & Owens LLP

(57) ABSTRACT

Embodiments of the present invention are directed to a semiconductor package with full plating on contact side surfaces. The semiconductor package includes a top surface, a bottom surface opposite the top surface, and side surfaces between the top and bottom surfaces. Contacts are located on peripheral edges of the bottom surface. Each of the contacts includes a first surface that is flush with the bottom surface and a second surface that is at one of the side surfaces. The first surface and the second surface of each of the contacts are continuously plated. Portions of an internal plating layer are exposed along the side surfaces of the semiconductor package. The semiconductor package has a molding compound at least partially encapsulating the contacts, wherein the surface of a first part of the molding compound and the surface of a second part of the molding compound have different surface texture.

20 Claims, 51 Drawing Sheets

Cross Section After Plating

(56) References Cited

U.S. PATENT DOCUMENTS

| | | |
|---|---|---|
| 4,501,960 A | 2/1985 | Jouvet et al. |
| 4,801,561 A | 1/1989 | Sankhagowit |
| 4,827,376 A | 5/1989 | Voss |
| 4,855,672 A | 8/1989 | Shreeve |
| 5,247,248 A | 9/1993 | Fukunaga |
| 5,248,075 A | 9/1993 | Young et al. |
| 5,396,185 A | 3/1995 | Honma et al. |
| 5,397,921 A | 3/1995 | Karnezos |
| 5,455,455 A | 10/1995 | Badehi |
| 5,479,105 A | 12/1995 | Kim et al. |
| 5,535,101 A | 7/1996 | Miles et al. |
| 5,596,231 A | 1/1997 | Combs |
| 5,843,808 A | 12/1998 | Karnezos |
| 5,866,949 A | 2/1999 | Schueller |
| 5,990,692 A | 11/1999 | Jeong et al. |
| 6,072,239 A | 6/2000 | Yoneda et al. |
| 6,111,324 A | 8/2000 | Sheppard et al. |
| 6,136,460 A | 10/2000 | Chen et al. |
| 6,159,770 A | 12/2000 | Tetaka et al. |
| 6,229,200 B1 | 5/2001 | Mclellan et al. |
| 6,242,281 B1 | 6/2001 | Mclellan et al. |
| 6,284,569 B1 | 9/2001 | Sheppard et al. |
| 6,285,075 B1 | 9/2001 | Combs et al. |
| 6,294,100 B1 | 9/2001 | Fan et al. |
| 6,304,000 B1 | 10/2001 | Isshiki et al. |
| 6,326,678 B1 | 12/2001 | Karnezos et al. |
| 6,329,711 B1 | 12/2001 | Kawahara et al. |
| 6,353,263 B1 | 3/2002 | Dotta et al. |
| 6,376,921 B1 | 4/2002 | Yoneda et al. |
| 6,392,427 B1 | 5/2002 | Yang |
| 6,400,004 B1 | 6/2002 | Fan et al. |
| 6,414,385 B1 | 7/2002 | Huang et al. |
| 6,429,048 B1 | 8/2002 | McLellan et al. |
| 6,451,709 B1 | 9/2002 | Hembree |
| 6,455,348 B1 | 9/2002 | Yamaguchi |
| 6,489,218 B1 | 12/2002 | Kim et al. |
| 6,498,099 B1 | 12/2002 | McLellan et al. |
| 6,506,314 B1 | 1/2003 | Whitney, Jr. et al. |
| 6,507,116 B1 | 1/2003 | Caletka et al. |
| 6,545,332 B2 | 4/2003 | Huang |
| 6,545,347 B2 | 4/2003 | McClellan |
| 6,552,417 B2 | 4/2003 | Combs |
| 6,552,423 B2 | 4/2003 | Song et al. |
| 6,566,740 B2 | 5/2003 | Yasunaga et al. |
| 6,573,121 B2 | 6/2003 | Yoneda et al. |
| 6,585,905 B1 | 7/2003 | Fan et al. |
| 6,586,834 B1 | 7/2003 | Sze et al. |
| 6,635,957 B2 | 10/2003 | Kwan et al. |
| 6,639,308 B1 | 10/2003 | Crowley et al. |
| 6,660,626 B1 | 12/2003 | Lin |
| 6,667,191 B1 | 12/2003 | McLellan et al. |
| 6,686,667 B2 | 2/2004 | Chen et al. |
| 6,703,696 B2 | 3/2004 | Ikenaga et al. |
| 6,724,071 B2 | 4/2004 | Combs |
| 6,734,044 B1 | 5/2004 | Fan et al. |
| 6,734,552 B2 | 5/2004 | Combs et al. |
| 6,737,755 B1 | 5/2004 | McLellan et al. |
| 6,764,880 B2 | 7/2004 | Wu et al. |
| 6,781,242 B1 | 8/2004 | Fan et al. |
| 6,800,948 B1 | 10/2004 | Fan et al. |
| 6,812,552 B2 | 11/2004 | Islam et al. |
| 6,818,472 B1 | 11/2004 | Fan et al. |
| 6,818,978 B1 | 11/2004 | Fan |
| 6,818,980 B1 | 11/2004 | Pedron, Jr. |
| 6,841,859 B1 | 1/2005 | Thamby et al. |
| 6,876,066 B2 | 4/2005 | Fee et al. |
| 6,897,428 B2 | 5/2005 | Minamio et al. |
| 6,933,176 B1 | 8/2005 | Kirloskar et al. |
| 6,933,694 B2 | 8/2005 | McLellan et al. |
| 6,940,154 B2 | 9/2005 | Pedron et al. |
| 6,946,324 B1 | 9/2005 | McLellan et al. |
| 6,964,918 B1 | 11/2005 | Fan et al. |
| 6,967,126 B2 | 11/2005 | Lee et al. |
| 6,969,638 B2 | 11/2005 | Estepa et al. |
| 6,979,594 B1 | 12/2005 | Fan et al. |
| 6,982,491 B1 | 1/2006 | Fan et al. |
| 6,984,785 B1 | 1/2006 | Diao et al. |
| 6,989,294 B1 | 2/2006 | McLellan et al. |
| 6,995,460 B1 | 2/2006 | McLellan et al. |
| 7,008,825 B1 | 3/2006 | Bancod et al. |
| 7,009,286 B1 | 3/2006 | Kirloskar et al. |
| 7,049,177 B1 | 5/2006 | Fan et al. |
| 7,060,535 B1 | 6/2006 | Sirinorakul et al. |
| 7,071,545 B1 | 7/2006 | Patel et al. |
| 7,091,581 B1 | 8/2006 | McLellan et al. |
| 7,101,210 B2 | 9/2006 | Lin et al. |
| 7,102,210 B2 | 9/2006 | Ichikawa |
| 7,224,048 B1 | 5/2007 | McLellan et al. |
| 7,205,178 B2 | 7/2007 | Shiu et al. |
| 7,247,526 B1 | 7/2007 | Fan et al. |
| 7,274,088 B2 | 9/2007 | Wu et al. |
| 7,314,820 B2 | 1/2008 | Lin et al. |
| 7,315,080 B1 | 1/2008 | Fan et al. |
| 7,320,937 B1 | 1/2008 | Pal et al. |
| 7,342,305 B1 | 3/2008 | Diao et al. |
| 7,344,920 B1 | 3/2008 | Kirloskar et al. |
| 7,348,663 B1 | 3/2008 | Kirloskar et al. |
| 7,358,119 B2 | 4/2008 | McLellan et al. |
| 7,371,610 B1 | 5/2008 | Fan et al. |
| 7,372,151 B1 | 5/2008 | Fan et al. |
| 7,381,588 B1 | 6/2008 | Patel et al. |
| 7,399,658 B2 | 7/2008 | Shim et al. |
| 7,408,251 B2 | 8/2008 | Hata et al. |
| 7,411,289 B1 | 8/2008 | McLellan et al. |
| 7,449,771 B1 | 11/2008 | Fan et al. |
| 7,482,690 B1 | 1/2009 | Fan et al. |
| 7,595,225 B1 | 9/2009 | Fan et al. |
| 7,714,418 B2 | 5/2010 | Lim et al. |
| 8,071,427 B2 * | 12/2011 | Celaya ............... H01L 21/561 257/666 |
| 8,084,299 B2 | 12/2011 | Tan |
| 9,349,679 B2 * | 5/2016 | Sirinorakul ........ H01L 21/561 |
| 2002/0125550 A1 | 9/2002 | Estacio |
| 2003/0006055 A1 | 1/2003 | Chien-Hung et al. |
| 2003/0045032 A1 | 3/2003 | Abe |
| 2003/0071333 A1 | 4/2003 | Matsuzawa |
| 2003/0143776 A1 | 7/2003 | Pedron, Jr. et al. |
| 2003/0178719 A1 | 9/2003 | Combs et al. |
| 2003/0201520 A1 | 10/2003 | Knapp et al. |
| 2003/0207498 A1 | 11/2003 | Islam et al. |
| 2004/0014257 A1 | 1/2004 | Kim et al. |
| 2004/0046237 A1 | 3/2004 | Abe et al. |
| 2004/0046241 A1 | 3/2004 | Combs et al. |
| 2004/0080025 A1 | 4/2004 | Kasahara et al. |
| 2004/0110319 A1 | 6/2004 | Fukutomi et al. |
| 2004/0209443 A1 | 10/2004 | Cadieux et al. |
| 2005/0003586 A1 | 1/2005 | Shimanuki et al. |
| 2005/0037618 A1 | 2/2005 | Lee et al. |
| 2005/0077613 A1 | 4/2005 | McLellan et al. |
| 2006/0192295 A1 | 8/2006 | Lee et al. |
| 2006/0223229 A1 | 10/2006 | Kirloskar et al. |
| 2006/0223237 A1 | 10/2006 | Combs et al. |
| 2006/0273433 A1 | 12/2006 | Itou et al. |
| 2007/0001278 A1 | 1/2007 | Jeon et al. |
| 2007/0090497 A1 | 4/2007 | Abbott |
| 2007/0090529 A1 | 4/2007 | McCarthy et al. |
| 2007/0200210 A1 | 8/2007 | Zhao et al. |
| 2007/0235217 A1 | 10/2007 | Workman |
| 2008/0048308 A1 | 2/2008 | Lam |
| 2008/0150094 A1 | 6/2008 | Anderson |
| 2008/0246132 A1 | 10/2008 | Kasuya et al. |
| 2009/0039530 A1 | 2/2009 | Fryklund |
| 2009/0294928 A1 | 12/2009 | Kim et al. |
| 2010/0207258 A1 | 8/2010 | Eun et al. |
| 2011/0115066 A1 | 5/2011 | Kim |
| 2011/0244629 A1 * | 10/2011 | Gong ............... H01L 21/4828 438/112 |
| 2012/0241922 A1 | 9/2012 | Pagaila |
| 2012/0295085 A1 | 11/2012 | Iida et al. |
| 2012/0295484 A1 | 11/2012 | Sato et al. |
| 2013/0307000 A1 * | 11/2013 | Ikenaga ............. H01L 33/486 257/91 |
| 2014/0167232 A1 | 6/2014 | LoBianco et al. |
| 2016/0174374 A1 | 6/2016 | Kong et al. |

(56) References Cited

U.S. PATENT DOCUMENTS

OTHER PUBLICATIONS

Notice of Publication dated Sep. 29, 2011, U.S. Appl. No. 13/156,257, filed Jun. 8, 2011, Woraya Benjavasukul et al.
Final Office Action dated Nov. 8, 2011, U.S. Appl. No. 12/579,600, filed Oct. 15, 2009, Woraya Benjavasukul et al.
Final Office Action dated Jul. 24, 2012, U.S. Appl. No. 13/156,257, filed Jun. 8, 2011, Woraya Benjavasukul et al.

* cited by examiner

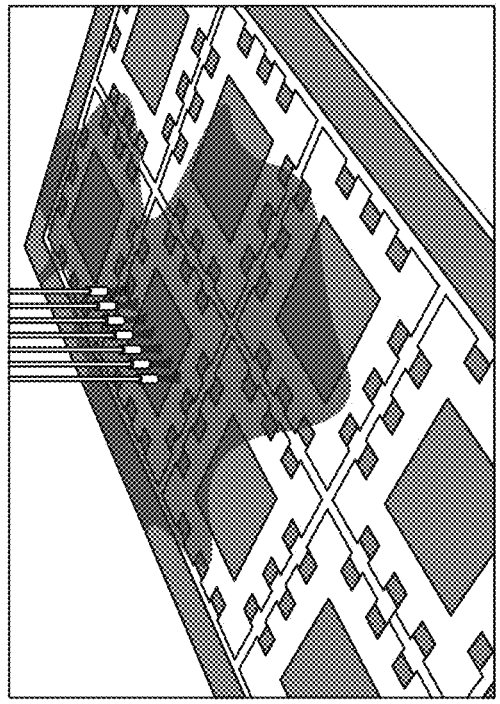
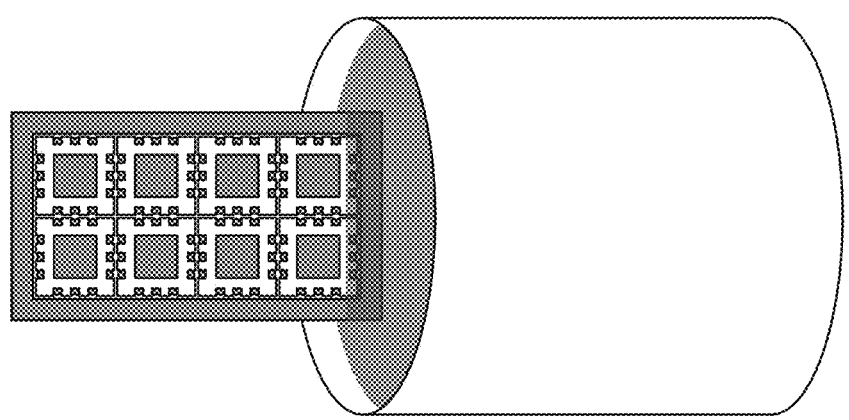
Fig. 4E

W 1 is width of chemical etching trace

455

465  460

Bottom side of the package

Top side of the package

Cross Section

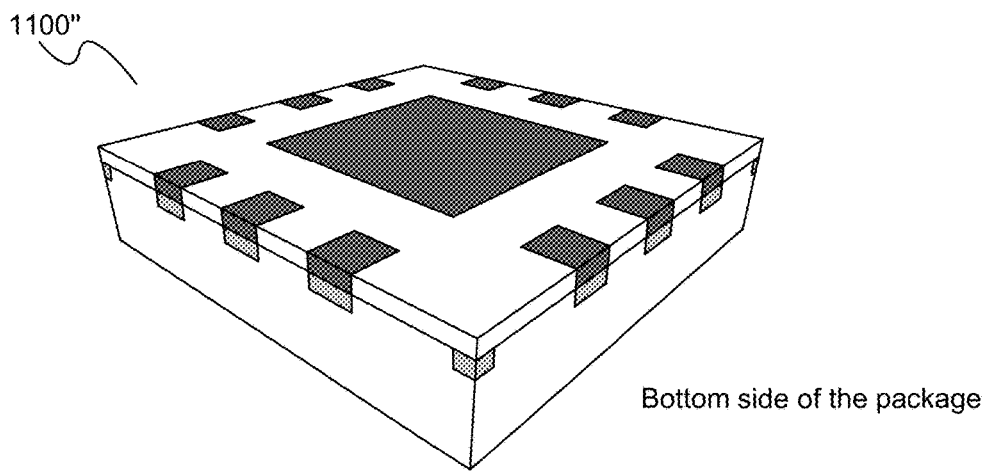
Bottom side of the package
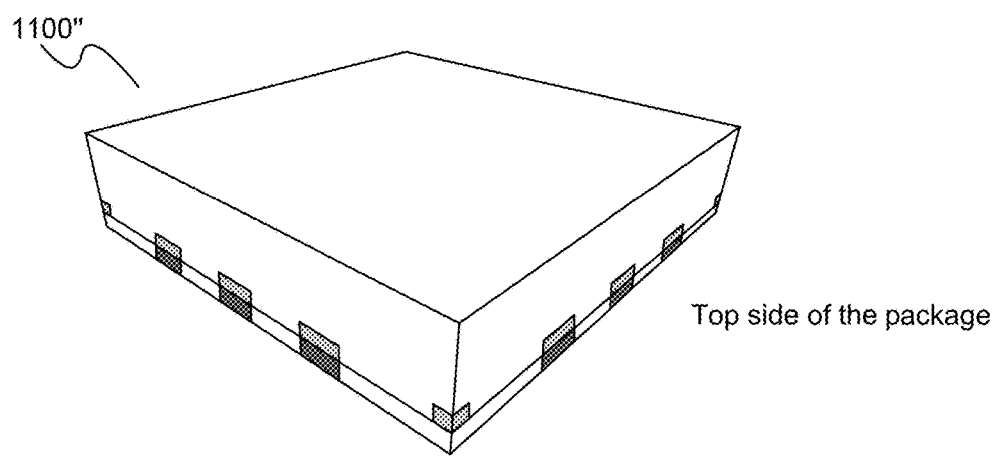
Top side of the package
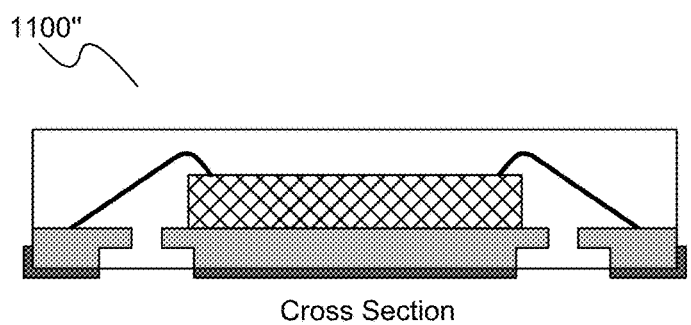
Cross Section
Fig. 11C

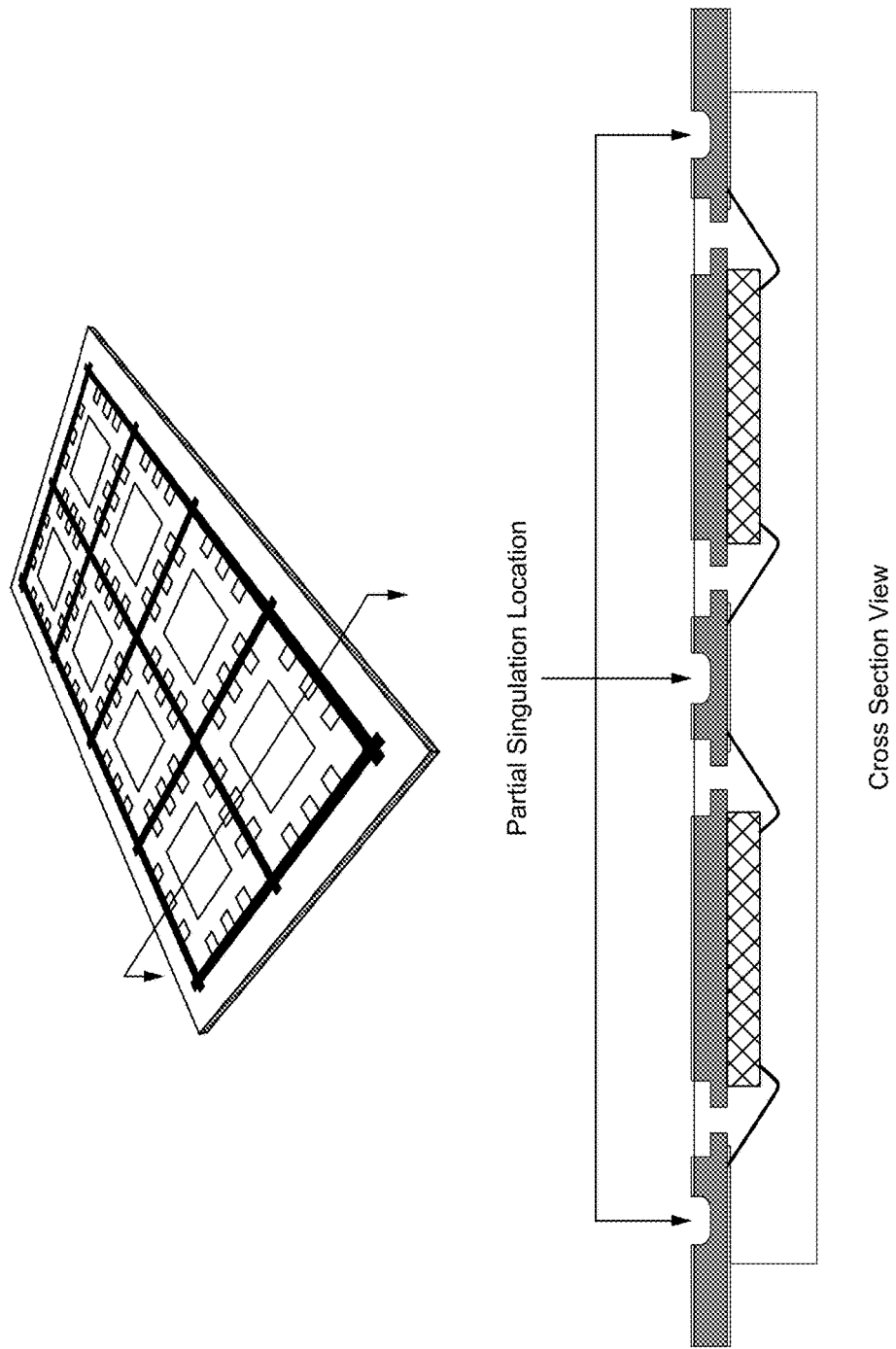

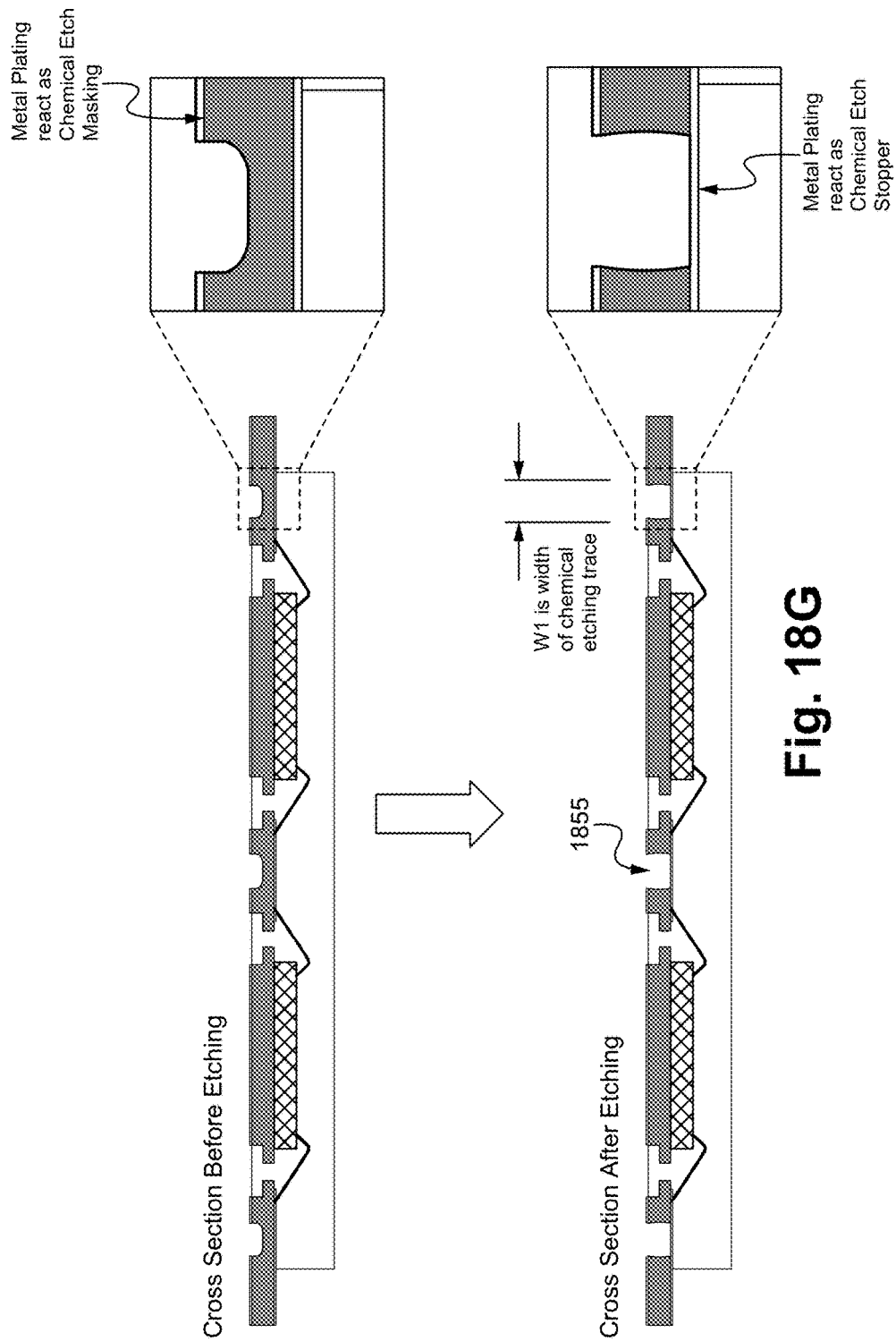

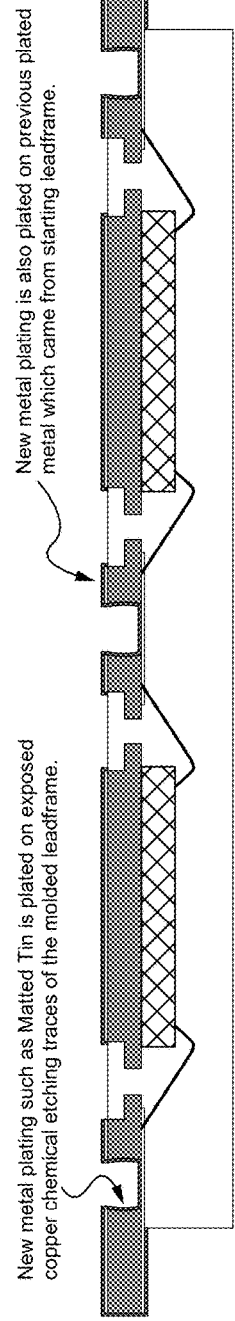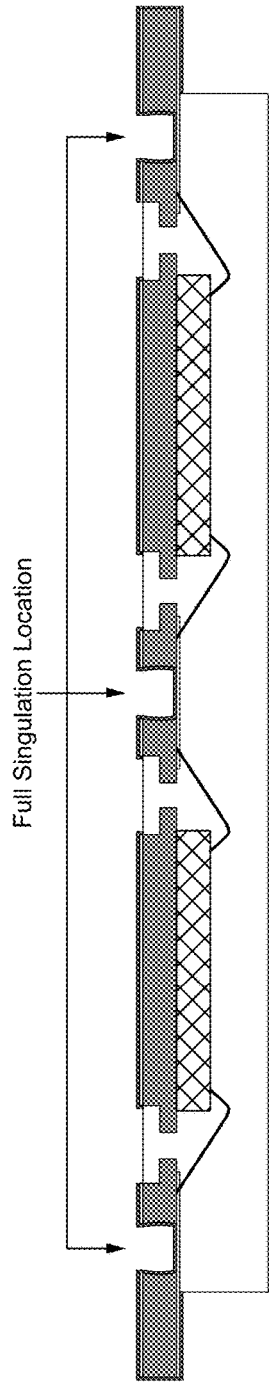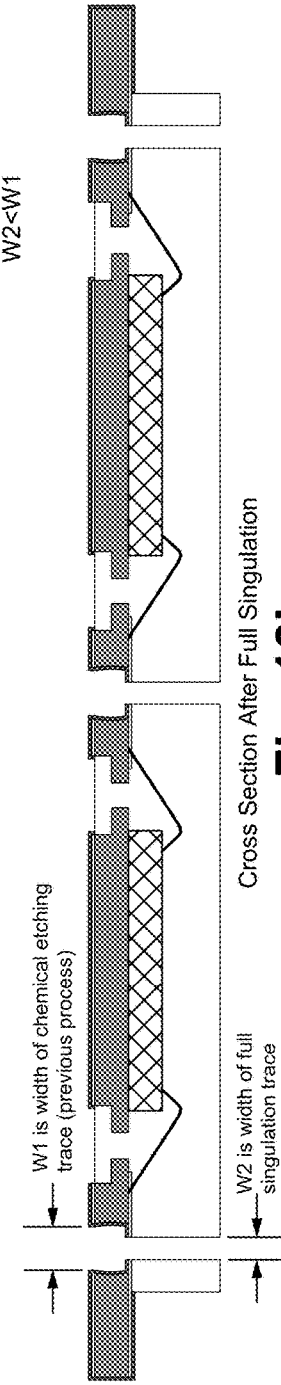
Fig. 18H Cross Section After Plating
Fig. 18I Cross Section After Full Singulation

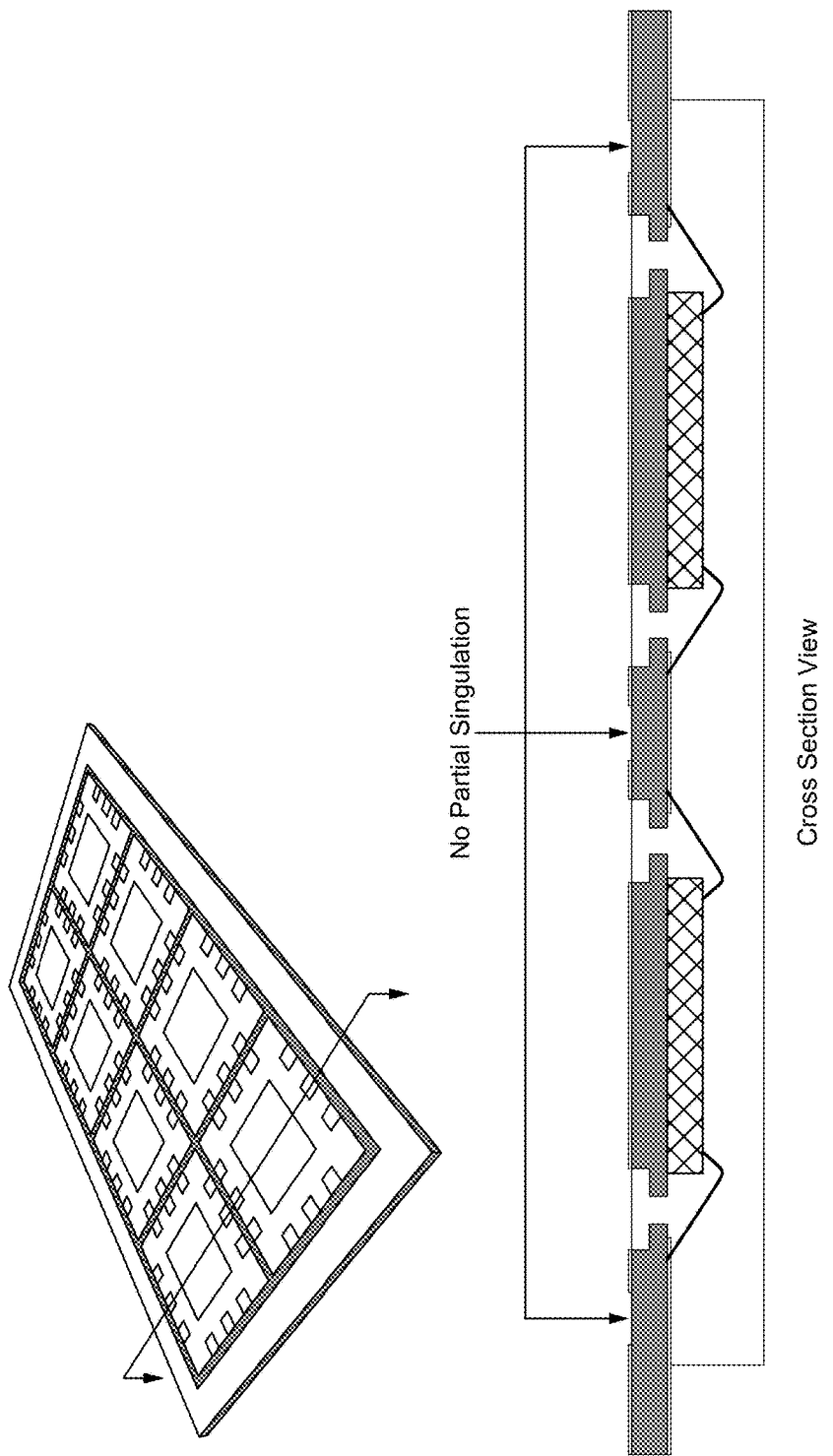

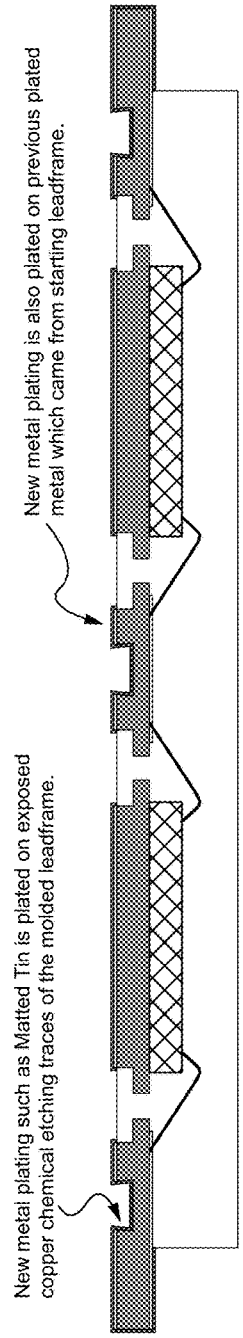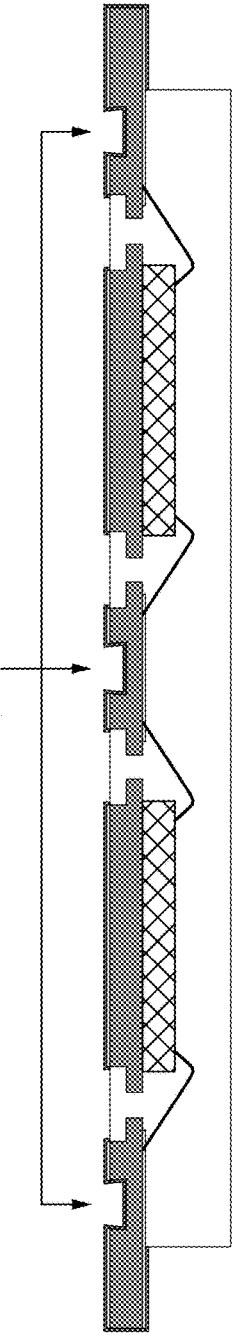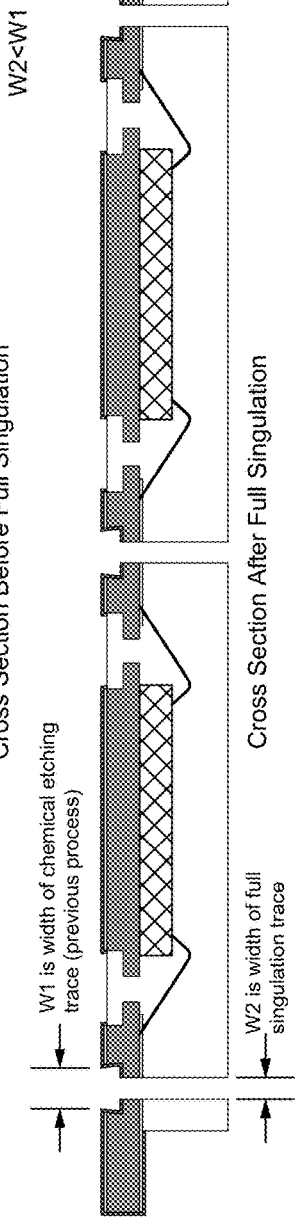

US 10,242,934 B1

SEMICONDUCTOR PACKAGE WITH FULL PLATING ON CONTACT SIDE SURFACES AND METHODS THEREOF

RELATED APPLICATIONS

This application claims benefit of priority under 35 U.S.C. § 119(e) of the U.S. Provisional Patent Application Ser. No. 62/429,314, filed Dec. 2, 2016, entitled "Semiconductor Package with Full Plated on Side Terminals," which is hereby incorporated by reference in its entirety.

This application is a continuation-in-part and claims priority under 35 U.S.C. § 120 of the U.S. patent application Ser. No. 15/601,963, filed May 22, 2017, entitled "A Semiconductor Package with Partial Plating on Contact Side Surfaces," which in turn is a continuation and claims priority under 35 U.S.C. § 120 of the U.S. patent application Ser. No. 15/042,050, filed Feb. 11, 2016, entitled "A Semiconductor Package with Partial Plating on Contact Side Surfaces," which in turn claims benefit of priority under 35 U.S.C. § 119(e) of the U.S. Provisional Patent Application Ser. No. 62/126,262, filed Feb. 27, 2015, entitled "Semiconductor Package with Partial Plated on Side Terminals," all of which is are hereby incorporated by reference in their entirety as if set forth herein.

U.S. patent application Ser. No. 15/042,050, filed Feb. 11, 2016, entitled "A Semiconductor Package with Partial Plating on Contact Side Surfaces," is a continuation-in-part and claims priority under 35 U.S.C. § 120 of the U.S. patent application Ser. No. 14/706,864, filed May 7, 2015, entitled "Semiconductor Package with Partial Plating on Contact Side Surfaces," which in turn claims benefit of priority under 35 U.S.C. § 119(e) of the U.S. Provisional Patent Application Ser. No. 61/990,040, filed May 7, 2014, entitled "Semiconductor Package with Partial Plated on Side Terminals," and of the U.S. Provisional Patent Application Ser. No. 62/126,262, filed Feb. 27, 2015, entitled "Semiconductor Package with Partial Plated on Side Terminals," all of which is are hereby incorporated by reference in their entirety as if set forth herein.

FIELD OF INVENTION

The present invention is related to the field of semiconductor package manufacturing. More specifically, the present invention relates to a semiconductor package with full plating on contact side surfaces.

BACKGROUND OF THE INVENTION

Embodiments of the present invention are directed to a semiconductor package with full plating on contact side surfaces. The semiconductor package includes a top surface, a bottom surface opposite the top surface, and side surfaces between the top and bottom surfaces. Contacts are located on peripheral edges of the bottom surface. Each of the contacts includes a first surface that is flush with the bottom surface and a second surface that is at one of the side surfaces. The first surface and the second surface of each of the contacts are continuously plated. Portions of an internal plating layer are exposed along the side surfaces of the semiconductor package. The semiconductor package has a molding compound at least partially encapsulating the contacts, wherein the surface of a first part of the molding compound and the surface of a second part of the molding compound have different surface texture.

A semiconductor device array contains individual integrated circuits or semiconductor packages. Contacts of the semiconductor packages are exposed at the bottom of the semiconductor array. The contacts are typically made of copper. To prevent oxidation on the copper surface, the contacts are plated with a lead finished material, such as matte tin (Sn), using electroplating. As a result, the bottom surfaces of the contacts are thereafter tin plated.

Singulation is a process of separating each semiconductor package from a molded sheet. Dicing or sawing is a process that singulates the semiconductor array into individual or singulated semiconductor packages. Conventionally, the electroplated semiconductor array is diced into singulated semiconductor packages to be shipped to customers for assembly onto printed circuit boards. The singulation of the semiconductor packages result in contacts on peripheral edges of the singulated semiconductor packages.

FIG. 1 illustrates a singulated semiconductor package 100 having a plurality of contacts 105 on peripheral edges of the singulated semiconductor package. Although the bottoms of the contacts 105a are tin plated, sidewalls 105b of the contacts 105b are exposed (e.g., without tin plating), because the singulation occurred after the semiconductor array was electroplated with the lead finished material. If the singulated semiconductor package 100 is stored in inappropriate environments and/or conditions (e.g., moisture in the air, acids, bases, salts, oils, aggressive metal polished, and other solid and liquid chemicals) after singulation, then the exposed surfaces 105b become sites for potential corrosion 110 such as copper oxide. This aging process is known as oxidation. The exposed surfaces 105b, usually deposited with pollutant layers of oxide and other nonmetallic compound 110, often interfere with or inhibit solder wettability. The resulting oxide layer reduces solderability because contamination 110 prevents the metal from soldering well. The rate of oxidation can increase with an increase in temperature or humidity. Solder problems are a common cause for device failures.

A perfectly clean surface is required for assembly of the singulated semiconductor packages 100 onto a substrate, such as a printed circuit board. Since metal oxides form a barrier that prevents molten solder from forming a true metallurgical bond, the metal oxides must be limited.

BRIEF SUMMARY OF THE INVENTION

In one aspect, a semiconductor package is provided. The semiconductor package includes a bottom package surface, a top package surface, and side package surfaces that extend between the top package surface and the bottom package surface. The semiconductor package also includes a semiconductor die and a formed leadframe having a plurality of contacts. Each of the plurality of contacts includes an interfacing contact surface that is flush with the bottom package surface, an interior contact surface that is opposite the interfacing contact surface and that is electrically coupled with the semiconductor die, and a side contact surface that is at one of the side package surfaces. In some embodiments, the thickness of each of the plurality of the contacts is the depth of the first portion of the molding compound.

The semiconductor package also includes a molding compound that encapsulates the semiconductor die and at least a portion of each of the plurality of contacts. The molding compound includes a first portion and a second portion, and at least a part of a surface of first portion of the molding compound and a surface of the second portion of the molding compound have different textured consistencies. The semiconductor package also includes an internal plating layer between the formed leadframe and the molding compound, wherein the internal plating layer includes exterior ends that are flush with the second portion of the molding compound and is adhered to the interior contact surfaces of the plurality of contacts, and an external plating layer that is continuous plating layer directly adhered to both the interfacing surface and the side contact surface.

The semiconductor package also includes a bottom set of peripheral edges and a top set of peripheral edges. In some embodiments, the semiconductor package further includes an intermediary set of peripheral edges located between the bottom set of peripheral edges and the top set of peripheral edges.

In some embodiments, the first portion of the molding compound is between the bottom set of peripheral edges and the intermediary set of peripheral edges, and the second portion of the molding compound is between the intermediary set of peripheral edges and the top set of peripheral edges.

In some embodiments, the semiconductor package also includes steps at sides of the semiconductor package. Each of the steps includes a landing surface at a side of the semiconductor package, runs the length of the side of the semiconductor package, separates a corresponding side package surface into a first portion of the corresponding side package surface and a second portion of the corresponding side package surface, and distinguishes the first portion of the molding compound from the second portion of the molding compound.

In some embodiments, the first portion of the corresponding side package surface is a surface of the first portion of the molding compound, and the second portion of the corresponding side package surface is a surface of the second portion of the molding compound.

In some embodiments, the internal plating layer further includes planar surfaces that are flush with the landing surfaces of the steps.

In some embodiments, the external plating layer continuously extends from the side contact surface to and is directly adhered with the entirety of one of the planar surfaces of the internal plating layer.

In some embodiments, the formed leadframe further includes tie bars and die attach pad coupled with the tie bars. In some embodiments, a portion of the tie bars is flush with the surface of first portion of the molding compound. In some embodiments, the portion of the tie bars that is flush with the surface of first portion of the molding compound, is externally plated. In some embodiments, the internal plating layer is also adhered with the tie bars.

In another aspect, a method of manufacturing semiconductor packages is provided. The method includes obtaining an etched leadframe strip includes a plurality of dam bars and a plurality of contacts coupled with the plurality of dam bars, at least partially plating a top side and at least partially plating a bottom side of the etched leadframe strip with a first plating material, electrically coupling a plurality of semiconductor dice with the plurality of contacts, encapsulating the plurality of semiconductor dice with a molding compound resulting in a molded leadframe strip, performing a chemical etching procedure such that at least a portion of the etched leadframe strip is removed, exposing a first plurality of areas of the etched leadframe at a first portion of the molding compound, plating the first plurality of areas of the etched leadframe with a second plating material, and performing partial cuts on the molding compound through a second portion of the molding compound and towards the plated areas, thereby singulating each of the semiconductor packages.

In some embodiments, a surface of the first portion of the molding compound and a surface the second portion of the molding compound of each of the singulated semiconductor packages have different surface topographies.

In some embodiments, portions of the first plating material that is between the etched leadframe strip and the molding compound are exposed on sides of each of the singulated semiconductor packages.

In some embodiments, the chemical etching procedure electrically isolates the plurality of semiconductor dice.

In some embodiments, the method further includes, after encaspulating the plurality of semiconductor dice and before performing a chemical etching procedure, performing a partial cuts on the bottom side of the etched leadframe and along the dam bars.

In some embodiments, at least one of the top side of the etched leadframe strip and the bottom side of the etched leaframe strip is fully plated with the first plating material.

In some embodiments, the partial cuts and the chemical etching procedure results in steps formed along sides of each of the singulated semiconductor packages.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIGS. 4A-4K illustrate an exemplary result produced at each step of the method of FIG. 3.

FIGS. 18A-18I illustrate an exemplary result produced at each step of the method of FIG. 17.

DETAILED DESCRIPTION OF THE INVENTION

In the following description, numerous details are set forth for purposes of explanation. However, one of ordinary skill in the art will realize that the invention can be practiced without the use of these specific details. Thus, the present invention is not intended to be limited to the embodiments shown but is to be accorded the widest scope consistent with the principles and features described herein.

Figure 1:
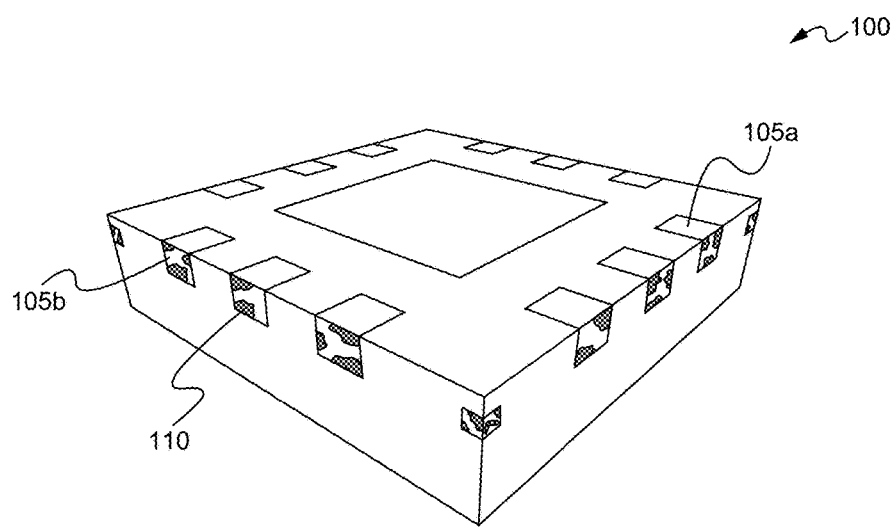
FIG. 1 illustrates a singulated semiconductor package having a plurality of contacts on peripheral edges of the singulated semiconductor package.
Figure 2:
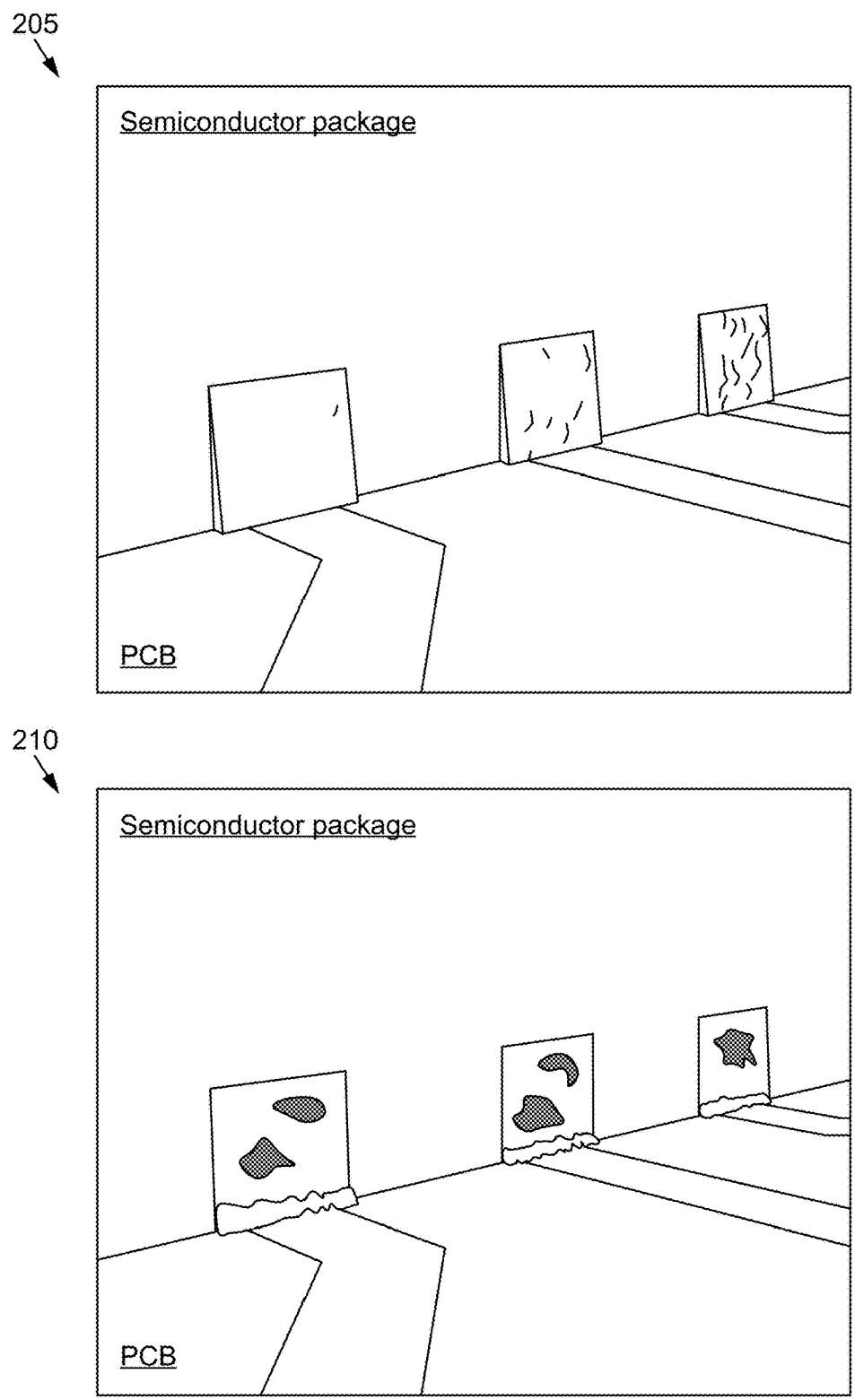
FIG. 2 illustrates two exemplary pictures, each of a package soldered on a PCB.

In a conventional semiconductor package, such as the semiconductor package 100 of FIG. 1, side surfaces of its contacts are not plated. When the semiconductor package is soldered to a substrate, such as a printed circuit board (PCB), an expected (such as complete) solder coverage on the side surfaces of the contacts of the semiconductor package is preferred since such coverage ensures the quality of the soldering to the PCB. If there is an unexpected (such as lack of) solder coverage on the side surfaces of the contacts of the semiconductor package, then there could be issues with the soldering. As discussed in the Background of the Invention section of the present application, metal oxide on the copper surfaces of the contacts prevents sufficient solder coverage on the copper surfaces during soldering. Plating metal, such as matted tin, on the copper surfaces can prevent the occurrence of metal oxide on the surfaces. The solder can "move" to cover the plated metal surfaces when the semiconductor package is being soldered to the PCB. FIG. 2 illustrates two exemplary pictures, each of a semiconductor package soldered on a PCB. The picture 205 on the left shows complete solder coverage on the side surfaces of the contacts, while the picture on the right 210 shows unexpected solder coverage on the side surfaces of the contacts. By visual inspection, complete solder coverage on the contacts can ensure quality of the soldering, while unexpected solder coverage on the contacts can lead to questions regarding quality of the soldering. However, plating the side surfaces of contacts requires an additional processing step as these side surfaces are exposed upon singulation of the semiconductor package from other semiconductor packages.

Partial Plating on Contact Side Surfaces

Some embodiments of the present invention are directed to a semiconductor package with partial plating on contact side surfaces. The semiconductor package includes a top surface, a bottom surface opposite the top surface, and side surfaces between the top and bottom surfaces. Contacts are located on peripheral edges of the bottom surface. Each of the contacts includes a first surface that is flush with the bottom surface, a second surface that is flush with one of the side surfaces, and a third surface between the first surface and the second surface. Each of the side surfaces can include a step such that the area of the bottom surface is differently sized from the area of the top surface and the third surface is located at the step. The first surface is plated, while the second surface is exposed (not plated). At least a portion of the third surface is plated.

A contact of the semiconductor package of the present invention includes a first surface, a second surface and a third surface. A side surface of the contact refers herein to the third surface and the second surface of the contact. As discussed below, no additional processing step is required to partially plate contact side surfaces. The semiconductor package with partial plating on its contact side surfaces ensures quality of soldering of the semiconductor package to a substrate, such as a PCB, even if unplated areas of the contact side surfaces are contaminated. It should be noted that the terms "contact," "terminal," and "connector" are used interchangeably herein. It should also be noted that the "sidewalls" of a contact and the "side surfaces" of a contact are used interchangeably herein.

Chemical Etching to Half Etch Leadframe

In some embodiments, a chemical etch is used on one side of a leadframe to half etch the leadframe and, then, a mechanical saw is used on the other side of the leadframe to half cut the leadframe, thereby singulating semiconductor packages from each other. In some embodiments, the chemical etching results in the third surface of each contact being curved.

Figure 3:
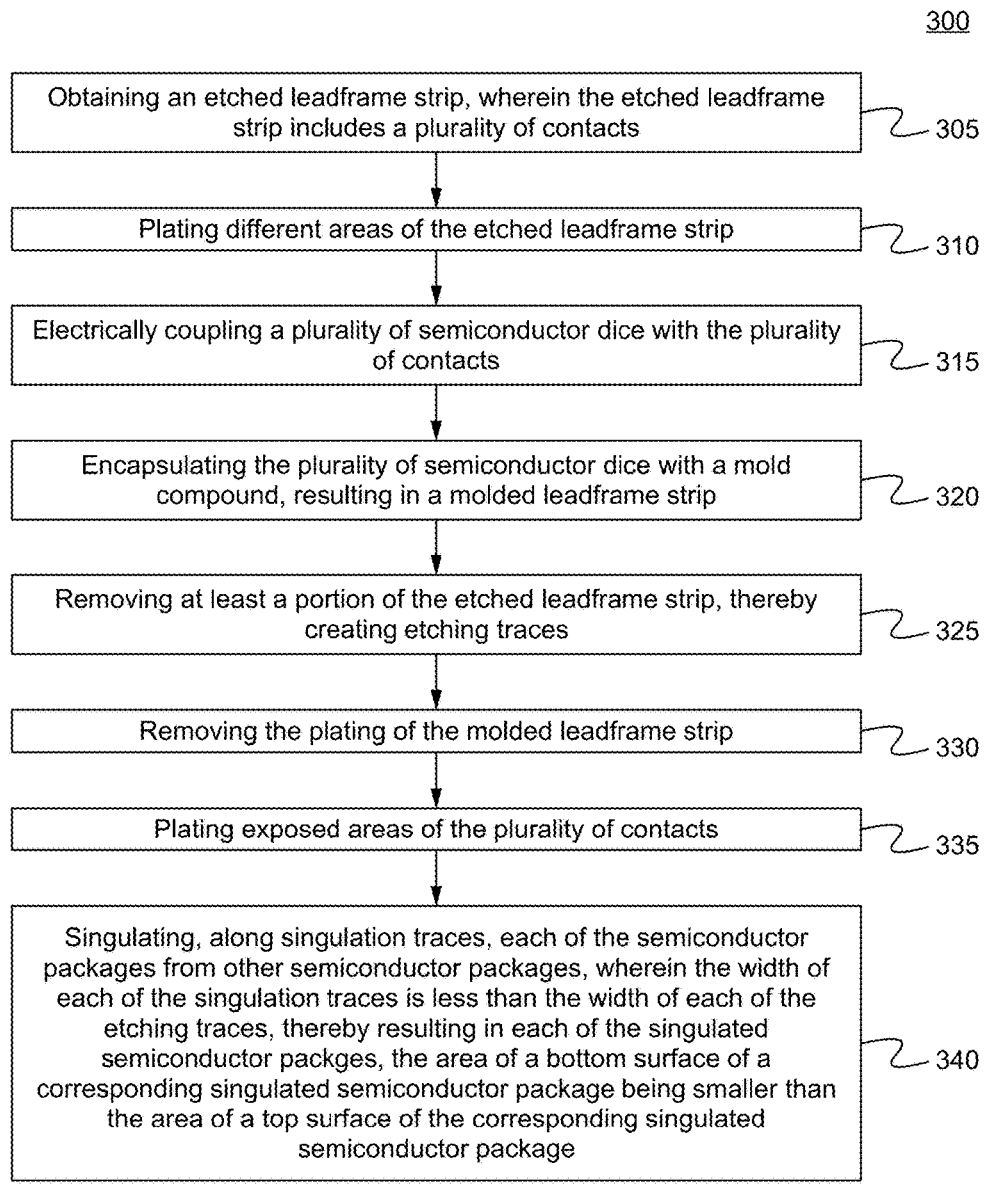
FIG. 3 illustrates an exemplary method of manufacturing semiconductor packages according to some embodiments.
Figure 4A:
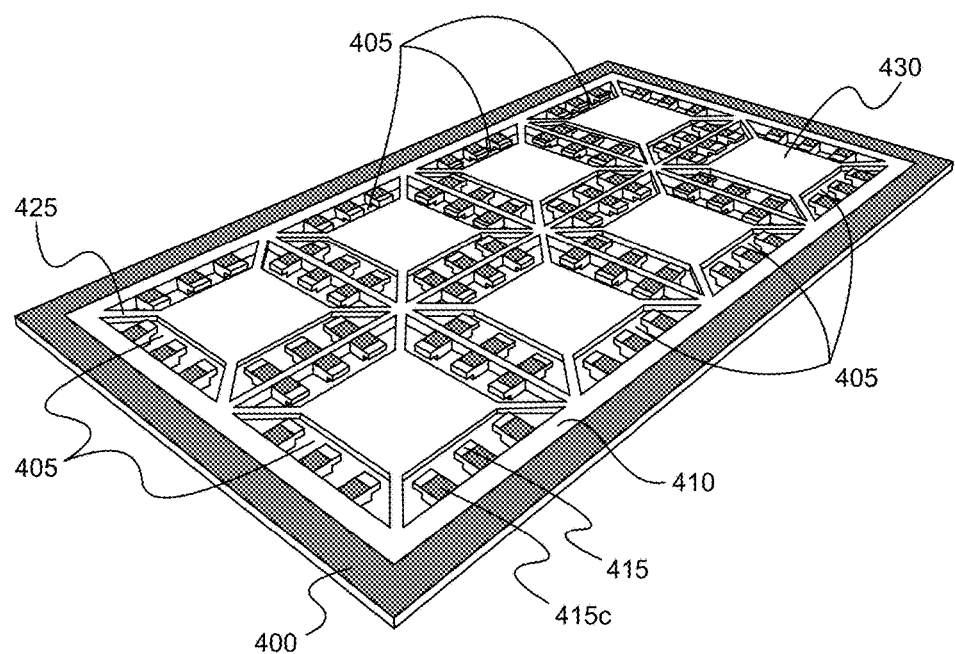
Figure 4B:
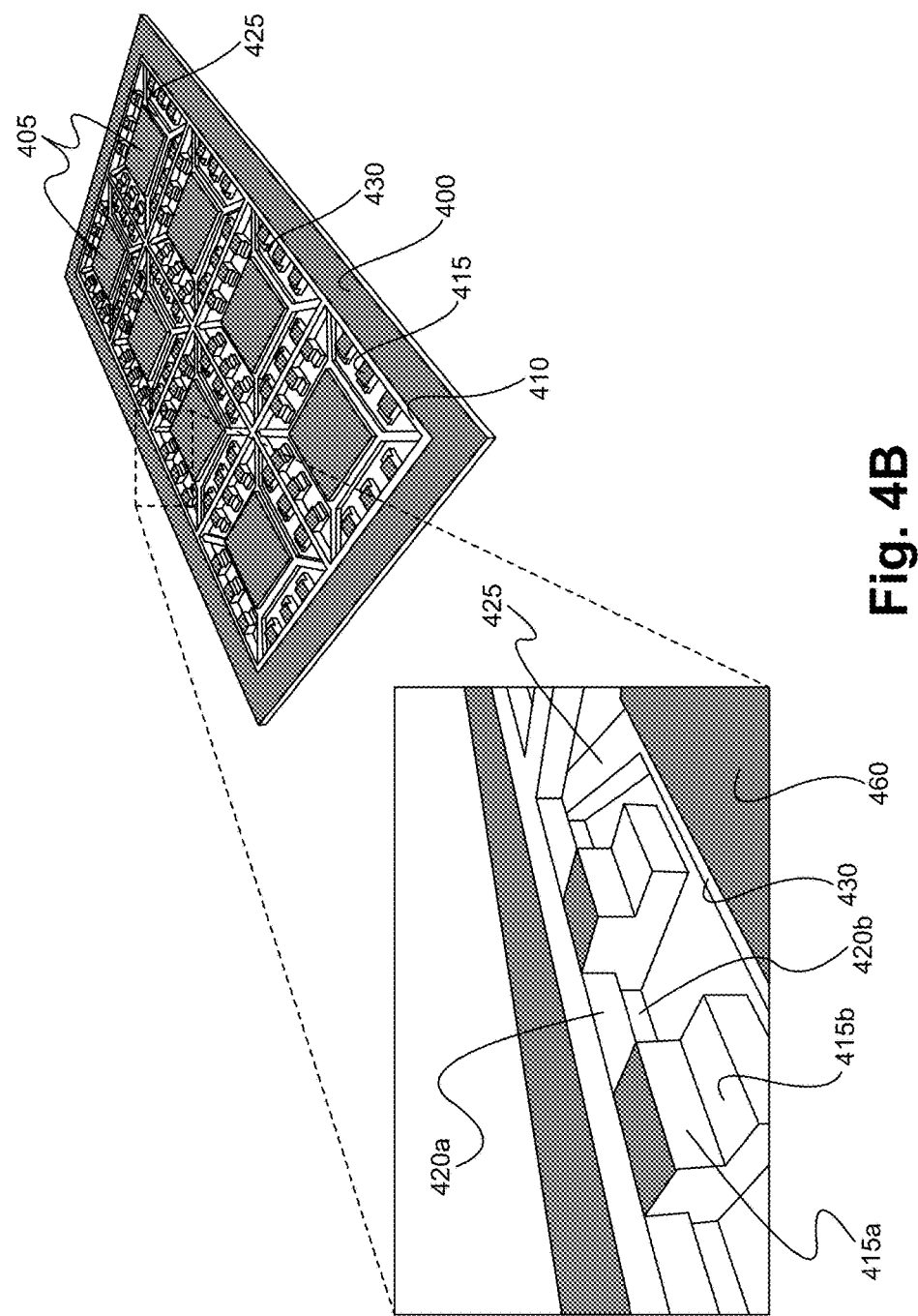

FIG. 3 illustrates an exemplary method 300 of manufacturing semiconductor packages according to some embodiments. An exemplary result produced by each step of the method 300 is illustrated in FIGS. 4A-4K. The method 300 begins at a Step 305, where an etched leadframe strip 400 is obtained. In some embodiments, the etched leadframe strip 400 is made of copper. FIG. 4A illustrates the front side (or top side) of the leadframe strip 400, while FIG. 4B illustrates the backside (or bottom side or contact side) of the leadframe strip 400. The leadframe strip 400 includes an array of device areas 405. Although the leadframe strip 400 is shown to include a 3×2 array of device areas 405, the array of device areas can be bigger or smaller.

Figure 7:
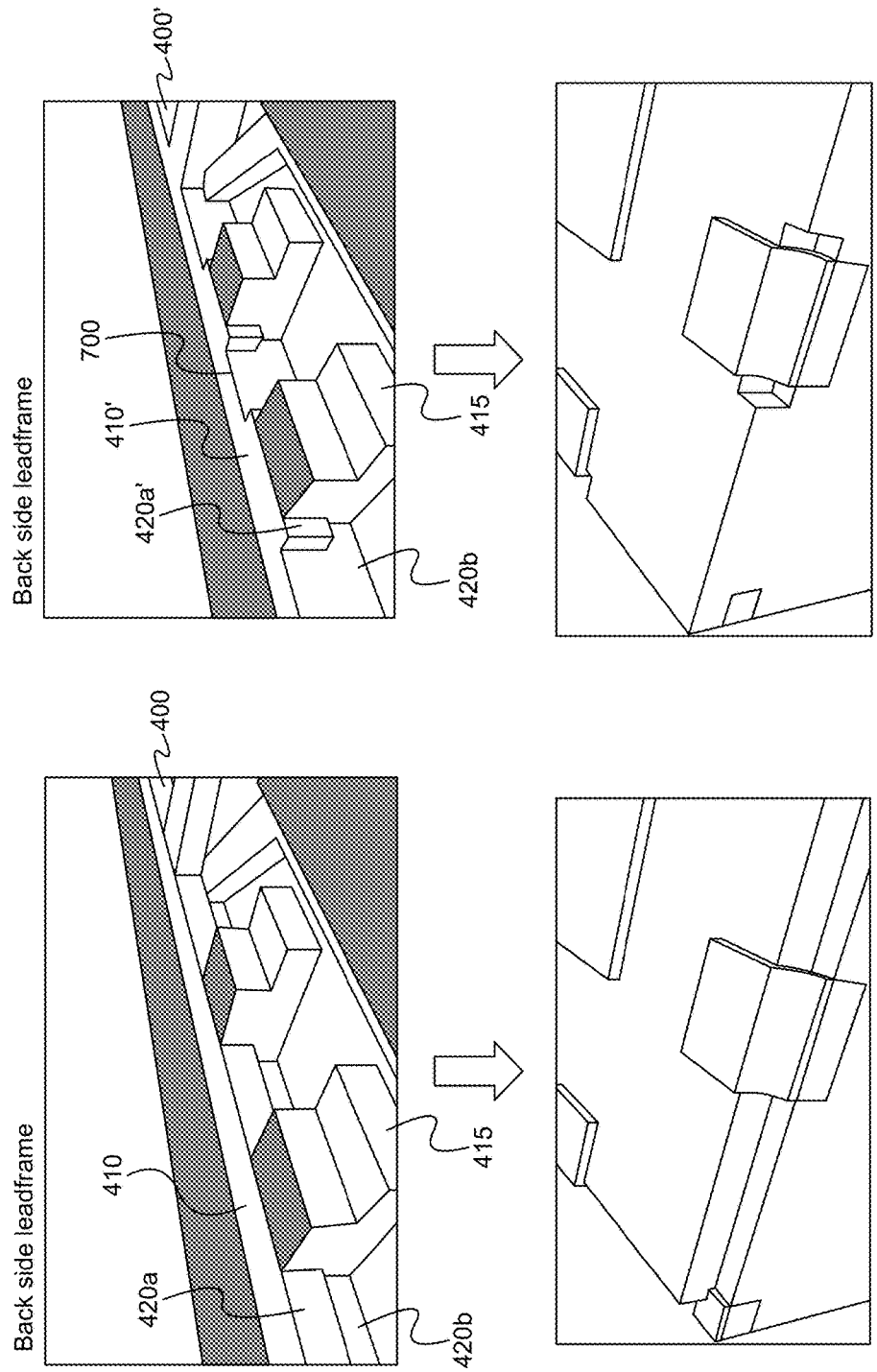
FIG. 7A illustrates a graphical explanation of how a step portion of a molding compound is shaped according to some embodiments
FIG. 7B illustrates a graphical explanation of how an alternate step portion of a molding compound is shaped according to some embodiments.

Each device area 405 includes dam bars 410 and contacts 415 coupled with the dam bars 410. The dam bars 410 enclose a corresponding device area 405. Each dam bar 410 includes a step 420 that is formed by an extruding portion 420a and a non-extruding portion 420b. As discussed elsewhere, the step 420 can continuously run or discretely run (as illustrated in FIG. 7B) the full length of a corresponding dam bar 405. The extruding portion 420a of the step 420 protrudes towards the center of the corresponding device area 405. As will become apparent, the extruding portion 420a and the non-extruding portion 420b will form a step portion in a molding compound around the contacts 415.

Each of the contacts 415 includes a first portion 415a that is coupled with the extruding portion 420a of the step 420, and a second portion 415b that is coupled with the non-extruding portion 420b of the step 420. In some embodiments, the second portion 415b extends further towards the center of the corresponding device area 405 than the first portion 415a does. Alternatively, the first portion 415a extends further towards the center of the corresponding device area 405 than the second portion 415b does. The different sizes of the first portion 415a and the second portion 415b act as a locking mechanism with the molding compound. Alternatively, edges of both the first portion 415a and the second portion 415b extending towards the center of the corresponding device area 405 are flush.

In some embodiments, the corresponding device area 405 further includes tie bars 425 and a die attach pad 430 coupled with the tie bars 425 such that the die attach pad 430 is suspended to the leadframe strip 400 in the corresponding device area 405 via the tie bars 425. In some embodiments, the tie bars 425 are coupled with the non-extruding portion 420b of the step 420.

At a Step 310, different areas of the etched leadframe strip 400 are plated. The different areas of the leadframe strip 400 include areas on the backside of the leadframe strip 400 and areas on the front side of the leadframe strip 400. On the backside of the leadframe strip 400, the first portions 415a of the contacts 415, the die attach pads 430 and a portion of the perimeter of the leadframe strip 400 are plated. On the front side of the leadframe strip 400, areas 415c of the second portions 415b of the contacts 415 and a portion of the perimeter of the leadframe strip 400 are plated. These area 415c of the second portions 415b of the contacts 415 are where semiconductor dice are electrically coupled with. In FIG. 4A, the area 415c of the second portions 415b about the dam bars 410. The plated areas on the backside and the front side of the leadframe strip 400 will act as a chemical etching mask; as such, unplated areas will be etched away in a later etching step (e.g., Step 325). The plating material 460 can be Ag, Cu, NiPdAu, or other suitable material.

Figure 4C:
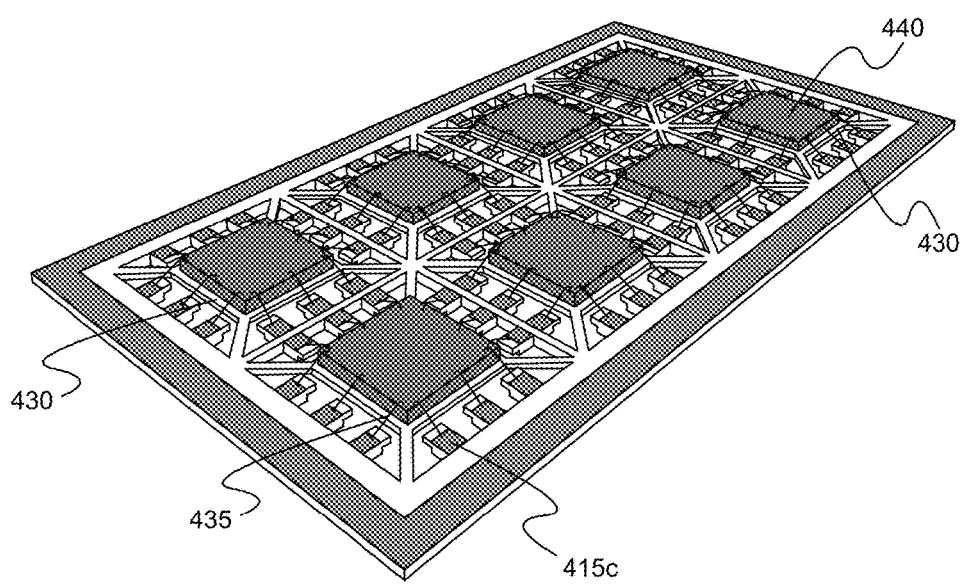

At a Step 315, a plurality of semiconductor dice 440 is electrically coupled with the plurality of contacts. Each device area 415 includes at least one semiconductor die 440. In some embodiments, as illustrated in FIG. 4C, on the front side of the leadframe strip 400, epoxy is applied between the die attach pads 430 and the semiconductor dice 440, and wirebonds couple the semiconductor dice 440 with the area 415c of the second portions 415 of the contacts 415. Alternatively, on the front side of the leadframe strip 400, the semiconductor dice 440 are flipped and positioned so that solder balls couple the semiconductor dice 440 with the area 415c of the second portions 415 of the contacts 415.

Figure 4D:
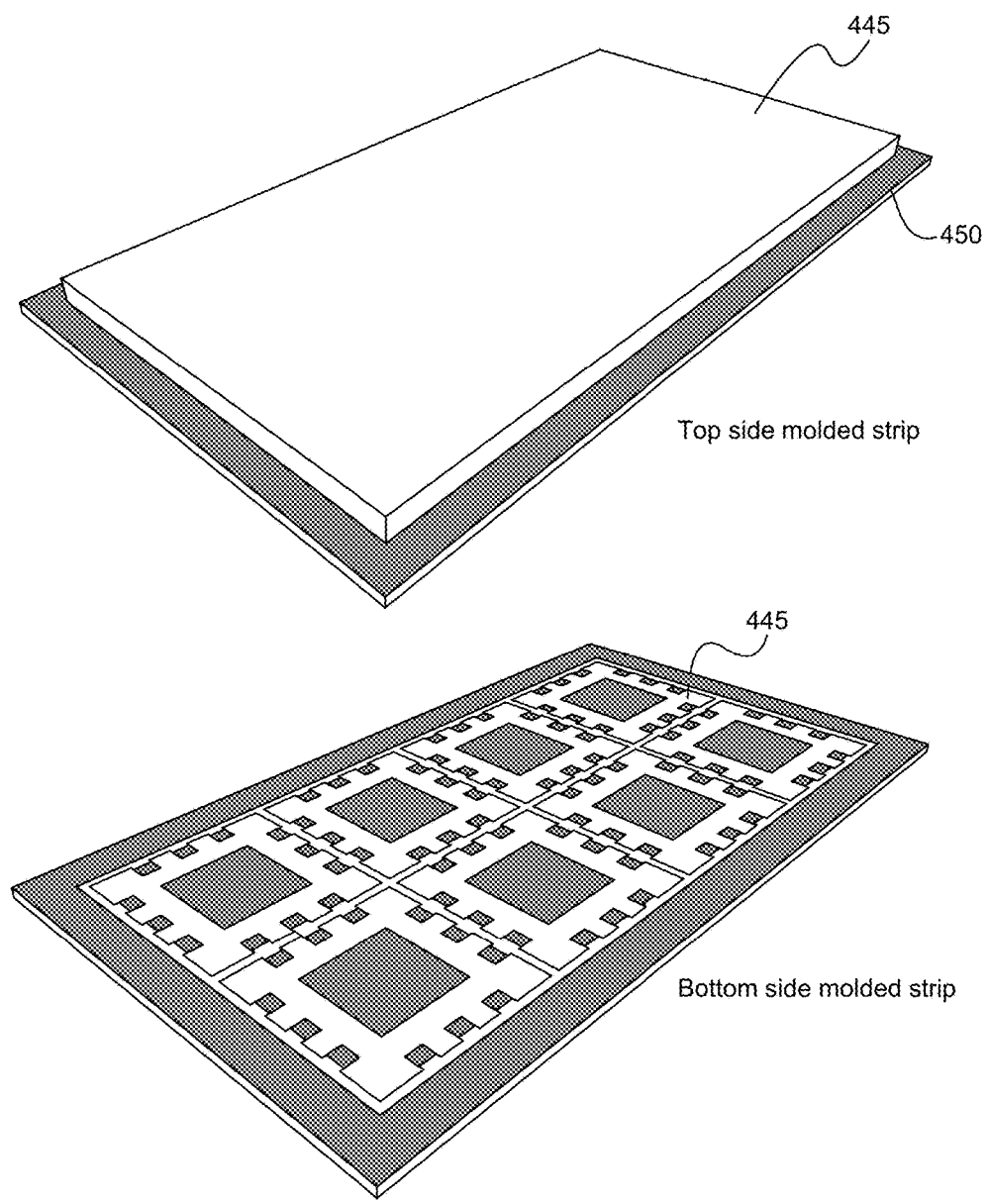

At a Step 320, the plurality of semiconductor dice 440 is encapsulated with a molding compound 445, resulting in a molded leadframe strip 450. FIG. 4D illustrates the top side of the molded leadframe strip 450 and the bottom side of the molded leadframe strip 450.

Figure 4F:
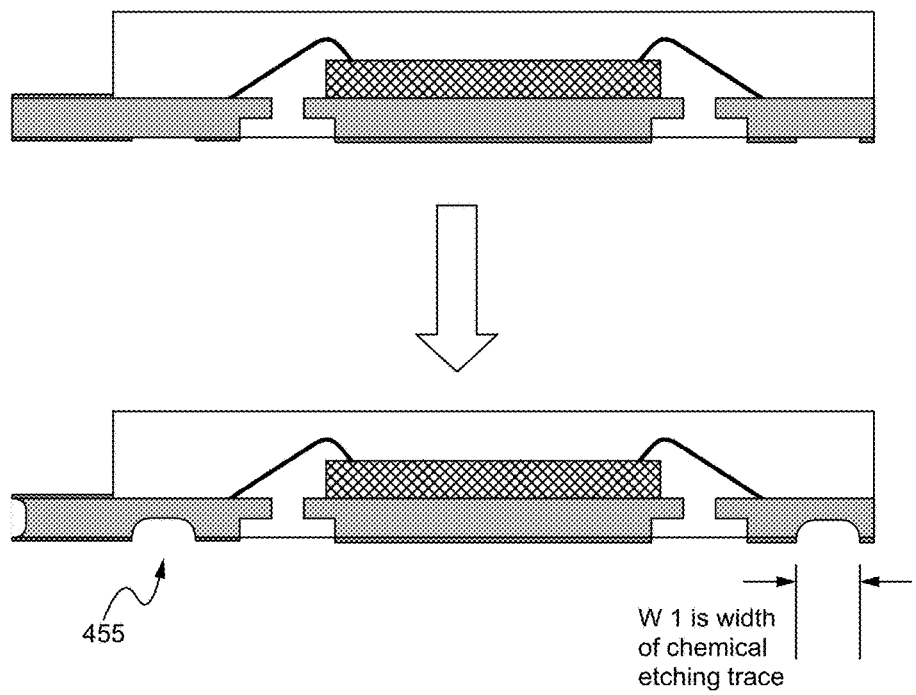

At a Step 325, at least a portion of the molded leadframe strip 450 is removed, thereby creating etching traces 455. A chemical etching process, such as a copper chemical etching dip process or a copper chemical etching spray process of FIG. 4E, is applied to remove exposed copper portions of the molded leadframe strip 450 that were not plated at the Step 310. The degree of etching is not a full etch/cut. Instead, in some embodiments, the degree of etching is a half etch (e.g., etch to half the thickness of the leadframe strip 400). More or less etching is contemplated, depending on application. It is important not to fully etch in order for it to carry electricity in a later electric plating step (e.g., Step 335). The chemical etching process creates the chemical etching traces 455 along the unplated areas at the bottom of the molded leadframe strip 450. FIG. 4F illustrates a cross sectional view of the molded leadframe strip 450 before the Step 325 and a cross sectional view of the molded leadframe strip 450 after the Step 325. The chemical etching traces 455 are shown in the cross sectional view of the molded leadframe strip 450. In some embodiments, the corners of the chemical etching traces 455 are curved.

Figure 4G:
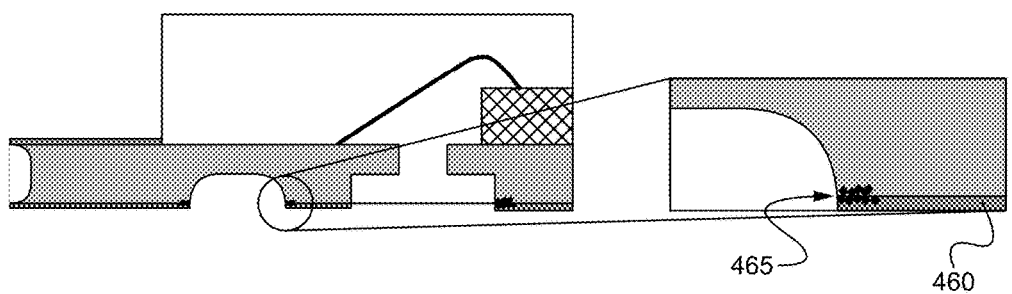
Figure 4H:
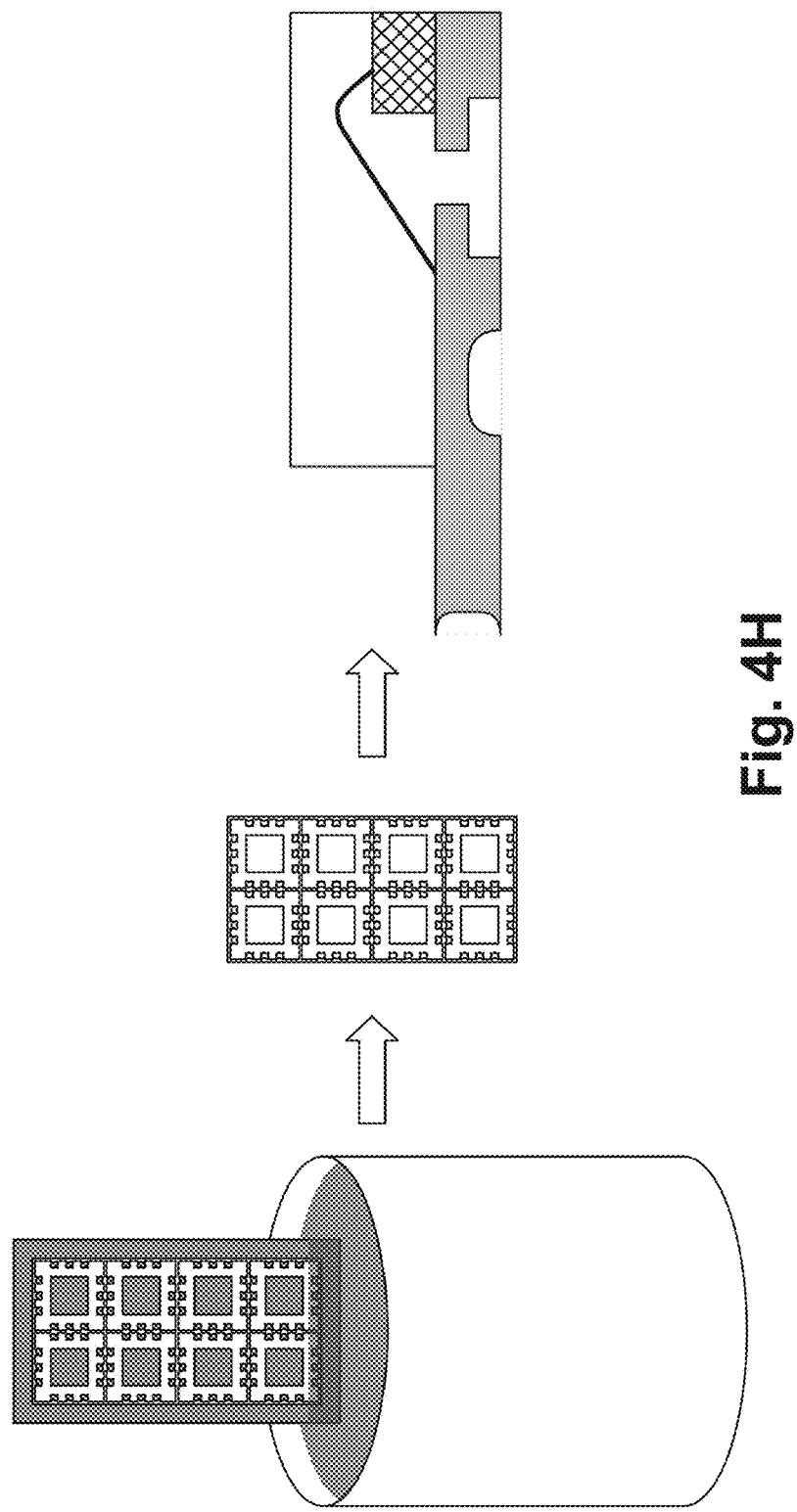

The chemical etching process can result in one or more "weak points" 465 between the metal plating 460 and the copper base material of the molded leadframe strip 450, as illustrated in FIG. 4G. To avoid the isotropic etching effect, at a Step 330, the metal plating 460 of the molded leadframe strip 450 are removed via, for example, a dip process, as illustrated in FIG. 4H to reveal exposed areas of the molded leadframe 450. Other strip off procedures are contemplated.

Figure 4I:
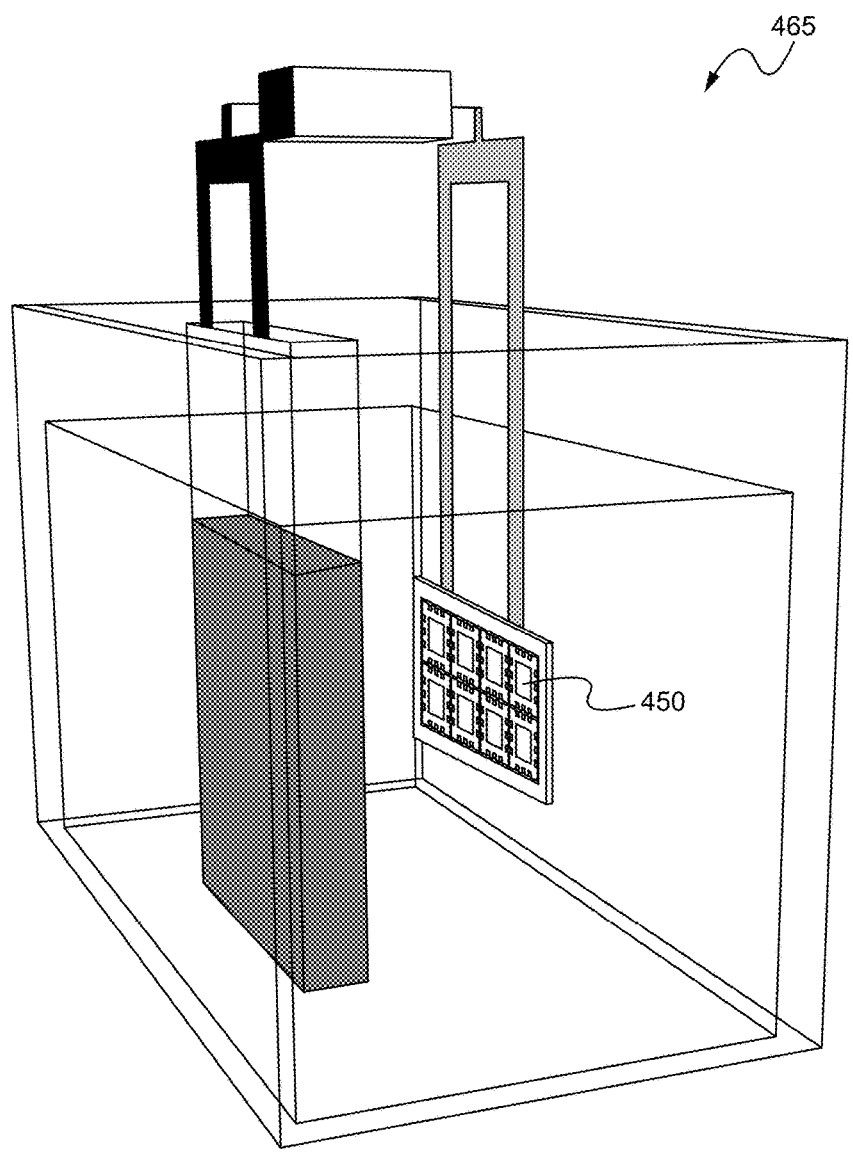
Figure 4J:
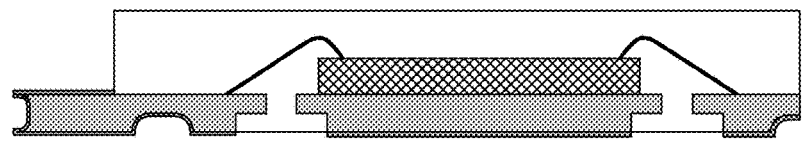

At a Step 335, the exposed areas of the molded leadframe strip 450 are plated. Particularly, the molded leadframe strip 450 is plated with a plating material can be Sn or other suitable material on the exposed copper, including the chemical etching traces 455, of the molded leadframe 450 in order to prevent surface reaction with oxygen. In some embodiments, an electric plating process is used. FIG. 4I illustrates an exemplary electric plating machine 465. The molded leadframe 450 is held at a cathode terminal of the electric plating machine 465, while the plating material is located in a basket at an anode terminal. Both the molded leadframe 450 and the plating material are immersed in a plating solution that is in a plating tank. When an electrical power source is operating in the plating tank, an electrical current brings particles of the plating material from the anode terminal to the cathode terminal via the plating solution. Because the molded leadframe 450 is held at the cathode terminal, the plating particles which come along with the electrical current are plated on the metal surfaces of the molded leadframe 450. FIG. 4J illustrates a cross sectional view of the molded leadframe 450 after the Step 335. The new plating material is plated on the exposed copper, including the chemical etching traces 455, of the molded leadframe 450.

Figure 4K:
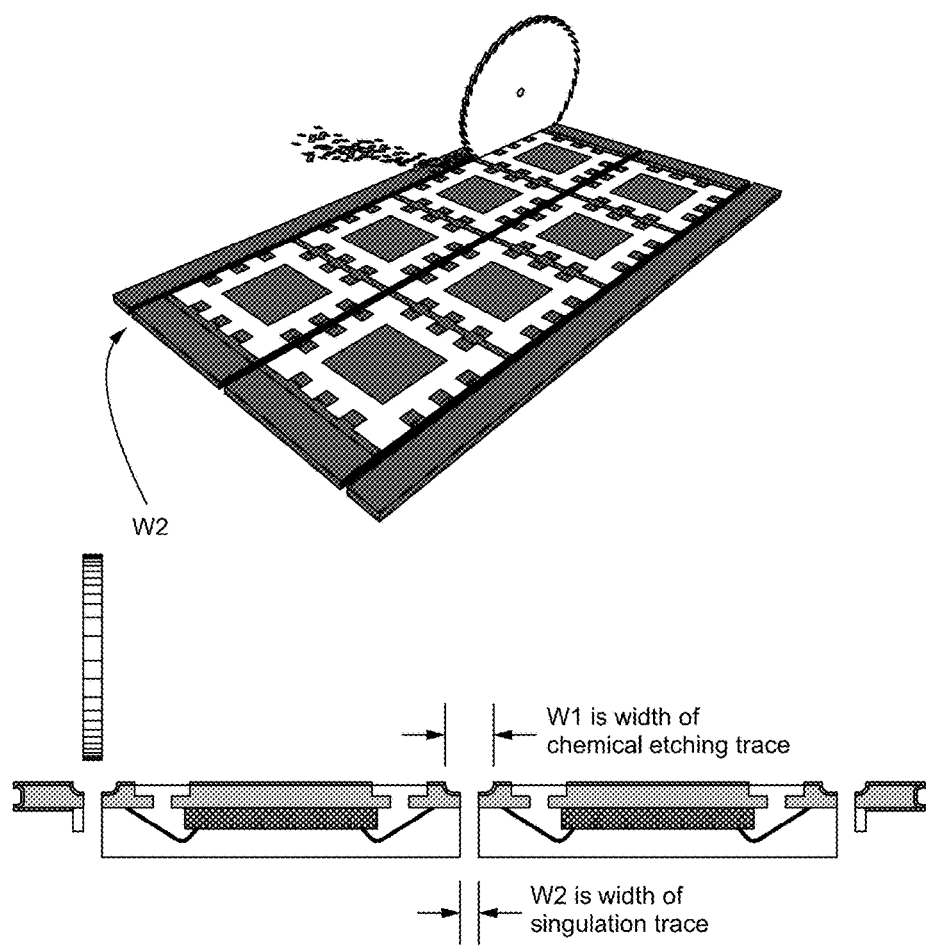

At a Step 340, each of the semiconductor packages is singulated, along singulation traces, from other semiconductor packages. In some embodiments, the singulation uses a saw or blade, as illustrated in FIG. 4K. The thickness of the blade is narrower than the width of the chemical etching traces 455. In some embodiments, the molded leadframe 450 is singulated at the center location of the chemical etching traces 455. As such, the width of each of the singulation traces is less than the width of each of the etching traces. The method 300 results in singulated semiconductor packages.

Figure 5A:
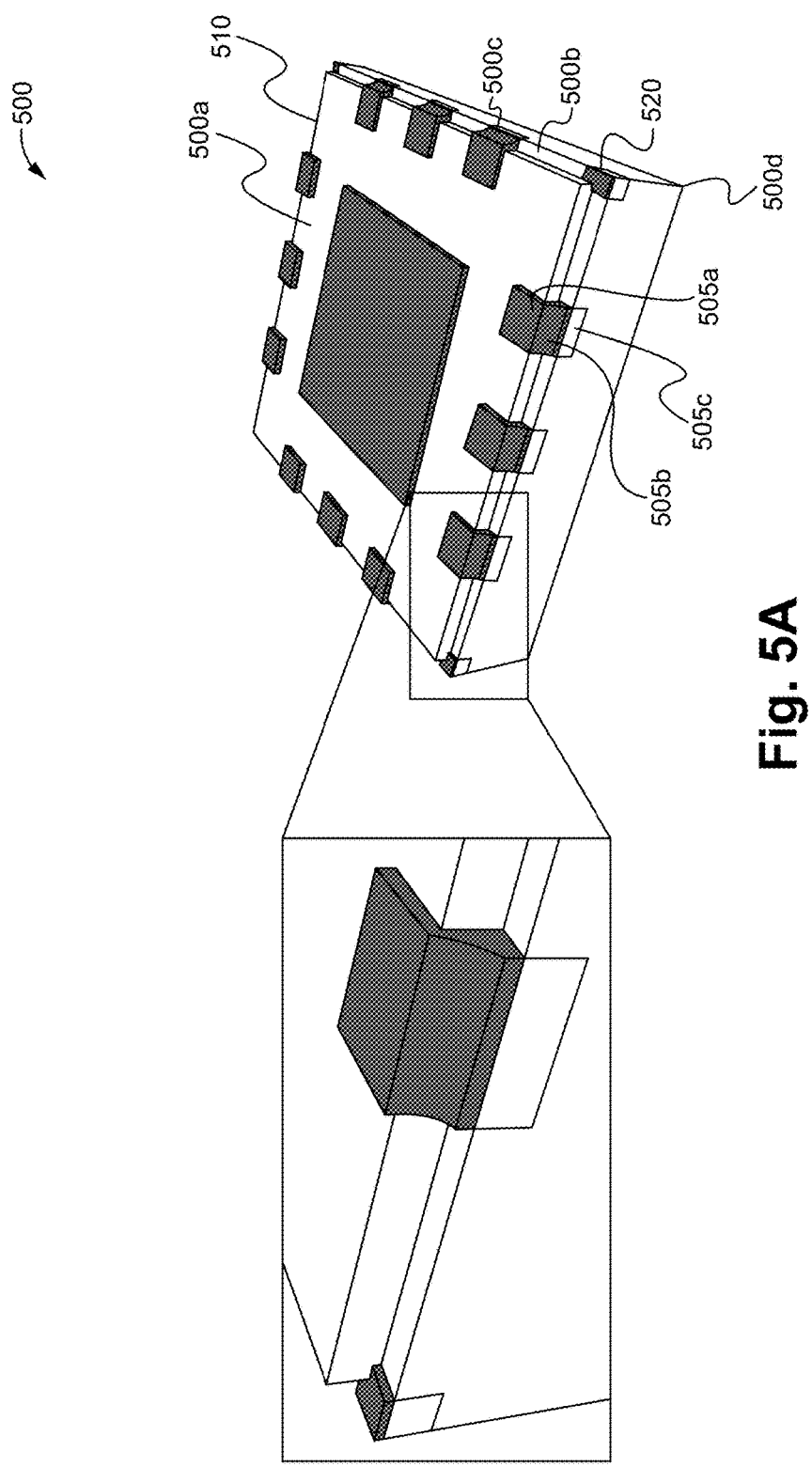
FIGS. 5A-5B illustrate a singulated semiconductor package according to some embodiments.
Figure 5B:
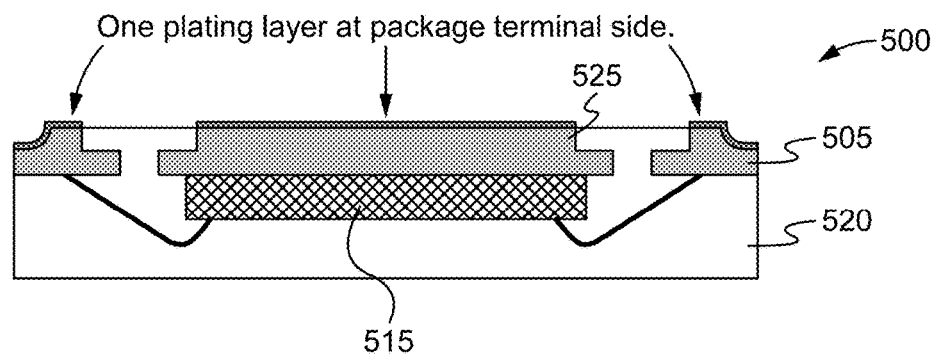
Figure 6:
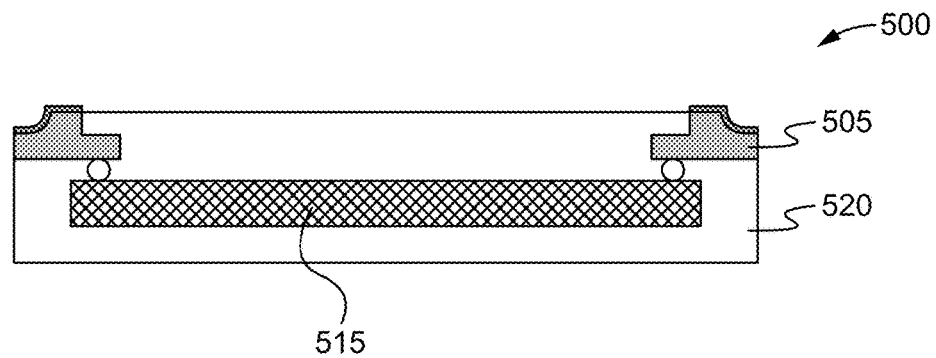
FIG. 6 illustrates another singulated semiconductor package according to some embodiments.

FIGS. 5A-5B illustrate a singulated semiconductor package 500 according to some embodiments. In particular, FIG. 5A illustrates a perspective view of the singulated semiconductor package 500 and FIG. 5B illustrates a cross sectional view of the singulated semiconductor package 500. After singulation, the semiconductor package 500 includes a formed leadframe that includes a plurality of contacts 505. The plurality of contacts 505 is located around peripheral edges 510 of the singulated semiconductor package 500. Side surfaces of each of the plurality of contacts 505 are partially plated. A semiconductor die 515 is electrically coupled with the plurality of contacts 505. In some embodiments, the formed leadframe also includes tie bars and a die attach pad 525 that is coupled with the tie bars. In FIG. 5B, the semiconductor die 515 is epoxied with the die attach pad 525 and is electrically coupled with the plurality of contacts 505 using wirebonds. Alternatively, instead of wirebonds, solder balls are used to electrically couple the semiconductor die with the plurality of contacts, as illustrated in FIG. 6. Although a single semiconductor die 515 is described, it is contemplated that a singulated semiconductor device can include a plurality of semiconductor dice stacked therein and electrically coupled with each other and/or the plurality of contacts 505. Each of the plurality of contacts 505 includes an interfacing surface at a bottom of the singulated semiconductor package 500, an interior surface that is opposite the interfacing surface, a step at a non-exposed end that is positioned near the semiconductor die 515 and a curved corner at an exposed end (e.g., side surface) that is opposite the non-exposed end, such that the area of the exposed surface of the contact 505 is smaller than the area of the interior surface of the contact 505.

Referring back to FIGS. 5A-5B, the singulated semiconductor package 500 includes a molding compound 520 that encapsulates the semiconductor die 515. The molding compound 520 also encapsulates at least a portion of the die attach pad 525 such that the die attach pad 525 is exposed and flush with a bottom surface 500*a* of the semiconductor package 500. The molding compound 520 further encapsulates at least a portion of each of the plurality of contacts 505 such that a first surface 505*a* of a corresponding contact 505 is flush with the bottom surface 500*a* of the semiconductor package 500, a second surface 505*c* of the corresponding contact 505 is flush with a side surface 500*c* of the semiconductor package 500, and a curved surface 505*b* of the corresponding contact 505 is located at a step 500*b* of the side surface 500*c* of the semiconductor package 500. The die attach pad 525 exposed at the bottom surface 500*a* of the semiconductor package 500, and the first surfaces 505*a* and the curved surfaces 505*b* of the plurality of contacts 505 are plated via a single plating step (the Step 335 of FIG. 3). However, the second surfaces 505*c* of the plurality of contacts 505 are not plated. In particular, as the result of singulation (the Step 340 of FIG. 3), the second surfaces 505*c* (the "upright" surfaces) of the plurality of contacts 505 are exposed copper at the sides 500*c* of the semiconductor package 500. Each side (the curved surface 505*b* and the second surface 505*c*, collectively) of the plurality of contacts 505 is thus partially plated.

The curved surfaces 505*b* of the plurality of contacts 505 are concave, as the result of the Steps 325-335 of FIG. 3 (e.g., copper chemical etching to Sn plating steps). In some embodiments, because the degree of etching at the Step 325 of FIG. 3 is a half etch, the height of the curved surfaces 505*b* is half the height of the contacts 505. As explained elsewhere, a step portion of the molding compound 520 (the step 500*b* of the semiconductor package along/on one edge/side of the semiconductor package) will assist in the visual inspection for proper solder coverage on the sides of the plurality of contacts 505 when the semiconductor package 500 is reflowed on a PCB. Because of the step portion of the molding compound 520, the area of the bottom surface 500*a* of the semiconductor package 500 is smaller than the area of a top surface 500*d* of the semiconductor package 500.

FIG. 7A illustrates a graphical explanation of how a step portion of a molding compound is shaped according to some embodiments. In FIG. 7A, the step portion of the molding compound continuously runs the full package length. As discussed above, regarding FIG. 4B, each dam bar 410 includes the step 420 that is formed by the extruding portion 420*a* and the non-extruding portion 420*b*. The step 420 continuously runs the full length of a corresponding dam bar 410. The step 420 of the leadframe strip 400 shapes the step portion of the molding compound. The unplated step 420 of the leadframe strip 400 is removed during the copper chemical etching process (the Step 325 of FIG. 3), which results in the step portion of the molding compound being "full."

FIG. 7B illustrates a graphical explanation of how an alternate step portion of a molding compound is shaped according to some embodiments. In FIG. 7B, the step portion of the molding compound discretely runs the full package length at locations of the plurality of contacts. Each dam bar 410' includes a step 420' that is formed by an extruding portion 420*a*' and a non-extruding portion 420*b*. The step 420' discretely runs the full length of a corresponding dam bar 410' such that there are gaps 700 in the step 420' between the plurality of contacts 415. The step 420' of the leadframe strip 400' shapes the step portion of the molding compound. The unplated step 420' of the leadframe strip 400' is removed during the copper chemical etching process (the Step 325 of FIG. 3), which results in the step portion of the molding compound being "partial," with a part of the step portion at each of the plurality of contacts 415.

Figure 8:
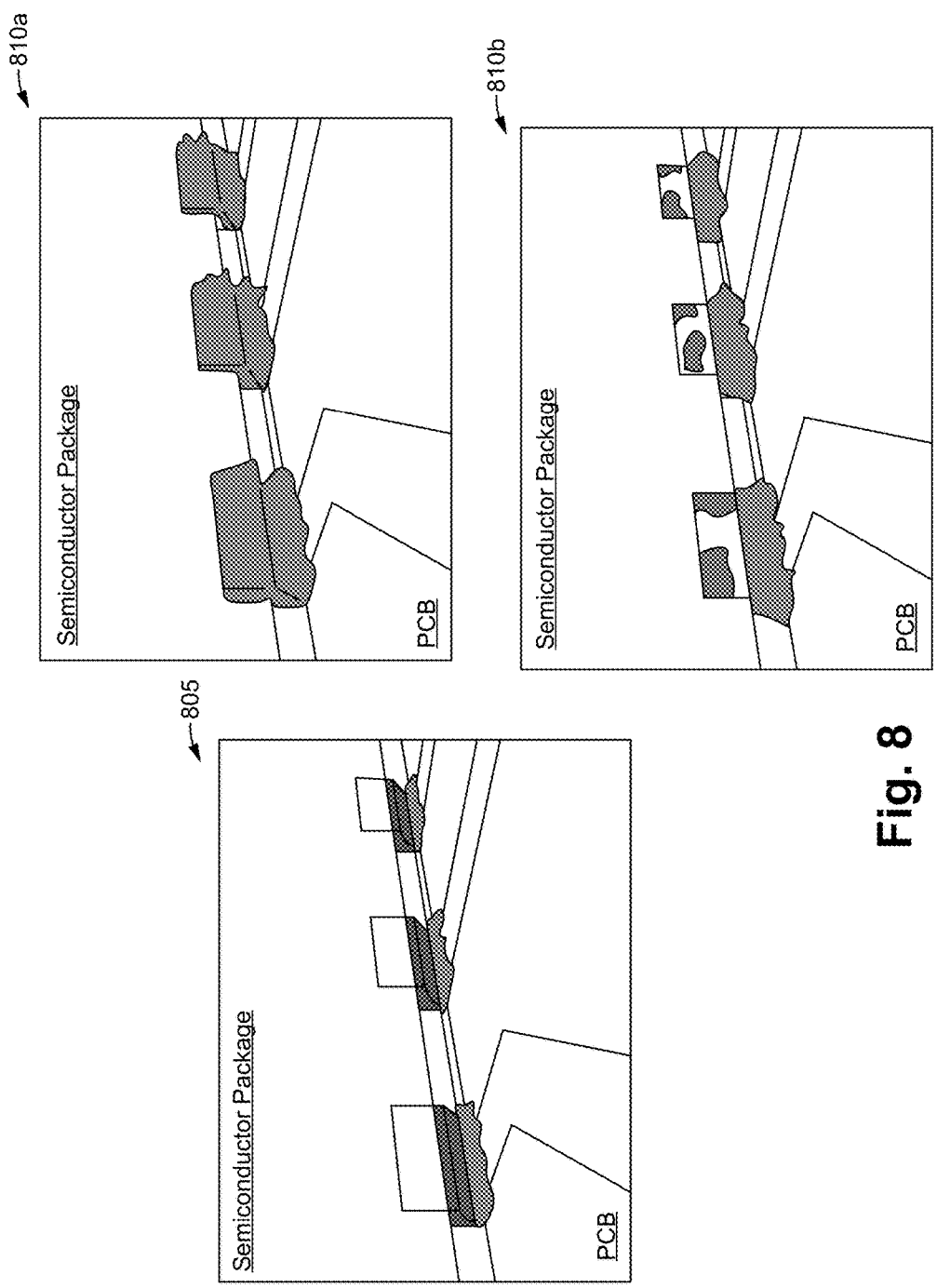
FIG. 8 illustrates a graphical explanation of an application according to some embodiments.

FIG. 8 illustrates a graphical explanation of an application according to some embodiments. The picture 805 on the left shows a semiconductor package, such as the semiconductor package 500, on a PCB before reflow. Solder is applied between the plurality of contacts and PCB. After reflow, one of two results can happen. One result, shown in the picture 810*a* on the top right, if the exposed copper surfaces of the plurality of contacts are not contaminated, the solder can cover the entire side surfaces of the plurality of contacts during soldering. Another result, shown in the picture 810*b* on the bottom right, if the copper surfaces of the plurality of contacts are contaminated, the solder can still partially cover the side surfaces of the plurality of contacts, particularly the areas of the side surfaces that are plated, during soldering. In both of these results, reliability of solder joint is good and can be determined as such by visual inspection.

Mechanical Sawing to Half Cut Leadframe

In some embodiments, a mechanical saw is used on one side of a leadframe to half saw the leadframe and, then, another mechanical saw is used on the other side of the leadframe to half cut the leadframe, thereby singulating semiconductor packages from each other. In some embodiments, the second mechanical sawing results in the third surface of each contact being L-shaped.

Figure 9:
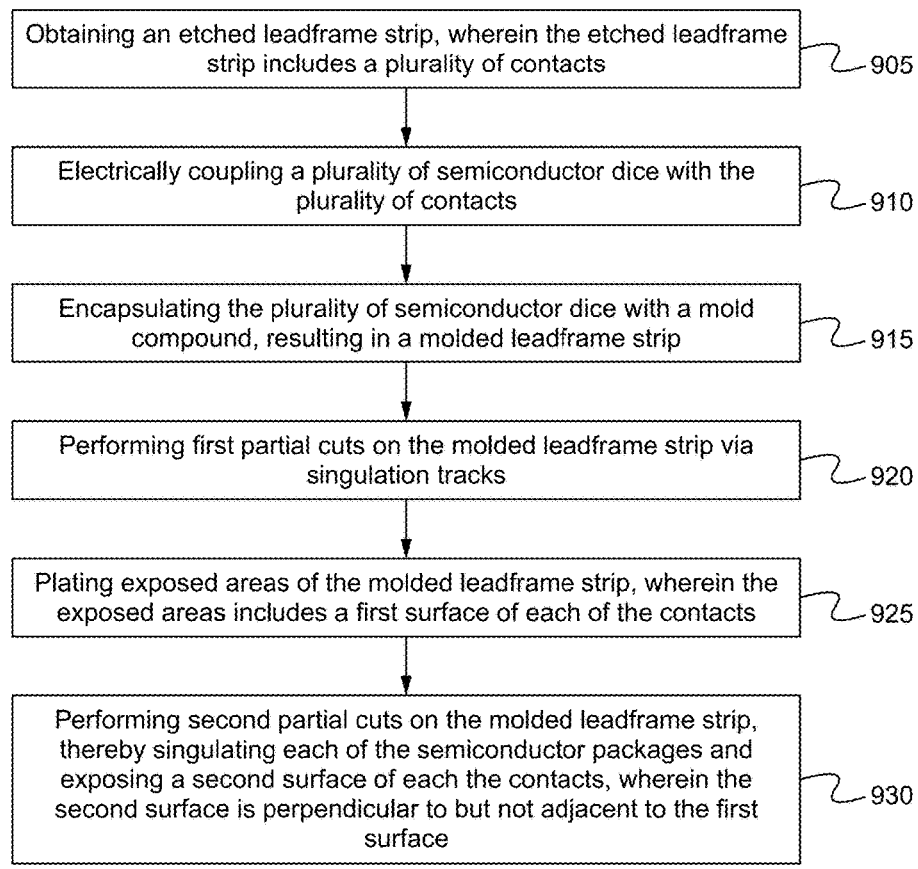
FIG. 9 illustrates another exemplary method of manufacturing semiconductor packages according to some embodiments.
Figure 10A:
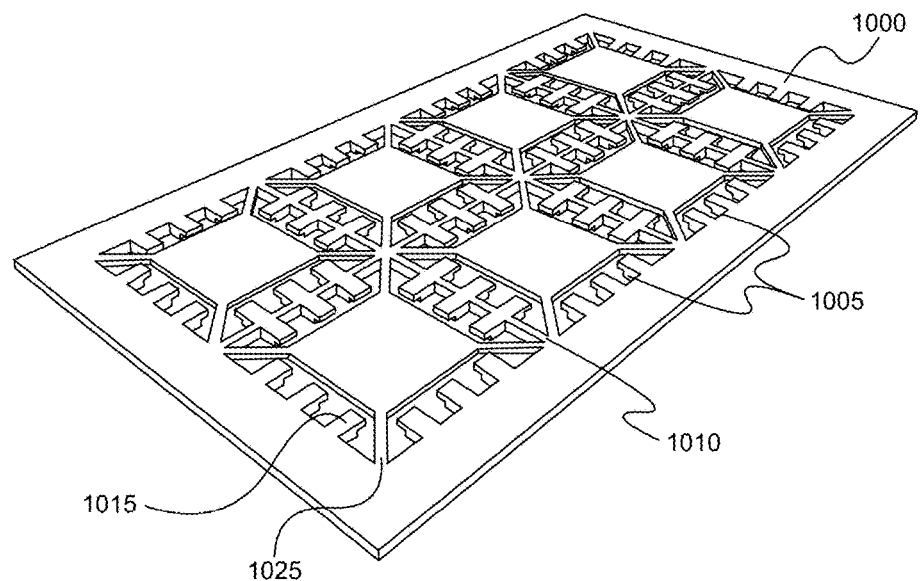
FIGS. 10A-10D illustrate an exemplary result produced at each step of the method of FIG. 9.

FIG. 9 illustrates another exemplary method of manufacturing semiconductor packages according to some embodiments. An exemplary result produced by each step of the method 900 is illustrated in FIGS. 10A-10D. The method 900 begins at a Step 905, where an etched leadframe strip 1000 is obtained. In some embodiments, the etched leadframe strip 1000 is made of copper. FIG. 10A illustrates the front side (or top side) of the leadframe strip 1000. In some embodiments, the leadframe strip 1000 is similarly configured as the leadframe strip 400. The leadframe strip 1000 includes an array of device areas 1005. Although the leadframe strip 1000 is shown to include a 3×2 array of device areas 1005, the array of device areas can be bigger or smaller.

Each device area 1005 includes dam bars 1010 and contacts 1015 coupled with the dam bars 1010. The dam bars 1010 enclose a corresponding device area 1005. In some embodiments, the corresponding device area 1005 further includes tie bars 1025 and a die attach pad 1030 coupled with the tie bars 1025 such that the die attach pad 1030 is suspended to the leadframe strip 1000 in the corresponding device area 1005 via the tie bars 1025.

Figure 10B:
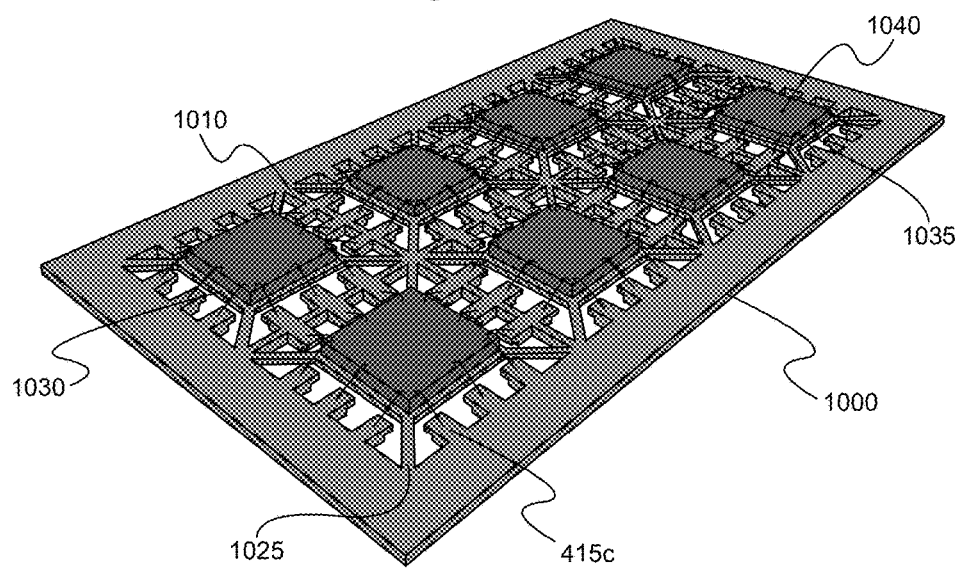

At a Step 910, a plurality of semiconductor dice 1040 is electrically coupled with the plurality of contacts 1015. Each device area 1005 includes at least one semiconductor die 1040. In some embodiments, as illustrated in FIG. 10B, on the front side of the leadframe strip 1000, epoxy is applied between the die attach pads 1030 and the semiconductor dice 1040, and wirebonds couple the semiconductor dice 1040 with the contacts 1015. Alternatively, on the front side of the leadframe strip 1000, the semiconductor dice 1040 are flipped and positioned so that solder balls couple the semiconductor dice 1040 with the contacts 415.

Figure 10C:
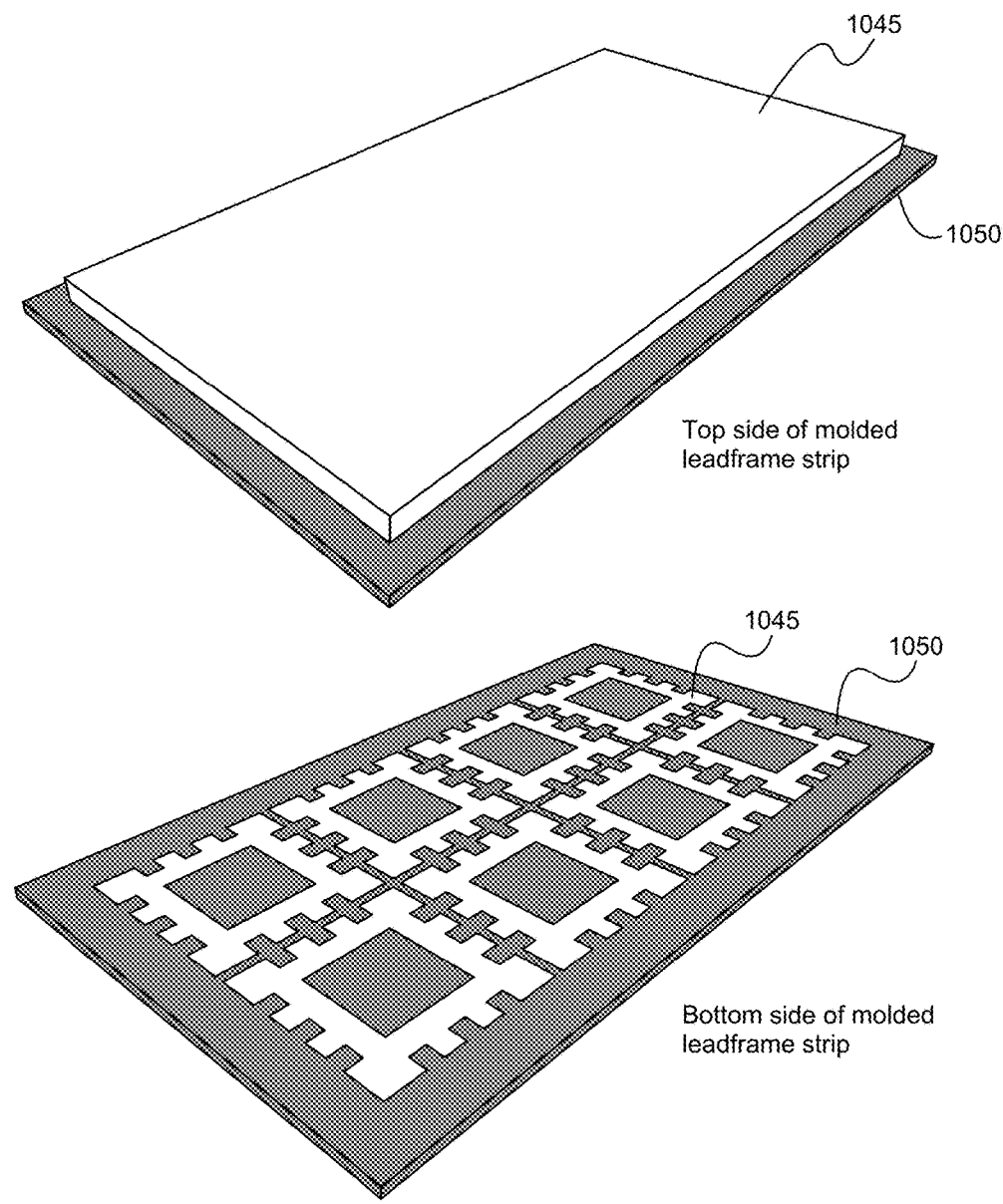
Figure 10D:
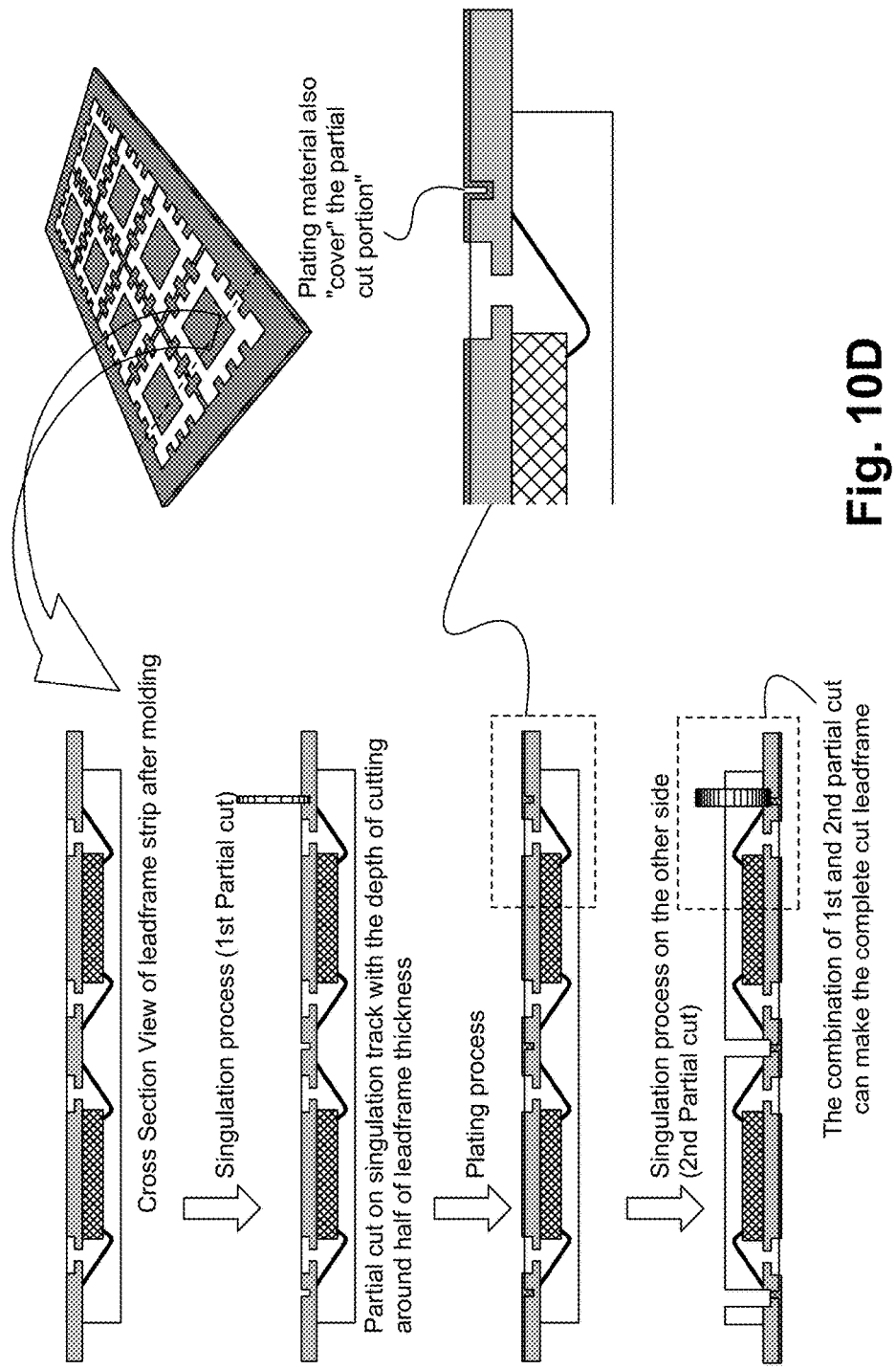

At a Step 915, the plurality of semiconductor dice 1040 is encapsulated with a molding compound 1045, resulting in a molded leadframe strip 1050. FIG. 10C illustrates the top side of the molded leadframe strip 1050 and the bottom side of the molded leadframe strip 1050. At this step, the molded leadframe strip 1050 includes one copper sheet, in which the entire sheet is able to conduct electric current.

At a Step 920, first partial cuts on the molded leadframe strip 1050 via singulation tracks are performed on a backside of the molded leadframe strip 1050. In some embodiments, the singulation tracks are along the dam bars 1010 (located at a bottom of the molded leadframe 1050). In some embodiments, the singulation tracks can be as wide as the dam bars. In some embodiments, the degree of the first partial cuts is a half cut (e.g., cut to half the thickness of the leadframe strip 1000).

At a Step 925, exposed areas of the molded leadframe strip 1050 are plated. Particularly, the molded leadframe strip 1050 is plated with a plating material, which can be Sn or other suitable material on the exposed copper, including the partial cut portions, of the molded leadframe 1050 in order to prevent surface reaction with oxygen. The exposed areas can include, but not limited to, grooves (e.g., cut portions from the first partial cuts), die attach pad surfaces and contact surfaces (e.g., first surface of each of the contacts) that are located at the bottom of the molded leadframe strip 1050. In some embodiments, an electric plating process is used. For example, the electric plating machine 465 of FIG. 4I can be utilized.

At a Step 930, second partial cuts on the molded leadframe strip 1050 are performed on a front side of the molded leadframe strip 1050, thereby singulating each of the semiconductor packages and exposing a second surface of each of the contacts. The second surface is perpendicular to but not adjacent to the first surface. In some embodiments, the degree of the second partial cuts is through the molding compound to the other side of the leadframe and a half cut (e.g., cut to half the thickness of the leadframe strip 1000) to make complete cuts of the leadframe strip 1000.

Figure 11A:
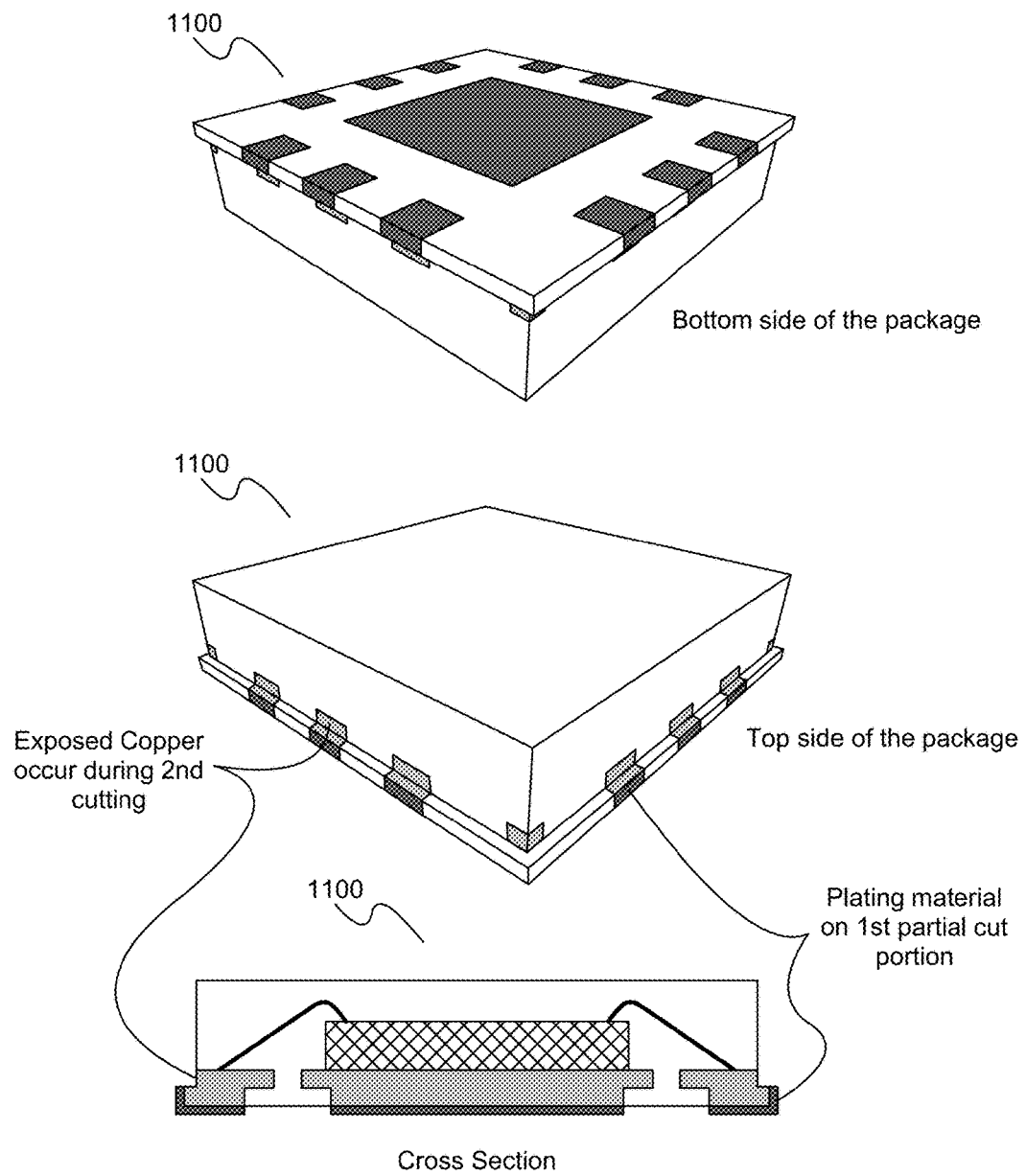
FIGS. 11A-12C illustrate other exemplary singulated semiconductor packages according to some embodiments.

In some embodiments, the blade used in the Step 930 is thicker than the blade used in the Step 920. FIG. 11A illustrates different views of an exemplary singulated semiconductor device 1100 when the thicker blade is used in the Step 930 than in the Step 920. In particular, a bottom side, a top side and a cross section of the semiconductor device 1100 are shown in FIG. 11A. During singulation (the Step 930), a step is created at each side of the semiconductor device 1100 because the blades used at the Step 920 and the Step 930 have different thicknesses. The step runs the full length of each side of the semiconductor device 1100. The area of the bottom surface of the singulated semiconductor device 1100 is greater than the area of the top surface of the singulated semiconductor device 1100. During singulation (the Step 930), a third surface of each of the contacts is also created. From the top perspective of the singulated semiconductor device 1100, the third surface is an outwardly-shaped "L" and is located at a step and includes a first portion and a second portion. The first portion of the third surface is perpendicular to and outwardly extends from the second surface, and the second portion of the third surface is perpendicular to and extends from the first portion of the third surface to the first surface. The first portion of the third surface is parallel with the first surface, while the second portion of the third surface is parallel with but is offset from the second surface. The first surface and the second portion of the third surface are plated at the same time at the Step 925. In other words, a continuous plating layer is directly adhered to the first surface and the second portion of the third surface. The second surface and the first portion of the third surface are not plated as they are exposed by the Step 930.

Figure 11B:
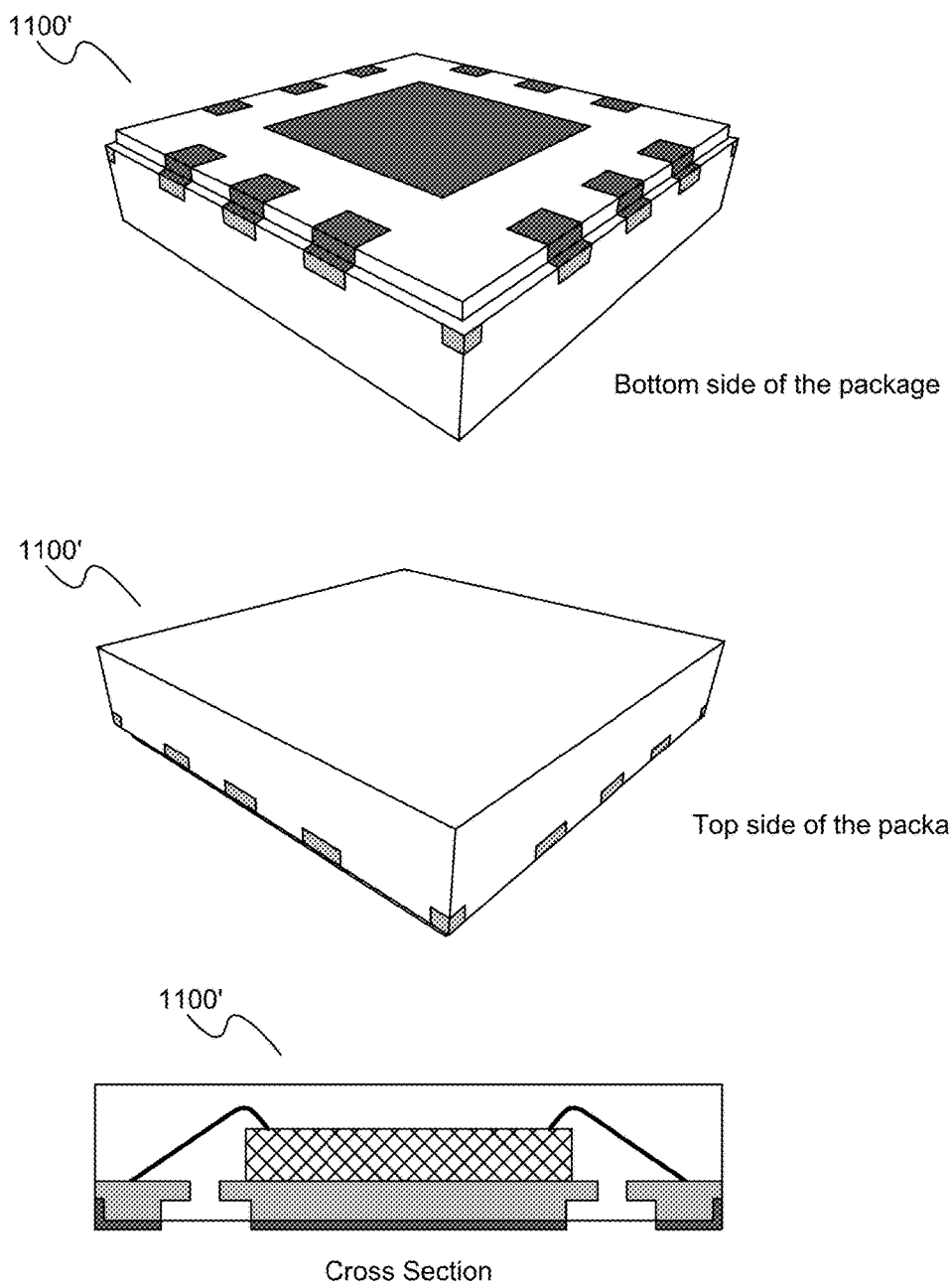

Alternatively, the blade used in the Step 930 is thinner than the blade used in the Step 920. FIG. 11B illustrates different views of an exemplary singulated semiconductor device 1100' when the thinner blade is used in the Step 930 than in the Step 920. In particular, a bottom side, a top side and a cross section of the semiconductor device 1100' are shown in FIG. 11B. During singulation (the Step 930), a step is created at each side of the semiconductor device 1100' because the blades used at the Step 920 and the Step 930 have different thicknesses. The step runs the full length of each side of the semiconductor device 1100'. The area of the top surface of the singulated semiconductor device 1100' is greater than the area of the bottom surface of the singulated semiconductor device 1100'. During singulation (the Step 930), a third surface of each of the contacts is also created. From the top perspective of the singulated semiconductor device 1100', the third surface is an inwardly-shaped "L" and is located at a step and includes a first portion and a second portion. The first portion of the third surface is perpendicular to and inwardly extends from the second surface, and the second portion of the third surface is perpendicular to and extends from the first portion of the third surface to the first surface. The first portion of the third surface is parallel with the first surface, while the second portion of the third surface is parallel with but is offset from the second surface. All of the first surface and all of the third surface (e.g., the first and second portions of the third surface) are plated at the same time at the Step 925. In other words, a continuous plating layer is directly adhered to all of the first surface and all of the third surface. The second surface is not plated as it is exposed by the Step 930.

Alternatively, the blade used in the Step 930 has the same thickness as the blade used in the Step 920. In some embodiment, the same blade is used in the Step 920 and the Step 930. FIG. 11C illustrates different views of an exemplary singulated semiconductor device 1100" when the same blade or the blade with the same thickness is used in the Step 930 as in the Step 920. In particular, a bottom side, a top side and a cross section of the semiconductor device 1100" are shown in FIG. 11C. During singulation (the Step 930), unlike the other alternatives, no step is created at each side of the semiconductor device 1100" because the blades used at the Step 920 and the Step 930 have the same thickness. The area of the bottom surface of the singulated semiconductor device 1100" is the same as the area of the top surface of the singulated semiconductor device 1100". During singulation (the Step 930), a third surface of each of contacts is also created. The third surface is perpendicular to and extends from a corresponding first surface to a corresponding second surface. All of the first surface and all of the third surface are plated at the same time at the Step 925. In other words, a continuous plating layer is directly adhered to all of the first surface and all of the third surface. The second surface is not plated as it is exposed by the Step 930.

Figure 12A:
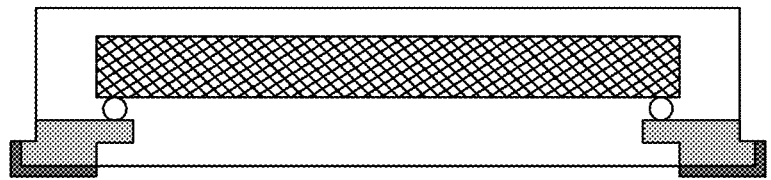
Figure 12B:
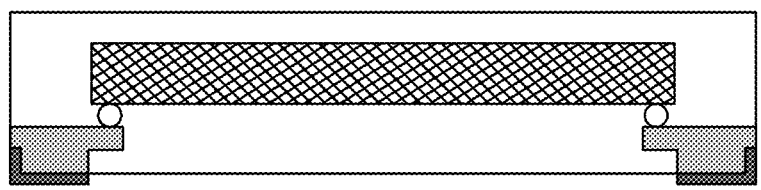
Figure 12C:
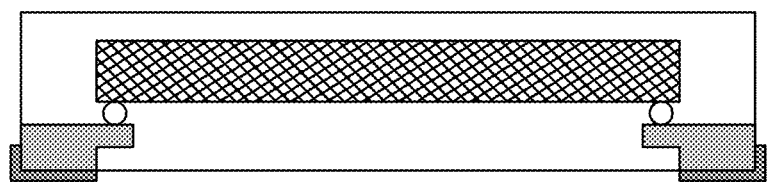

Instead of wirebonds, solder balls can be used to electrically couple a semiconductor die with a plurality of contacts, as illustrated in FIGS. 12A-12C. The semiconductor devices illustrated in FIGS. 12A-12C are flip chip versions of the semiconductor devices illustrated in FIGS. 11A-11C. Furthermore, although a single semiconductor die is described, it is contemplated that a singulated semiconductor device can include a plurality of semiconductor dice stacked therein and electrically coupled with each other and/or a plurality of contacts.

Figure 13:
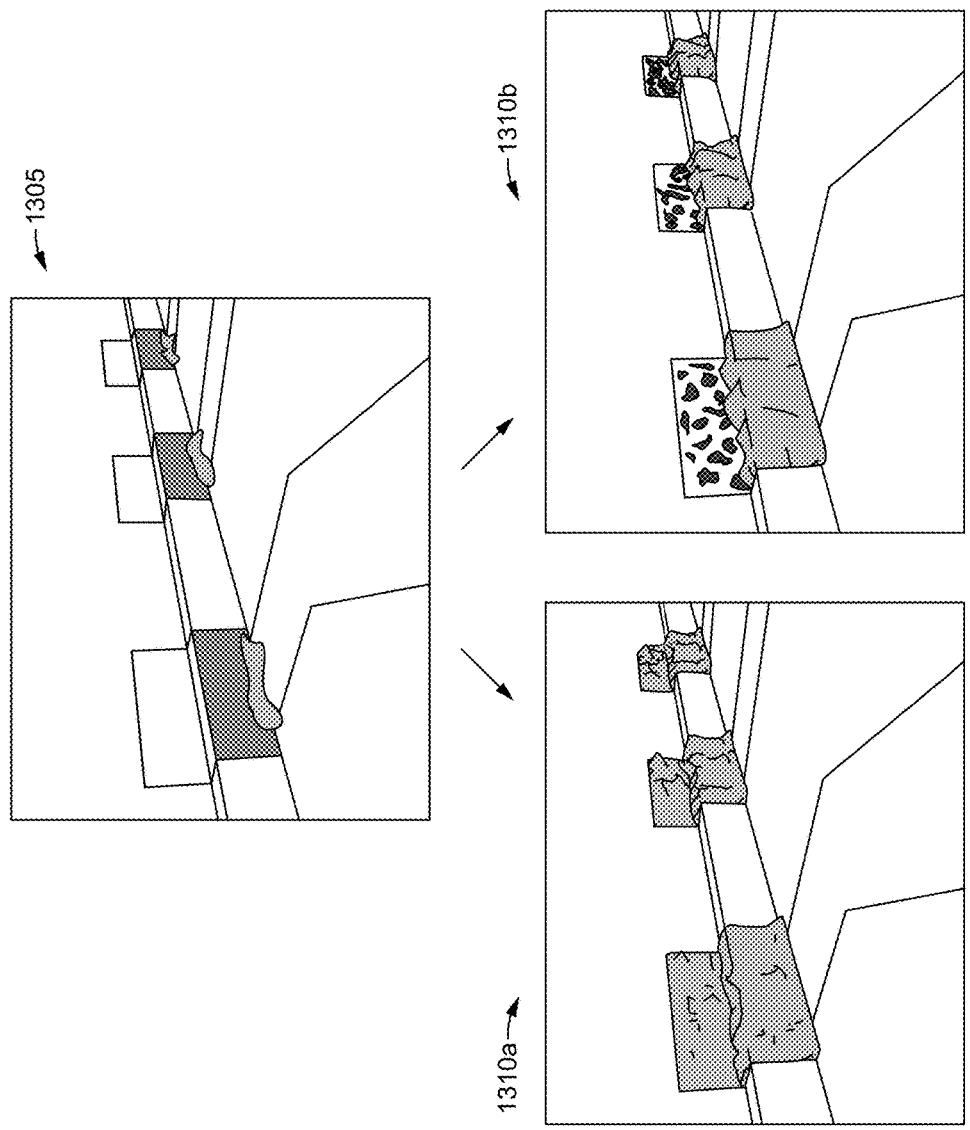
FIG. 13 illustrates another graphical explanation of an application according to some embodiments.

FIG. 13 illustrates another graphical explanation of an application according to some embodiments. The picture 1305 on the left shows a semiconductor package, such as the semiconductor package 1100, on a PCB before reflow. Solder is applied between the plurality of contacts and PCB. After reflow, one of two results can happen. One result, shown in the picture 1310a on the top right, if the exposed copper surfaces of the plurality of contacts are not contaminated, the solder can cover the entire side surfaces of the plurality of contacts during soldering. Another result, shown in the picture 1310b on the bottom right, if the copper surfaces of the plurality of contacts are contaminated, the solder can still partially cover the side surfaces of the plurality of contacts, particularly the areas of the side surfaces that are plated, during soldering. In both of these results, reliability of solder joint is good and can be determined as such by visual inspection.

Dimples

Figure 14A:
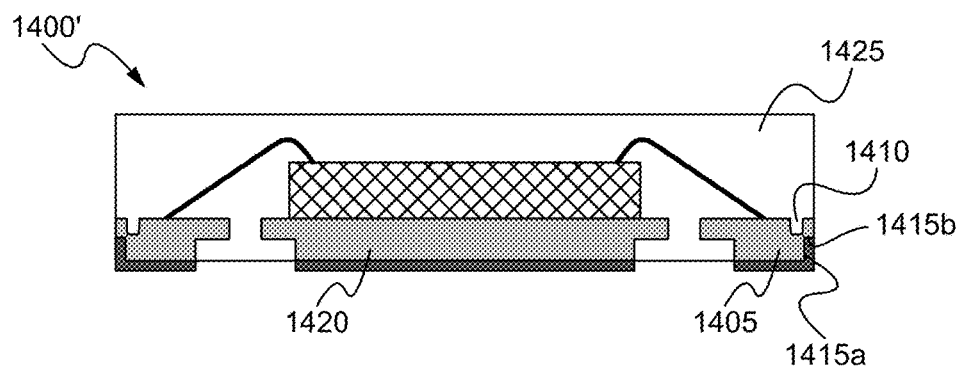
FIGS. 14A-14C illustrate other exemplary singulated semiconductor devices according to some embodiments.
Figure 14C:
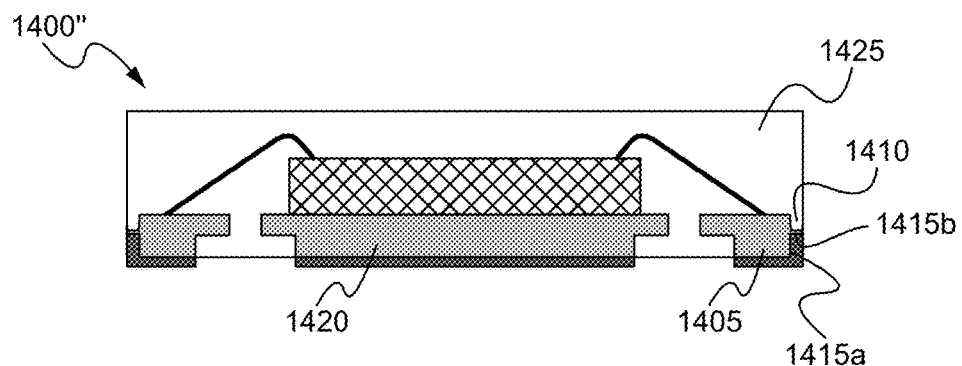
Figures 14B, 15:
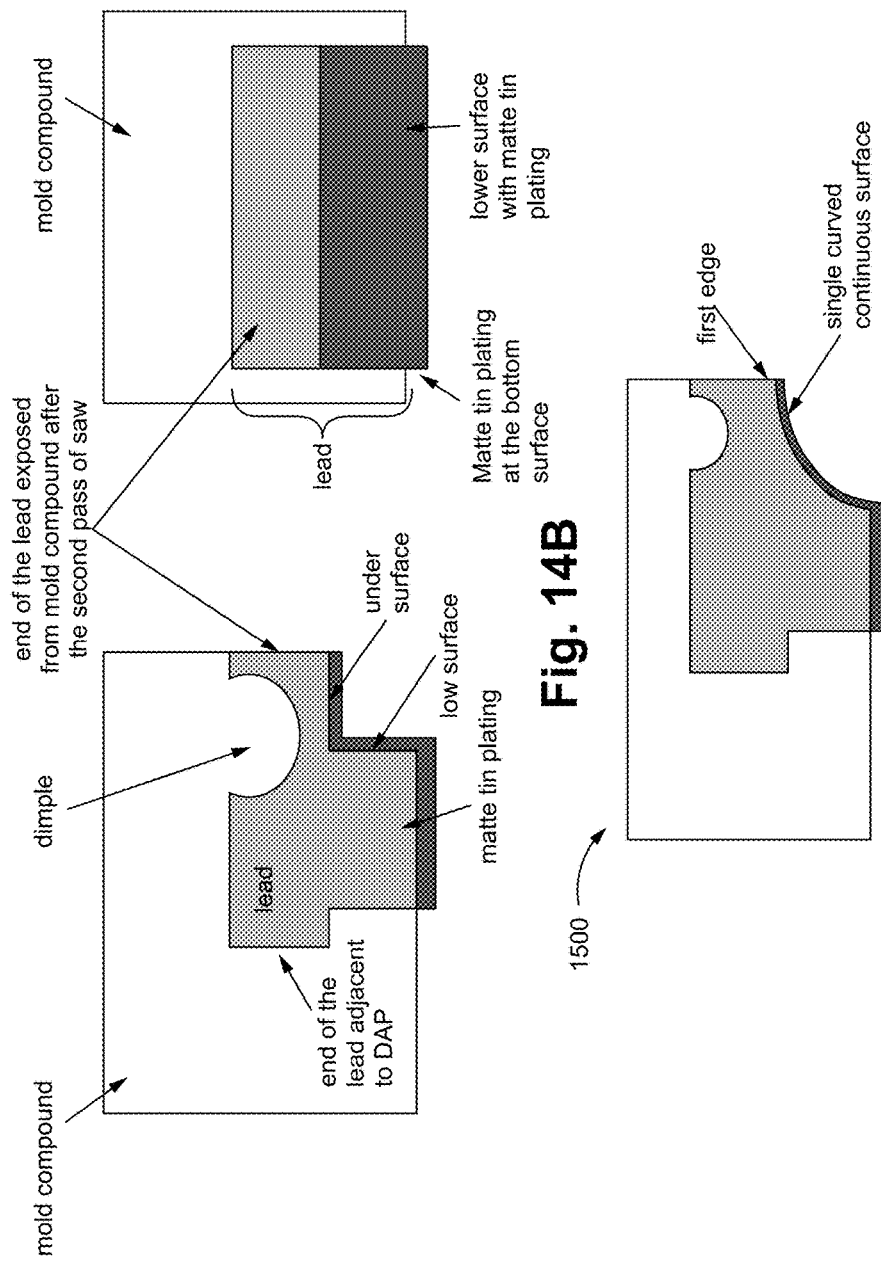
FIG. 15 illustrates a partial cross-sectional view of yet another singulated semiconductor device according to some embodiments.

FIG. 14A illustrates another exemplary singulated semiconductor device 1400 according to some embodiments. The singulated semiconductor device 1400 is similarly configured as the singulated semiconductor device 1100' of FIG. 11B, except that the singulated semiconductor device 1400 includes a dimple 1410 that is located on a top surface of each contact 1405, on which an electrical connection to a die attach pad 1420 is formed. As explained elsewhere, an undercut surface of each contact 1405 includes a vertical lower surface 1415a and a horizontal under surface 1415b that are fully plated with matte tin or any suitable solder wettable material. An end of each contact 1405 is exposed from mold compound 1425 after a second pass of a sawing process (e.g., a second partial cut). FIG. 14B illustrates a partial cross-sectional view and a partial lateral view of the singulated semiconductor device 1400 of FIG. 14A.

In FIG. 14A, the dimple 1410 is shown located away from the exposed end of the contact 1405 and closer to the die attach pad 1420. However, a dimple can be located anywhere on the contact. For example, the dimple 1410, either partially or entirely, can be located adjacent or at the exposed end of the contact 1405, as illustrated in FIG. 14C. For another example, the dimple 1425 can be located closer to the opposite end (e.g., non-exposed end) of the contact 1405. Other locations of the dimple 1410 are contemplated.

FIG. 15 illustrates a partial cross-sectional view of yet another singulated semiconductor device 1500 according to some embodiments. Unlike the singulated semiconductor device 1400 of FIG. 14A, an undercut surface of the singulated semiconductor device 1500 is a single curved continuous surface that extends from a first edge of an exposed end of a contact to a second edge at a bottom surface of the contact. A dimple is located on a top surface of the contact, on which an electrical connection to a die attach pad is formed. In some embodiments, the undercut surface is formed by selecting a different cutting blade in a first pass of a sawing process (e.g., a first partial cut). Alternatively, the undercut surface is formed by a chemical etching process, such as the one described above.

A dimple ensures good adhesion of the lead (e.g., contacts) to the mold compound and to prevent the lead from separating from the mold compound. In some embodiments, a dimple can be formed such that the whole dimple is located above an undercut surface, such as that illustrated in FIG. 15. Alternatively, a dimple can be formed such that only a partial dimple is located above an undercut surface, such as that illustrated in FIG. 14A. Alternatively, a dimple can be formed such that the whole dimple is located beyond an undercut surface and towards an interior contact end (e.g., non-exposed end) that can be adjacent to a die attach pad.

Figure 16A:
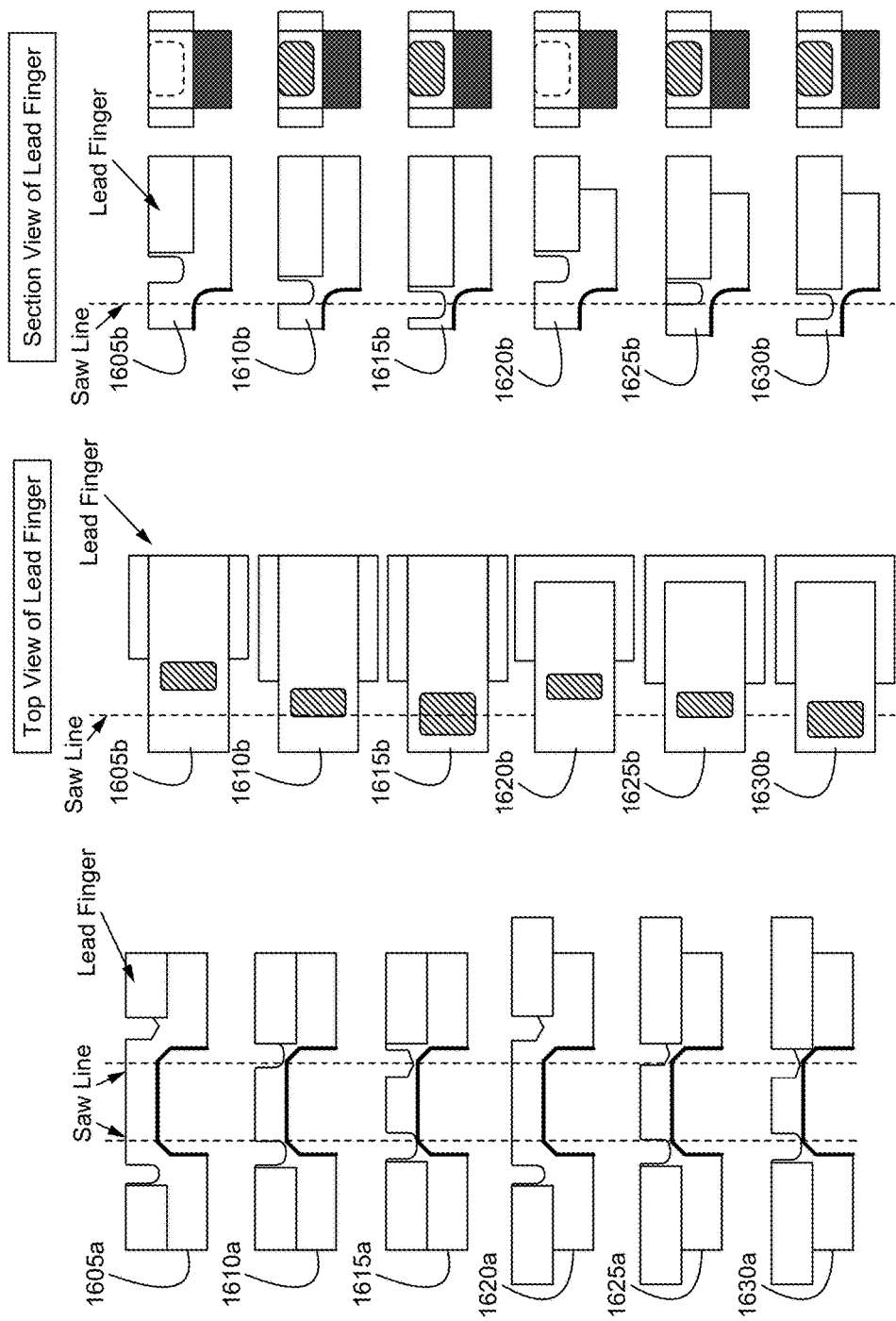
FIGS. 16A-16B illustrate cross-sectional views of exemplary leadframes, including various sizes and positions of dimples in relation to the midpoint of saw cut, and corresponding top and cross-sectional views, respectively, of contacts according to some embodiments.
Figure 16B:
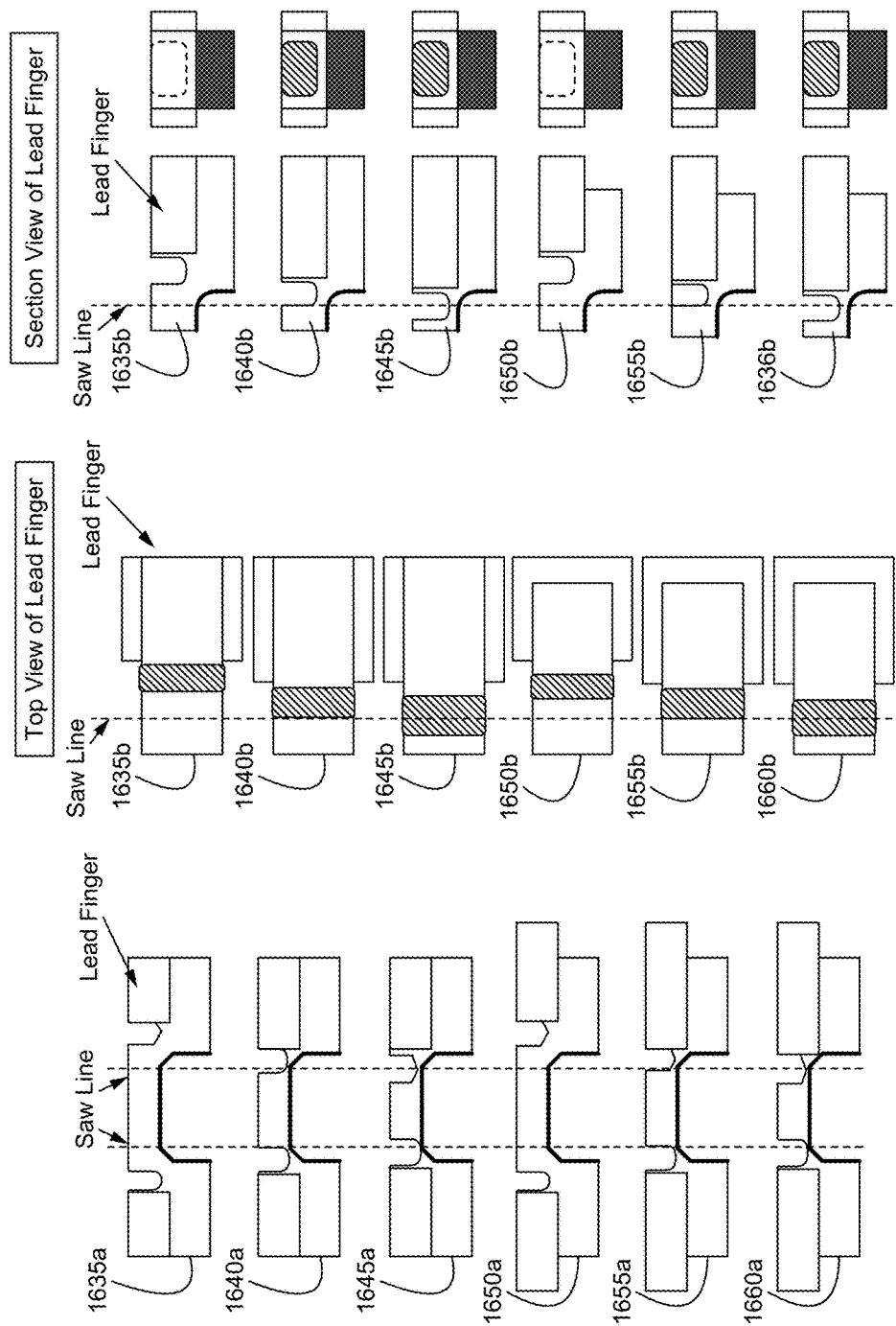

FIGS. 16A-16B illustrate cross-sectional views of exemplary leadframes, including various sizes and positions of dimples in relation to the midpoint of saw cut, and corresponding top and cross-sectional views, respectively, of contacts according to some embodiments. In leadframes 1605a, 1610a, 1615a, 1620a, 1625a, 1630a, 1635a, 1640a, 1645a, 1650a, 1655a, 1660a, the dimples are formed on the top of the leadframe and each forms a locking feature with the molding compound in the finished device or package. In contacts 1605b and 1620b corresponding to the leadframes 1605a and 1620a, respectively, the dimple is located outside the saw cut. In contacts 1610b and 1625b corresponding to the leadframes 1610a and 1625a, respectively, the saw cut coincides with one edge of the dimple. In contacts 1615b and 1630b corresponding to the leadframes 1615a and 1630a, respectively, the dimple is somewhat wider and the saw cut is located near the center of the dimple. Contacts 1635b, 1640b, 1645b, 1650b, 1655b, 1660b are similar to contacts 1605b, 1610b, 1615b, 1620b, 1625b, 1630b, respectively, except that the dimples extend all the way across the contacts.

As demonstrated herein, there is no additional processing step that is required to partially plated contact side surfaces. These partially plated contact side surfaces are plated at the same time as other areas (such as the first surfaces of the contacts and, in some embodiments, the die attach pad) are plated. There is only one plating layer that is applied to the semiconductor package. The semiconductor package with partial plating on its contact side surfaces ensures quality of soldering of the semiconductor package to a substrate. It should be noted that any combination of features (e.g., contacts, dimples, dies, die attach pads, solder balls, bond wires, etc.) can be used as required for the desired package.

Full Plating on Contact Side Surfaces

Figure 17:
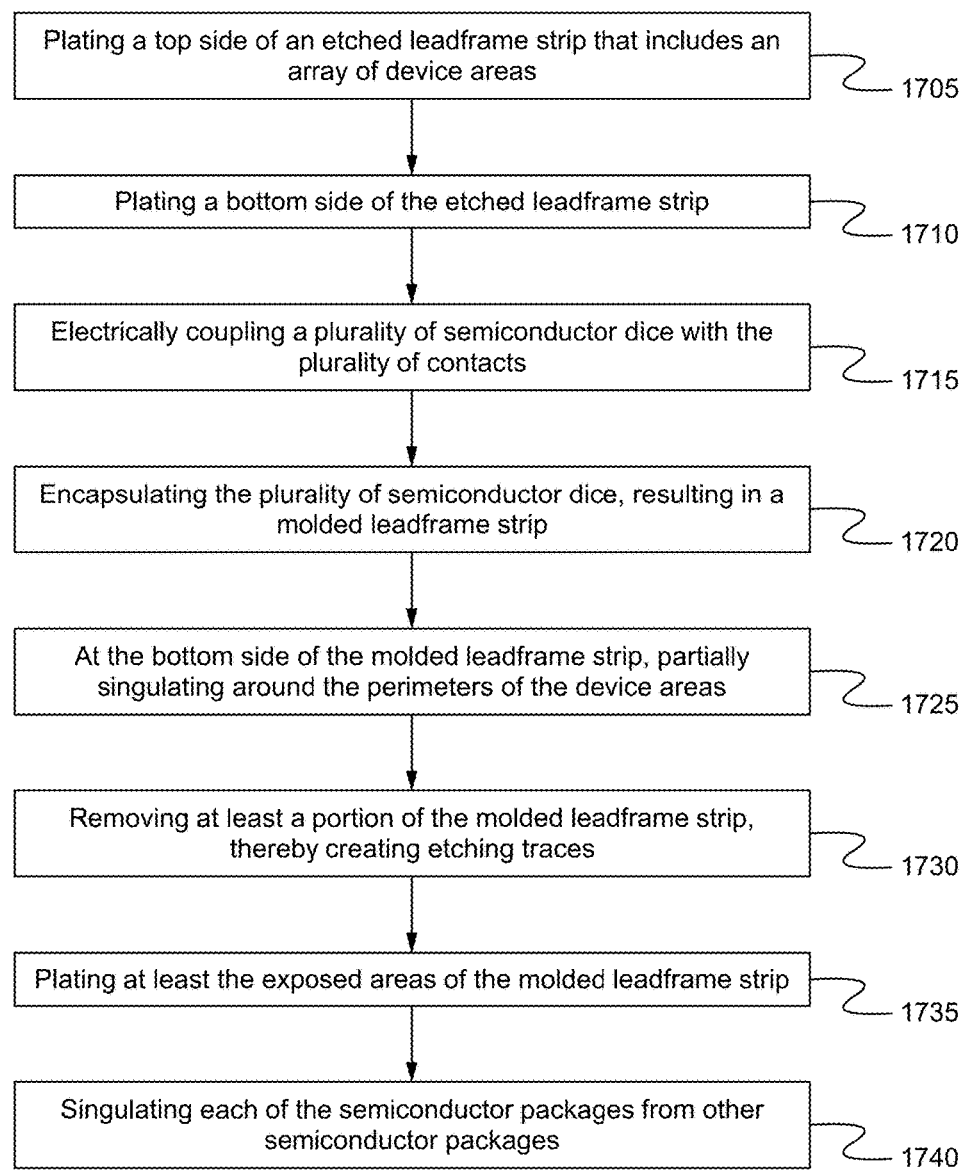
FIG. 17 illustrates another exemplary method of manufacturing semiconductor packages according to some embodiments.

In some embodiments, a single plating layer can be applied to all exposed contact surfaces, fully plating contact side surfaces rather than partially plating contact side surfaces, as described above. FIG. 17 illustrates an exemplary method 1700 of manufacturing semiconductor packages according to some embodiments. An exemplary result produced by each step of the method 1700 is illustrated in FIGS. 18A-18I. Any alternative results produced by the steps of the method 1700 are illustrated in FIGS. 19A-FIG. 21D. The method 1700 begins at a Step 1705, where a top side an etched leadframe strip 1800 is plated. At a Step 1710, a bottom side of the etched leadframe strip 1800 is plated. In some embodiments, the Steps 1705 and 1710 can occur simultaneously. Alternatively, the Step 1710 can occur before the Step 1705.

In some embodiments, the etched leadframe strip 1800 is similarly configured as the etched leadframe strip 400 or the etched leadframe strip 400'. The etched leadframe strip 1800 includes an array of device areas 1805. Each device area 1805 includes dam bars 1810 and contacts 1815 coupled with the dam bars 1810. The dam bars 1810 enclose a corresponding device area 1805. In some embodiments, unlike the dam bars of the etched leadframe strip 400, 400', the dam bars 1810 do not include a step. In some embodiments, the corresponding device area 1805 further includes tie bars 1825 and a die attach pad 1830 coupled with the tie bars 1825 such that the die attach pad 1830 is suspended to the leadframe strip 1800 in the corresponding device area 1805 via the tie bars 1825.

Figure 18A:
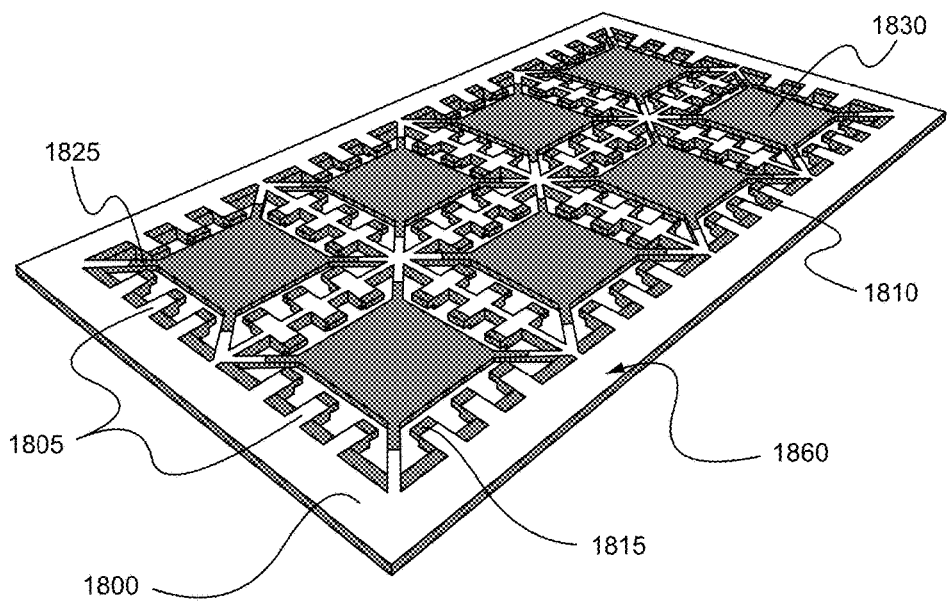
Figure 18B:
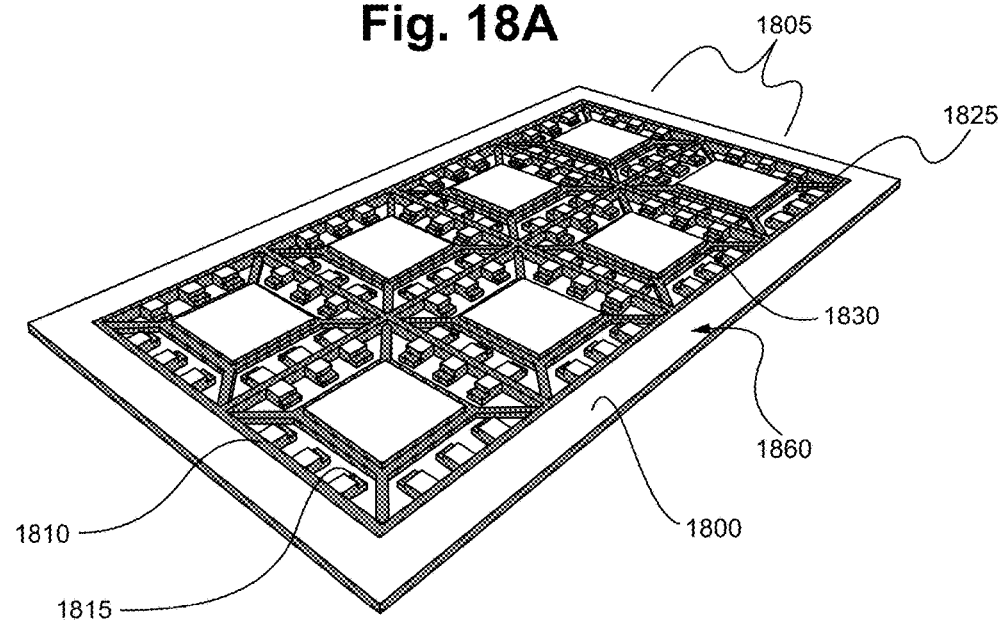
Figure 19A:
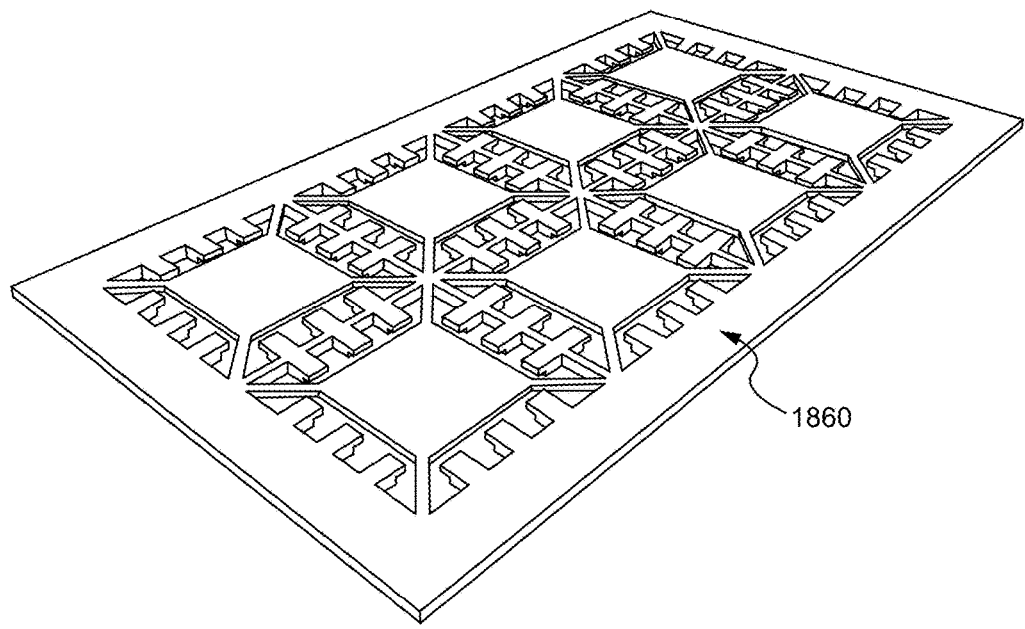
FIGS. 19A-21D illustrate exemplary alternative results produced by the steps of the method of FIG. 17.
Figure 19B:
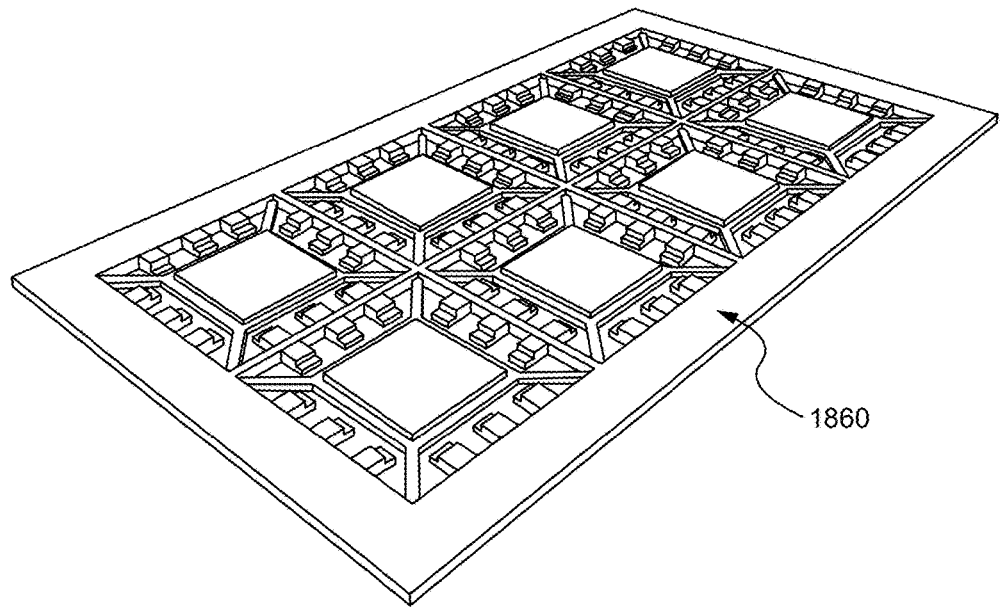

In some embodiments, both the top side of the etched leadframe strip 1800 and the bottom side of the etched leadframe strip 1800 are selectively plated, as illustrated in FIGS. 18A and 18B. Alternatively, both the top side of the etched leadframe strip 1800 and the bottom side of the etched leadframe strip 1800 are fully plated, as illustrated in FIGS. 19A and 19B. In some embodiments, fully plating both sides of the etched leadframe strip 1800 includes fully plating the entirety of the etched leadframe strip 1800 (e.g., all surfaces). Alternatively, one of the sides is selectively plated, while the other side is fully plated.

The top side of the etched leadframe strip 1800 is plated at least at locations where semiconductor dice are electrically coupled with the etched leadframe strip 1800. The selected plating on the top side of the etched leadframe strip 1800 illustrated in FIG. 18A includes portions of the contacts 1815, the perimeter of the etched leadframe strip 1800, and portions of the tie bars 1825. These portions of the contacts 1815, the perimeter of the etched leadframe strip 1800, and these portions of the tie bars 1825 are continuously plated. Since the plating at these portions of the contacts 1815 and these portions of the tie bars 1825 cross portions of the dam bars 1810, portions of the dam bars 1810 are also plated. Unplated portions of the contacts 1815 and unplated portions of the tie bars 1825 are at the ends thereof, closest to the center of their respective device area 1805.

The bottom side of the etched leadframe strip 1800 is plated at least at locations where the plated areas on the bottom side of the etched leadframe strip 1800 will act as a chemical etching mask. The selected plating on the bottom side of the leadframe strip 1800 illustrated in FIG. 18B includes portions of the contacts 1815 and the perimeter of the etched leadframe strip 1800. The plated portions of the contacts 1815 and the plated perimeter of the etched leadframe strip 1800 are not continuously plated as they are separated by the dam bars 1810 and the tie bars 1825, which are unplated.

The plated areas on the bottom side and the top side of the leadframe strip 1800 will act as a chemical etching mask; as such, unplated areas will be etched away in a later etching step (e.g., Step 1730). In addition, the plated areas on the bottom side and the top side of the leadframe strip 1800 form an electrical carrier path in a later electrolytic plating step (e.g., Step 1735). The plating material 1860 can be NiPdAu, NiPdAu+Alloy, Ag, Cu, or other suitable material.

Figure 18C:
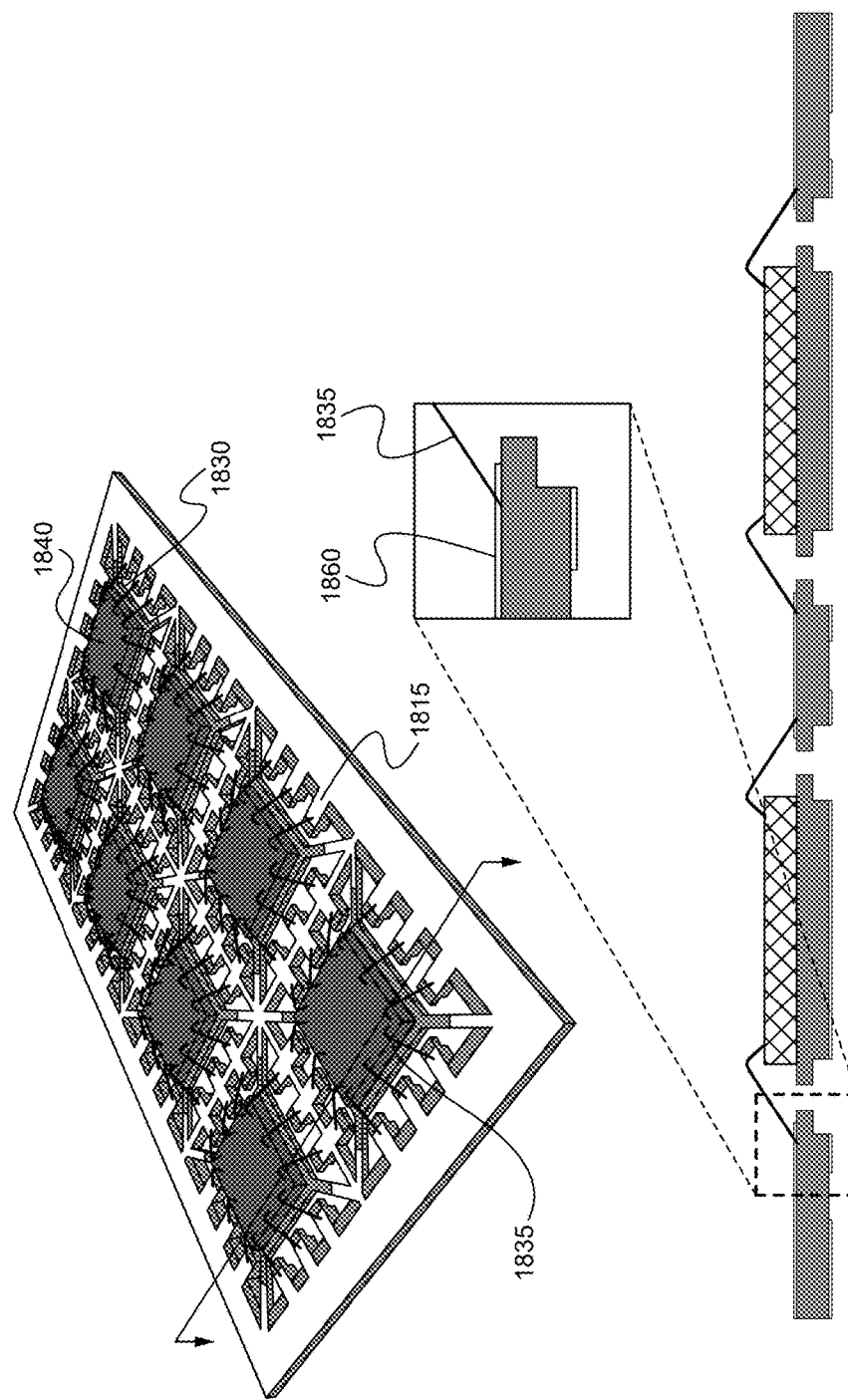
Figure 19C:
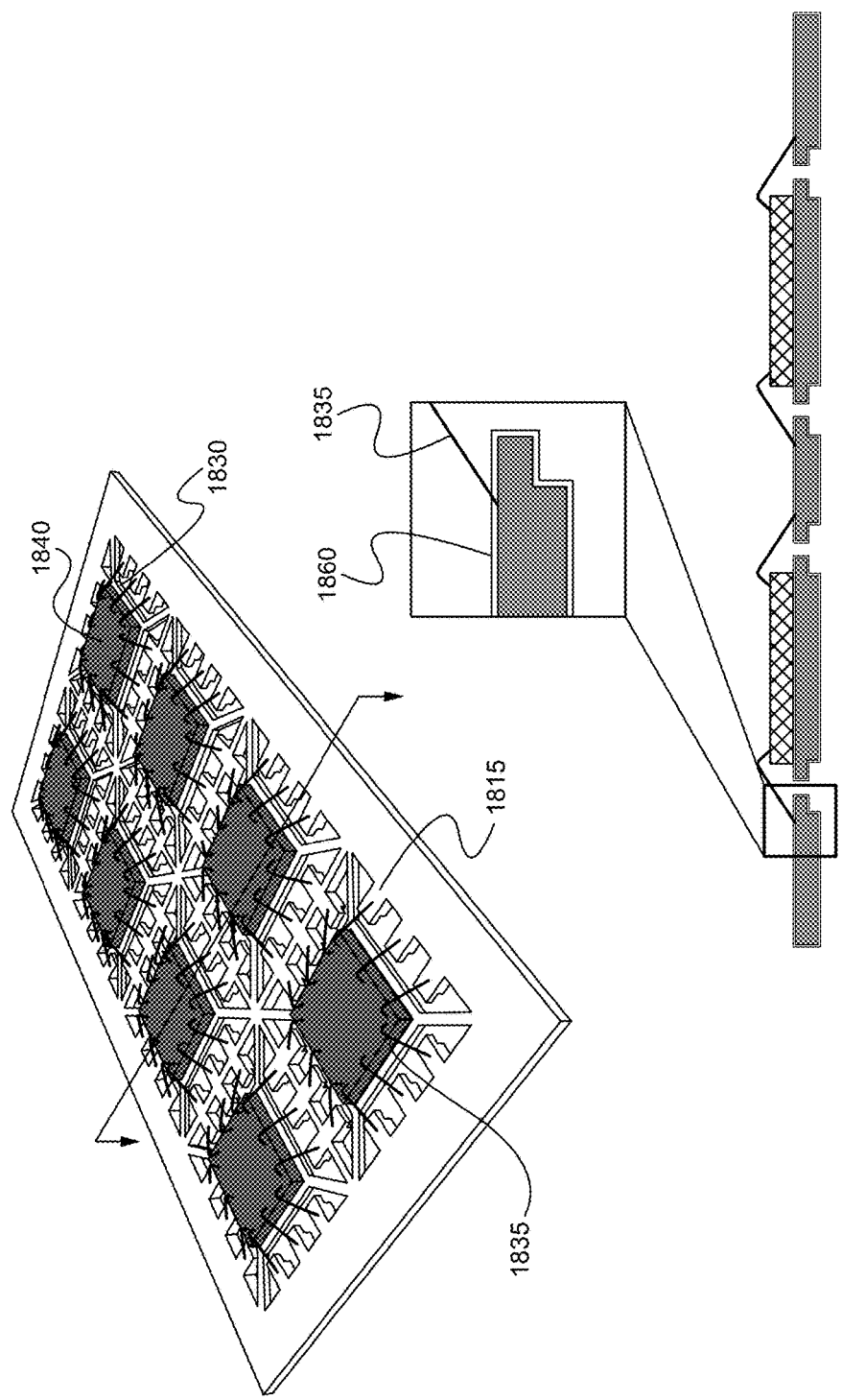

At a Step 1715, a plurality of semiconductor dice is electrically coupled with the plurality of contacts 1815. Each device area 1805 includes at least one semiconductor die. In some embodiments, on the top side of the leadframe strip 1800, epoxy is applied between the die attach pads 1830 and the semiconductor dice, and wirebonds couple the semiconductor dice with the plated portions of the contacts 1815. Alternatively, on the top side of the leadframe strip 1800, the semiconductor dice are flipped and positioned so that solder balls couple the semiconductor dice with the plated portions of the contacts 1815. FIG. 18C illustrates a plurality of semiconductor dice 1840 electrically coupled to the selectively plated leadframe strip (illustrated in FIGS. 18A-18B), while FIG. 19C illustrates a plurality of semiconductor dice 1840 electrically coupled to the fully plated leadframe strip (illustrated in FIGS. 19A-19B).

Figure 18D:
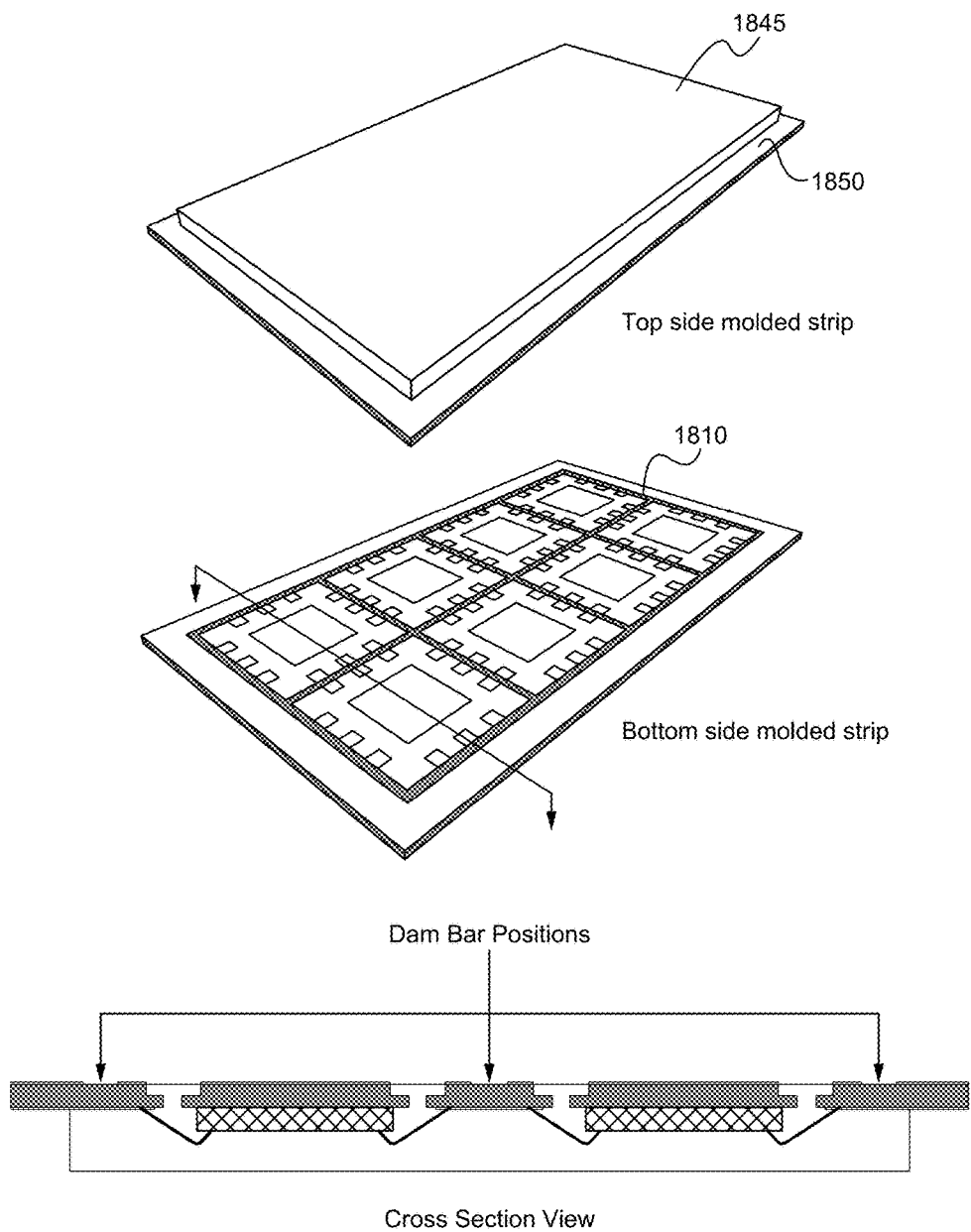
Figure 19D:
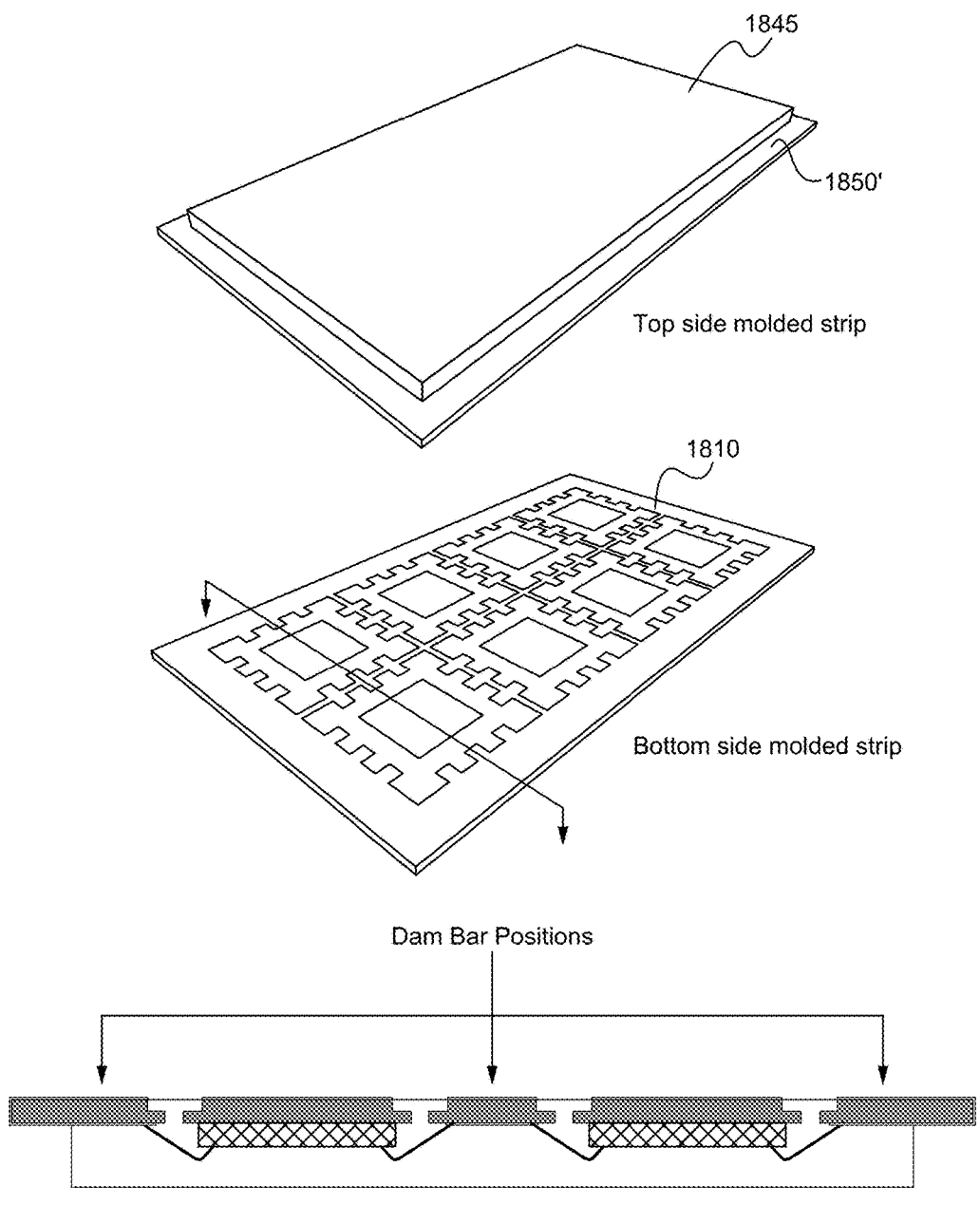

At a Step 1720, the plurality of semiconductor dice 1840 is encapsulated with a molding compound 1845, resulting in a molded leadframe strip. FIG. 18D illustrates the top side of the molded leadframe strip 1850, a cross sectional view of the molded leadframe strip 1850, and the bottom side of the molded leadframe strip 1850. The dam bars 1810 are flush with the bottom side of the molding compound 1845 and are exposed (as they are not plated). FIG. 19D illustrates the top side of the molded leadframe strip 1850', a cross sectional view of the molded leadframe strip 1850', and the bottom side of the molded leadframe strip 1850'. The dam bars 1810 are flush with the plated die attach pads 1830 at the bottom side of the molding compound 1845 and are not exposed (as they are plated).

At a Step 1725, the bottom side of the molded leadframe strip 1850, 1850' is partially singulated around the perimeters of the device areas 1805, as illustrated in FIG. 18E. The partial singulation is along the dam bars 1810 (outlined in thick black solid lines). In some embodiments, the depth of the partial singulation is no more than the thickness of the leadframe strip 1800. In some embodiments, the depth of the partial singulation is half the thickness of the leadframe strip 1800. In some embodiments, the depth of the partial singulation is between 10%-50% of the thickness of the leadframe strip 1800. Exemplary partial singulation procedures are blade singulation procedure, laser singulation procedure, and other suitable singulation procedures.

In some embodiments, the Step 1725 is optional for molded leadframe strip 1850. FIG. 20A illustrates no partial singulation of the molded leadframe strip 1850.

Figure 18F:
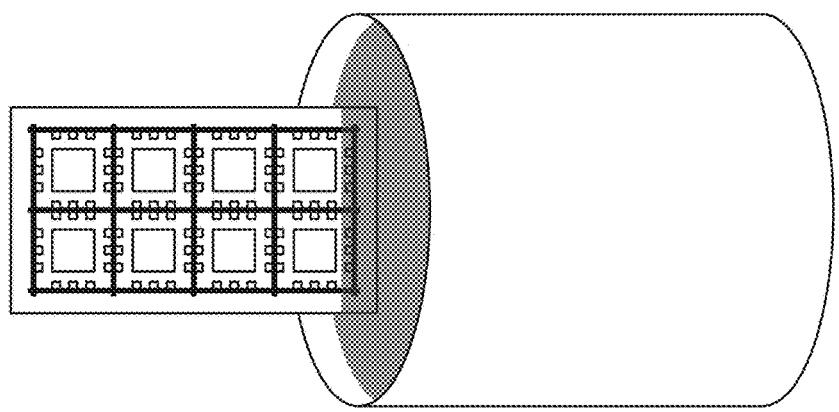

At a Step 1730, at least a portion of the molded leadframe strip 1850, 1850' is removed, thereby creating etching traces 1855. A chemical etching process, such as a copper chemical etching dip process or a copper chemical etching spray process of FIG. 18F, is applied to remove exposed copper portions of the molded leadframe strip 1850, 1850'. The exposed copper portions are those portions that are unplated as a result of the partial singulation at Step 1725 (FIG. 18E) or, alternatively, if partial singulation of the molded leadframe strip 1850 (e.g., Step 1725) is not performed, then as a result of selectively plating at Step 1710 (FIGS. 18B, 18D).

Figure 20B:
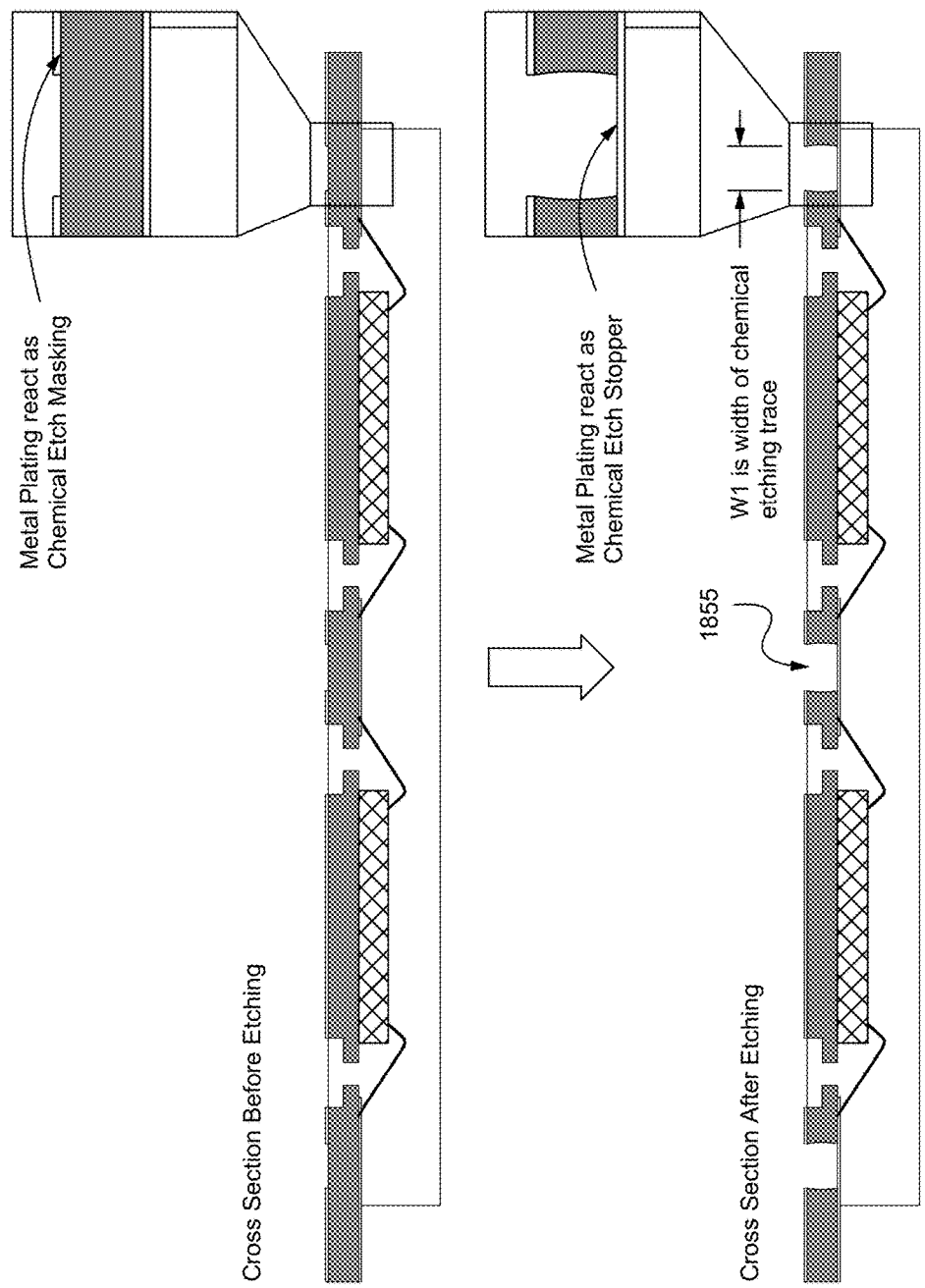

In some embodiments, the etching in the Step 1730 is a full chemical etch. FIG. 18G illustrates cross sectional views of the before and after a full chemical etch of a partially singulated molded leadframe strip, and FIG. 20B illustrates cross sectional views of the before and after a full chemical etch of a non-partially singulated molded leadframe strip. The chemical etching process in the full etch entirely removes those copper portions, thereby exposing the plating that was between the molding compound and the top side the etched leadframe strip 1800. During etching, the plating on the top side the etched leadframe strip 1800 behaves as a chemical etch stopper, whereas the plating on the bottom side the etched leadframe strip 1800 behaves as a chemical etch mask. The width of the etching trace 1855 is labeled as W1. The depth of the etching trace 1855 is the thickness of the leadframe strip 1800. In some embodiments, the corners fo the etching traces 1855 are curved. The full chemical etch electrically isolates the plurality of dice.

Figure 21A:
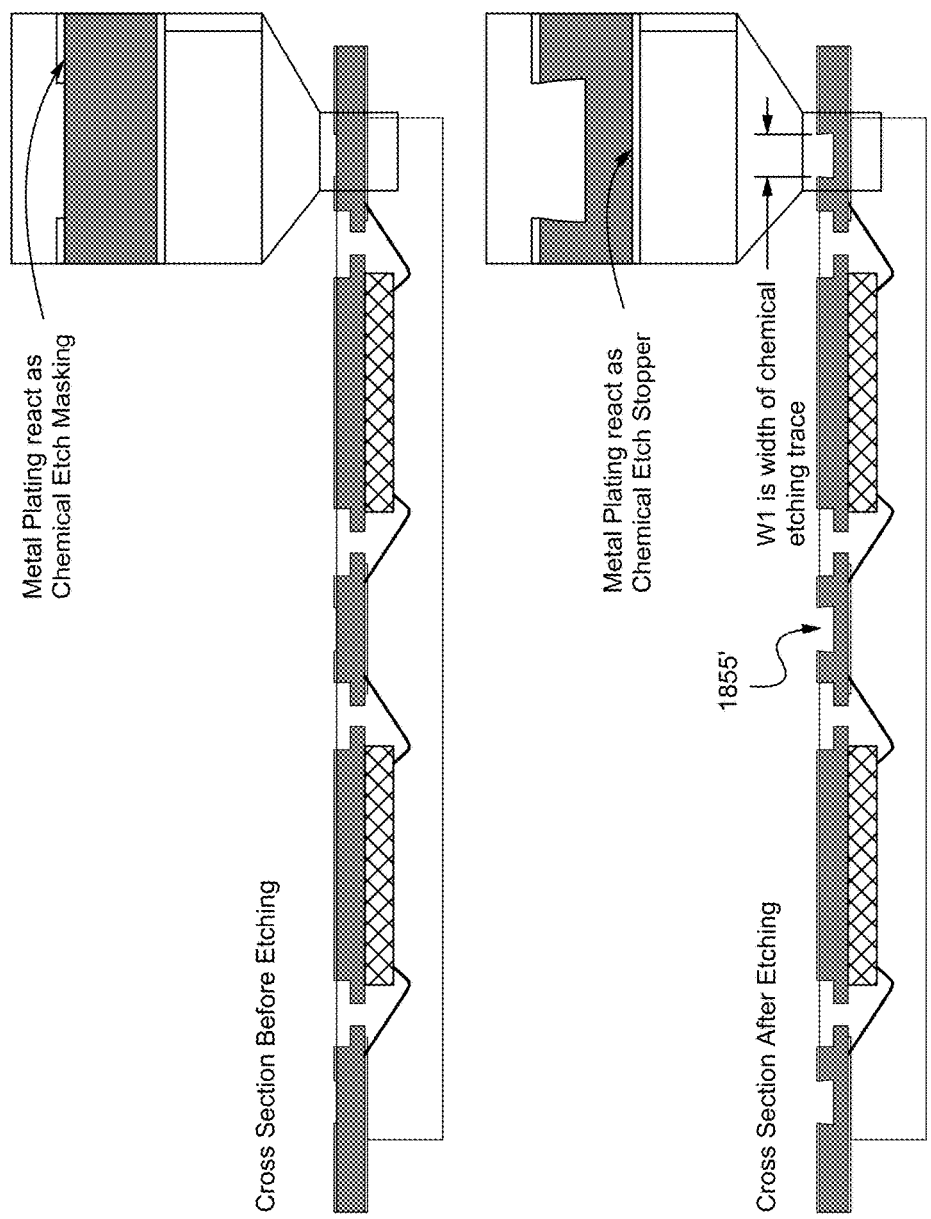

In some embodiments, the etching in the Step 1730 is a half chemical etch. FIG. 21A illustrates the before and after a half chemical etch of a non-partially singulated molded leadframe strip 1800. The degree of etching shown in FIG. 21A is a half etch (e.g., etch to half the thickness of the leadframe strip 1800. However, more or less etching is contemplated, depending on application. The chemical etching process creates the chemical etching traces 1855' along the unplated areas at the bottom of the molded leadframe strip 1850. The width of the etching trace 1855' is labeled as W1. The depth of the etching trace 1855' is half the thickness of the leadframe strip 1800. In some embodiments, the corners of the etching traces 1855' are curved.

In some embodiments, the Step 1730 is not necessary to form etching traces that are as deep as half the leadframe thickness. In some embodiments, the half leadframe thickness can be achieved from the Step 1725 (FIG. 18E), where the partial singulation at the bottom side of the molded leadframe strip 1850, 1850' results in cuts or trenches (e.g., resulting etching traces) having a depth of half the leadframe thickness. In some embodiments, the corners of these etching traces are not curved.

At a Step 1735, the exposed areas of the molded leadframe strip are plated. Particularly, the molded leadframe strip is plated with a plating material can be Sn or other suitable material on the exposed copper, including the chemical etching traces 1855, 1855', of the molded leadframe strip in order to prevent surface reaction with oxygen. In some embodiments, an electric plating process is used, such as the exemplary electric plating machine 465 of FIG. 4I. FIG. 18H illustrates a cross sectional view of the molded leadframe strip (illustrated in FIG. 18G or in FIG. 20B) that is electroplated. FIG. 21B illustrates a cross sectional view of the molded leadframe strip (illustrated in FIG. 21A) that is electroplated. The new plating material is plated on the exposed copper, including exposed copper of the chemical etching traces 1855, 1855', of the molded leadframe strip. The exposed copper of the chemical etching traces 1855, 1855' includes side surfaces of these cuts/trenches. In some embodiments, the exposed copper of the chemical etching traces 1855, 1855' can also include bottom surfaces of the cuts/trenches, as illustrated in FIG. 21B (e.g., part of the leadframe 1800). The new plating material is also plated directly over previously plated areas at the bottom of the leadframe strip. In some embodiments, the new plating material is directly plated over previously plated areas that were at the top of the leadframe strip, as illustrated in FIG. 18H. The result of the Step 1735 is one continuous plating layer, with a first portion of the continuous plating layer directly coupled with the previously plated areas at the bottom of the leadframe strip, a second portion of the continuous plating layer directly coupled with exposed copper side surfaces of the cuts/trenches, and with a third portion of the continuous plating layer directly coupled with the bottom surfaces of the cuts/trenches, which can be either previously plated areas that were at the top of the leadframe strip or exposed copper bottom surfaces of the cuts/trenches.

Figure 21D:
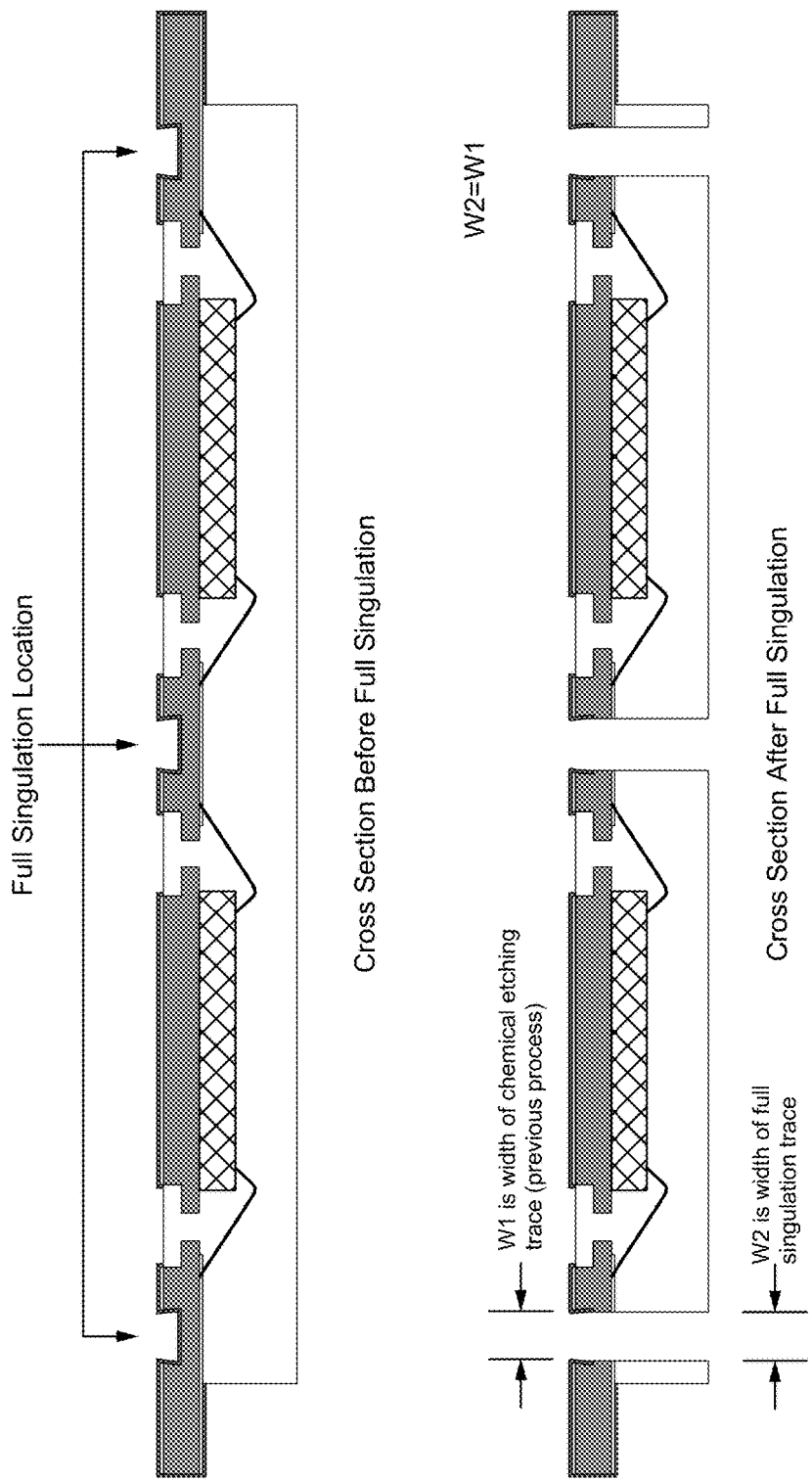

At a Step 1740, each of the semiconductor packages is singulated, along singulation traces, from other semiconductor packages. In some embodiments, the singulation uses a saw or blade, as illustrated in FIG. 4K. The thickness of the blade is narrower than, same as, or wider than the width of the chemical etching traces 1855, 1855'. As such, the width of each of the singulation traces is less than, same as, or more than the width of each of the etching traces. In some embodiments, the electroplated molded leadframe is singulated at the center location of the chemical etching traces 1855, 1855'. FIGS. 18I, 21C, and 21D each illustrates cross sectional views of the before and after singulation of an electroplated molded leadframe strip. In FIG. 18I, the electroplated molded leadframe strip (illustrated in FIG. 18H) is singulated. The thickness of the blade (W2) is narrower than the width of the chemical etching traces. In other words, W2<W1. However, it is contemplated that the width of W2 can be the same as or larger than the width of W1. In FIGS. 21C and 21D, the electroplated molded leadframe strip (illustrated in FIG. 21B) is singulated. In FIG. 21C, the thickness of the blade (W2) is narrower than the width of the chemical etching traces. In other words, W2<W1. In FIG. 21D, the thickness of the blade (W2) is the same or substantially the same as the width of the chemical etching traces. In other words, W2=W1. However, it is contemplated that the width of W2 can be larger than the width of W1. In FIG. 18I, the blade cuts through only the molding compound, whereas in FIGS. 21C and 21D, the blade cuts through the molding compound and a portion of the etched leadframe strip. After the Step 1740, the method 300 results in singulated semiconductor packages.

Figure 22A:
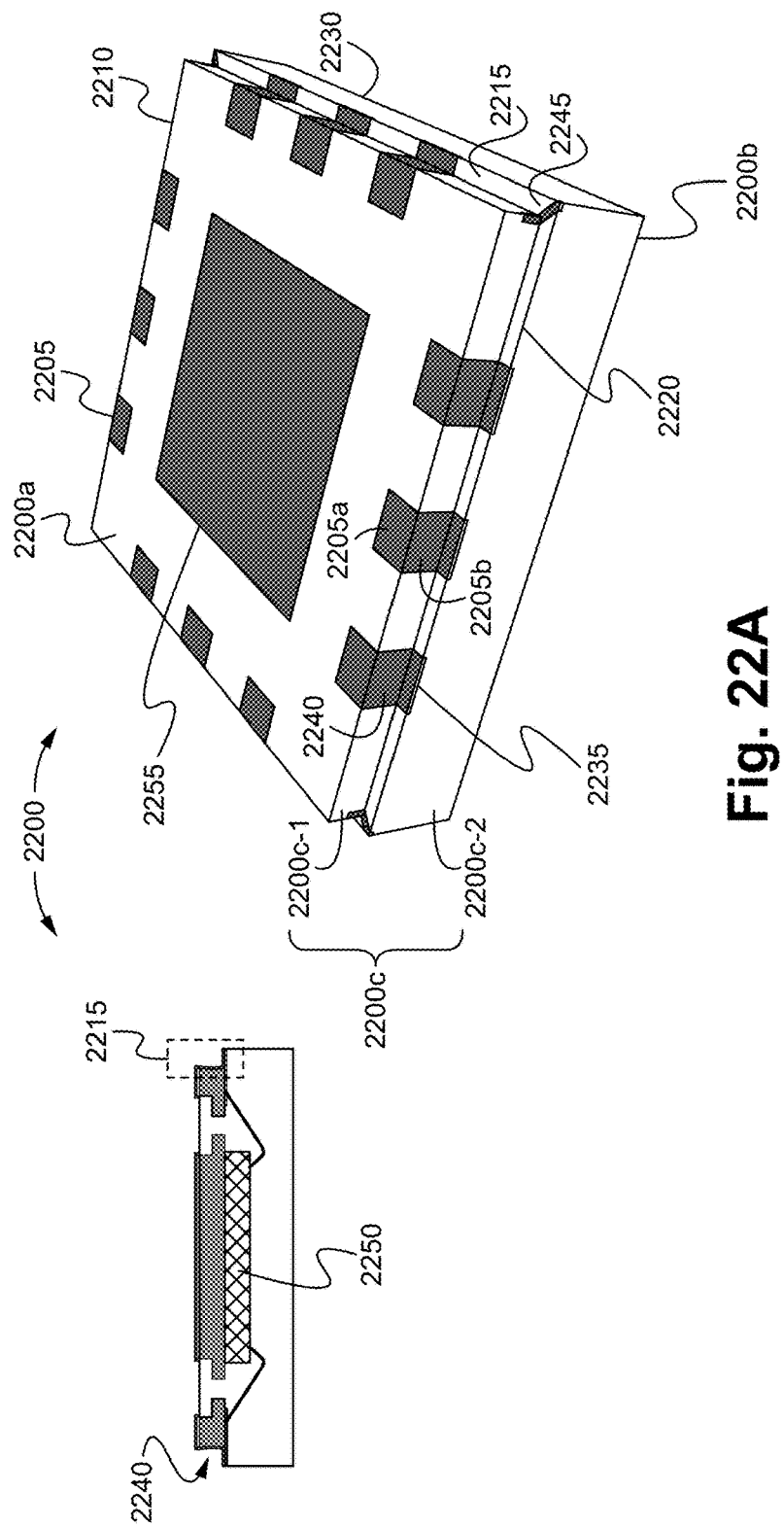
FIGS. 22A-22C illustrate other exemplary singulated semiconductor devices according to some embodiments.
Figure 22B:
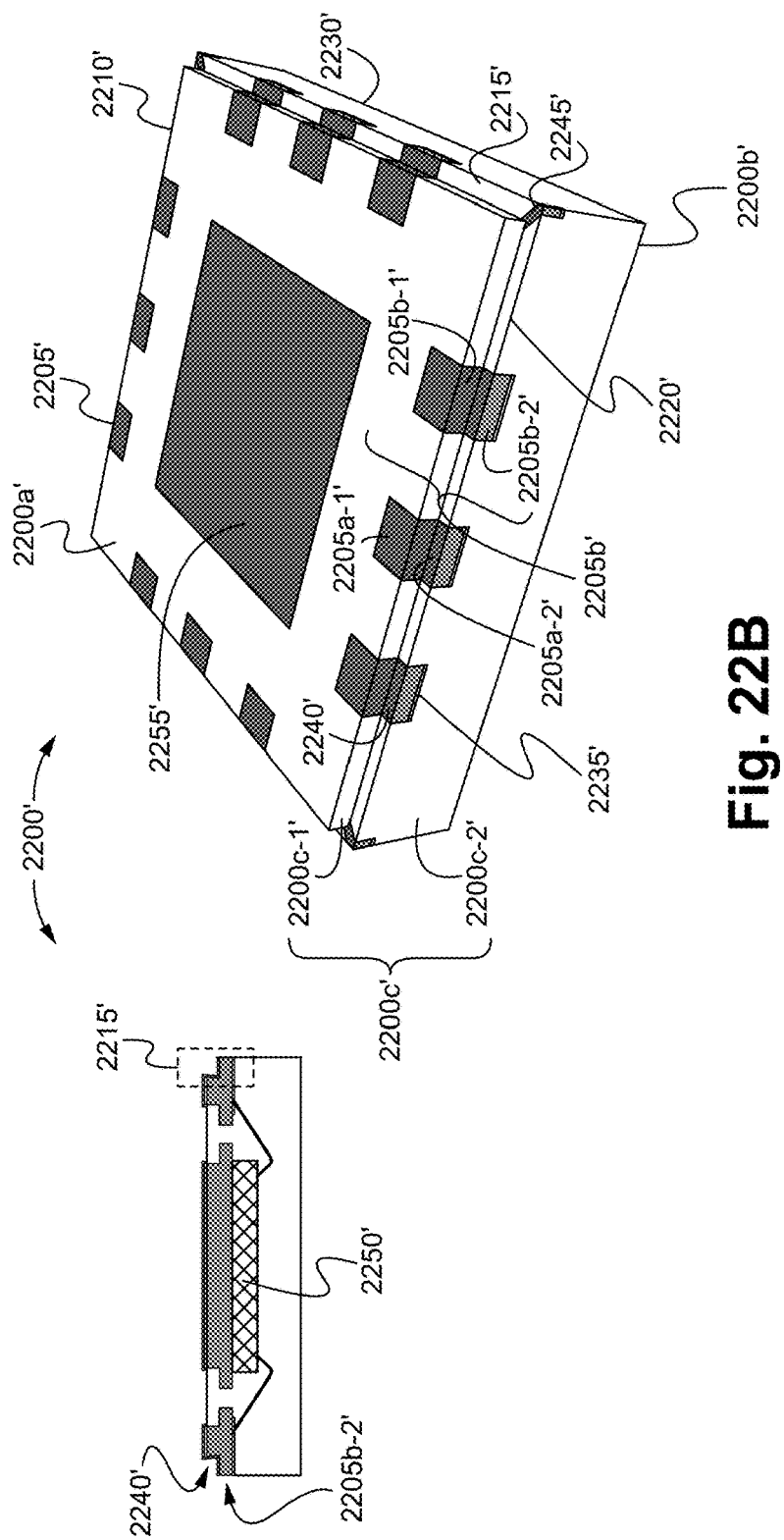
Figure 22C:
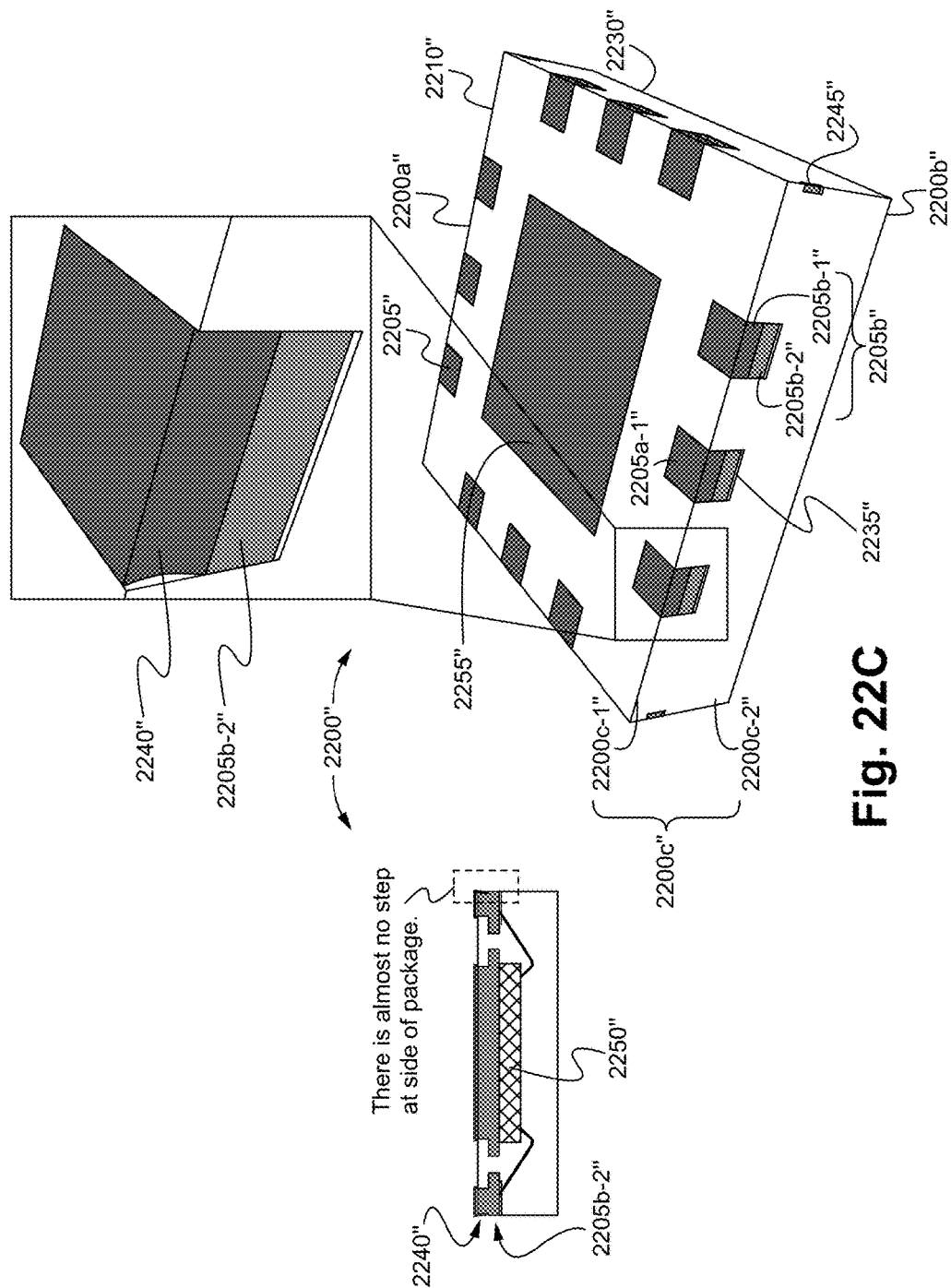

FIGS. 22A-22C illustrate other exemplary singulated semiconductor devices according to some embodiments. FIG. 22A illustrates a cross sectional view and an isometric view of a singulated semiconductor package 2200 resulting from the singulation step illustrated in FIG. 18I. The semiconductor package 2200 includes a step 2215 along each side of the semiconductor package 2200, thereby forming an intermediary set of peripheral edges 2220 between a bottom set of peripheral edges 2210 and a top set of peripheral edges 2230. The step 2215 is formed by using a blade having a width W2 that is smaller than W1 (width of the chemical etching trace). Each of the edges in the intermediary set of edges 2220 and a corresponding edge in the top set of edges 2230 of the same side are in the same plane, while each of the edges in the bottom set of edges 2210 is not in the same plane as a corresponding edge in the top set of edges 2230 and a corresponding edge in the intermediary set of edges 2220 are in. As such, each side surface 2200*c* of the semiconductor package 2200 includes a first portion 2200*c*-1 and a second portion 2200*c*-2, wherein the second portion 2200*c*-2 extends beyond the first portion 2200*c*-1. At least a part of the surface of the molding compound at the first portion 2200*c*-1 has an etched texture/pattern, while the entire surface of the molding compound at the second portion 2200*c*-2 has a sawed texture/pattern, which is different from the etched texture/pattern (e.g., different surface roughness/topographies). The step 2215 results in the semiconductor device 2200 including the area of the bottom surface 2200*a* being smaller than the area of the top surface 2200*b*.

The semiconductor package 2200 includes a formed leadframe that includes a plurality of contacts 2205. The depth of the step 2215 is the thickness of a contact 2205. The plurality of contacts 2205 is located around the bottom set of peripheral edges 2210 of the singulated semiconductor package 2200. Each of the plurality of contacts 2205 includes a planar surface 2205*a* that is flush with the bottom surface 2200*a* of the semiconductor device 2200 and a side surface 2205*b* that is flush with and/or slightly curved at the first portion 2200*c*-1 of the side surface 2200*c* of the semiconductor device 2200. A first (or internal) plating layer 2235 that is adhered between the molding compound and the leadframe, is exposed at and flush with the second portions 2200*c*-2 of the side surfaces 2200*c* of the semiconductor package 2200, and is also exposed at and flush with adjacent landing surfaces of the steps 2215, along the intermediary set of edges 2220. The exposed copper of the leadframe is fully plated with a second plating layer 2240. The second plating layer 2240 fully plates all exposed surfaces of each contact 2205, namely, the planar surface 2205*a* and the side surface 2205*b* of each contact 2205. The second plating layer 2240 of each contact further extends and adheres to the surface of the first plating layer 2235 that is flush with the landing surface of the step 2215.

A semiconductor die 2250 is electrically coupled with the plurality of contacts 2205. In some embodiments, the formed leadframe also includes tie bars 2245 and a die attach pad 2255 that is coupled with the tie bars 2245. The tie bars 2245 are exposed at the corners of and flush with the first portions 2200c-1 of the side surfaces 2200c, and are also plated with the second plating layer 2240. In some embodiments, the thickness of a tie bar 2245 is half the thickness of a contact 2205. In FIG. 22A, the semiconductor die 2250 is epoxied with the die attach pad 2255 and is electrically coupled with the plurality of contact 2205 using wirebonds. Alternatively, instead of wirebonds, solder balls are used to electrically couple the semiconductor die with the plurality of contacts. Although a single semiconductor die 2250 is described, it is contemplated that a singulated semiconductor device can include a plurality of semiconductor dice stacked therein and electrically coupled with each other and/or the plurality of contacts 2205.

FIG. 22B illustrates a cross sectional view and an isometric view of a singulated semiconductor package 2200' resulting from the singulation step illustrated in FIG. 21C. The semiconductor package 2200' includes a step 2215' along each side of the semiconductor package 2200', thereby forming an intermediary set of peripheral edges 2220' between a bottom set of peripheral edges 2210' and a top set of peripheral edges 2230'. The step 2215' is formed by using a blade having a width W2 that is smaller than W1 (width of the chemical etching trace). Each of the edges in the intermediary set of edges 2220' and a corresponding edge in the top set of edges 2230' of the same side are in the same plane, while each of the edges in the bottom set of edges 2210' is not in the same plane as a corresponding edge in the top set of edges 2230' and a corresponding edge in the intermediary set of edges 2220' are in. As such, each side surface 2200c' of the semiconductor package 2200' includes a first portion 2200c-1' and a second portion 2200c-2', wherein the second portion 2200c-2' extends beyond the first portion 2200c-1'. At least a part of the surface of the molding compound at the first portion 2200c-1' has an etched texture/pattern, while the entire surface of the molding compound at the second portion 2200c-2' has a sawed texture/pattern, which is different from the etched texture/pattern (e.g., different surface roughness/topographies). The step 2215' results in the semiconductor device 2200' including the area of the bottom surface 2200a' being smaller than the area of the top surface 2200b'.

The semiconductor package 2200' includes a formed leadframe that includes a plurality of contacts 2205'. The depth of the step 2215' is approximately half the thickness of a contact 2205'. The plurality of contacts 2205' is located around the bottom set of peripheral edges 2210' and the intermediary set of peripheral edges 2220' of the singulated semiconductor package 2200'. Each of the plurality of contacts 2205' includes a first planar surface 2205a-1' that is flush with the bottom surface 2200a' of the semiconductor device 2200', a first portion 2205b-1' of a side surface 2205b' that is flush with and/or slightly curved at the first portion 2200c-1' of the side surface 2200c' of the semiconductor device 2200', a second planar surface 2205a-2' that is flush with a landing surface of the step 2215', and a second portion 2205b-2' of the side surface 2205b' that is flush with the second portion 2200c-2' of the side surface 2200c' of the semiconductor device 2200'. A first (or internal) plating layer 2235' that is adhered between the molding compound and the leadframe, is exposed at and flush with the second portions 2200c-2' of the side surfaces 2200c' of the semiconductor package 2200', and coupled with an exterior or protruding portion of the contact 2205'. The exposed copper of the leadframe is partially plated with a second plating layer 2240'. The second plating layer 2240' partially plates the exposed surfaces of each contact 2205', namely, only the first planar surface 2205a-1', the first portion 2205b-1' of the side surface 2205b', and the second planar surface 2205a-2' of each contact 2205'. The second portion 2205b-2' of each contact 2205' is exposed (unplated).

A semiconductor die 2250' is electrically coupled with the plurality of contacts 2205'. In some embodiments, the formed leadframe also includes tie bars 2245' and a die attach pad 2255' that is coupled with the tie bars 2245'. A first portion of the tie bars 2245' is exposed at corners of and flush with the landing surfaces of the step 2215' and a second portion of the tie bars 2245' is also exposed at corners of and flush with the second portions 2200c-2' of the side surfaces 2200c'. The first portion of the tie bars 2245' is also plated with the second plating layer 2240'. In some embodiments, the thickness of a tie bar 2245' is half the thickness of a contact 2205'. In FIG. 22B, the semiconductor die 2250' is epoxied with the die attach pad 2255' and is electrically coupled with the plurality of contact 2205' using wirebonds. Alternatively, instead of wirebonds, solder balls are used to electrically couple the semiconductor die with the plurality of contacts. Although a single semiconductor die 2250' is described, it is contemplated that a singulated semiconductor device can include a plurality of semiconductor dice stacked therein and electrically coupled with each other and/or the plurality of contacts 2205'.

FIG. 22C illustrates a cross sectional view and an isometric view of a singulated semiconductor package 2200" resulting from the singulation step illustrated in FIG. 21D. Unlike the semiconductor packages 2200, 2200', each side of the semiconductor package 2200" has no substantial step since the blade used to singulate the semiconductor package has a width W2 that is substantially the same as W1 (width of the chemical etching trace). The semiconductor package 2200" has a bottom set of peripheral edges 2210" and a top set of peripheral edges 2230". Each of the edges in the top set of edges 2230" and a corresponding edge in the bottom set of edges 2210" of the same side are in the same plane. Each side surface 2200c" of the semiconductor package 2200" includes a first portion 2200c-1" and a second portion 2200c-2", wherein the second portion 2200c-2" and the first portion 2200c-1" substantially form a straight line. At least a part of the surface of the molding compound at the first portion 2200c-1" has an etched texture/pattern, while the entire surface of the molding compound at the second portion 2200c-2" has a sawed texture/pattern, which is different from the etched texture/pattern (e.g., different surface roughness/topographies). The semiconductor device 2200" includes the area of the bottom surface 2200a" being substantially the same as the area of the top surface 2200b".

The semiconductor package 2200" includes a formed leadframe that includes a plurality of contacts 2205". The depth of the first portion 2200c-1" is approximately half the thickness of a contact 2205". The plurality of contacts 2205" is located around the bottom set of peripheral edges 2210" of the singulated semiconductor package 2200". Each of the plurality of contacts 2205" includes a first planar surface 2205a-1" that is flush with the bottom surface 2200a" of the semiconductor device 2200", a first portion 2205b-1" of a side surface 2205b" that is flush with and/or slightly curved at the first portion 2200c-1" of the side surface 2200c" of the semiconductor device 2200", and a second portion 2205b-2" of the side surface 2205b" that is flush with the second portion 2200c-2" of the side surface 2200c" of the semiconductor device 2200". A first (or internal) plating layer 2235" that is adhered between the molding compound and the leadframe, is exposed at and flush with the second portions 2200c-2" of the side surfaces 2200c" of the semiconductor package 2200". The exposed copper of the leadframe is partially plated with a second plating layer 2240". The second plating layer 2240" partially plates the exposed surfaces of each contact 2205", namely, only the first planar surface 2205a-1" and the first portion 2205b-1" of the side surface 2205b" of each contact 2205'. The second portion 2205b-2" of each contact 2205" is exposed (unplated).

A semiconductor die 2250" is electrically coupled with the plurality of contacts 2205". In some embodiments, the formed leadframe also includes tie bars 2245" and a die attach pad 2255" that is coupled with the tie bars 2245". The tie bars 2245" are exposed at and flush with the second portions 2200c-2" of the side surfaces 2200c". In some embodiments, the thickness of a tie bar 2245" is half the thickness of a contact 2205". In FIG. 22C, the semiconductor die 2250" is epoxied with the die attach pad 2255" and is electrically coupled with the plurality of contact 2205" using wirebonds. Alternatively, instead of wirebonds, solder balls are used to electrically couple the semiconductor die with the plurality of contacts. Although a single semiconductor die 2250" is described, it is contemplated that a singulated semiconductor device can include a plurality of semiconductor dice stacked therein and electrically coupled with each other and/or the plurality of contacts 2205".

Figure 23A:
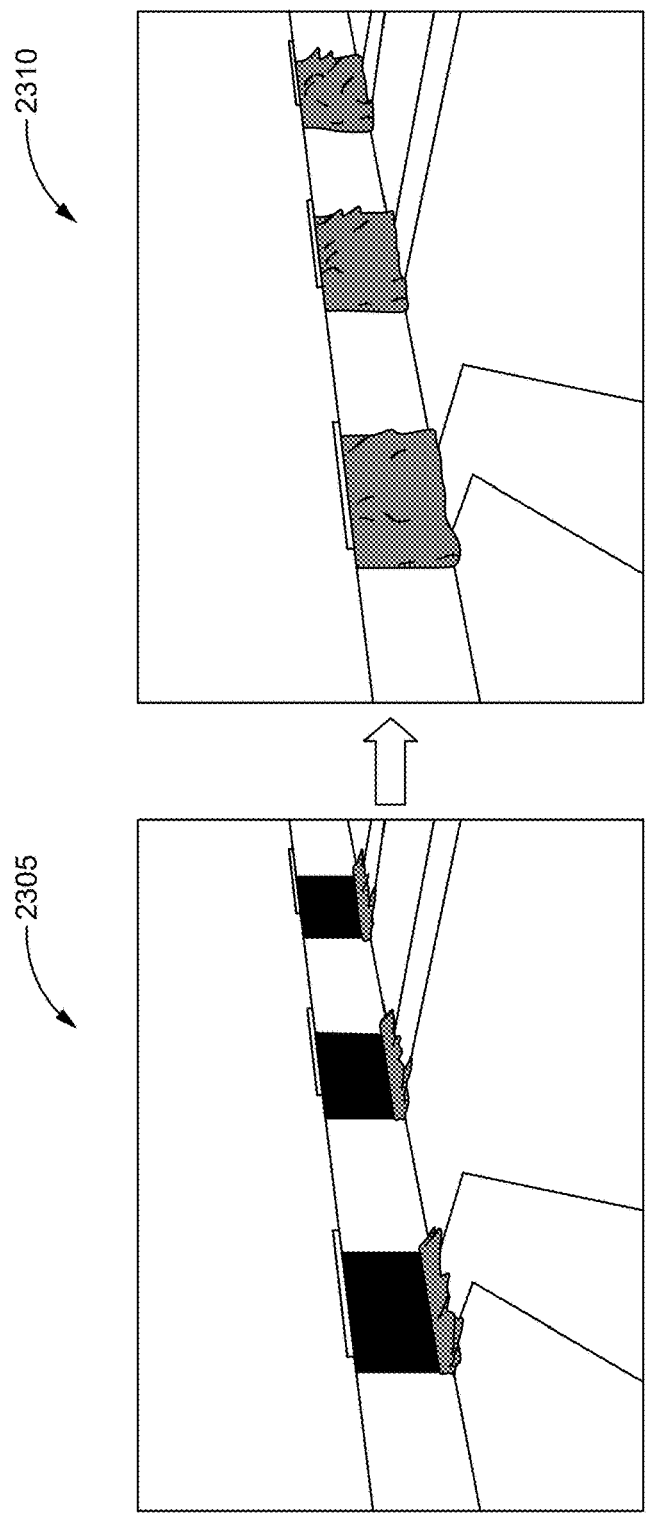
FIGS. 23A-23C illustrate explanations of other applications according to some embodiments.
Figure 23B:
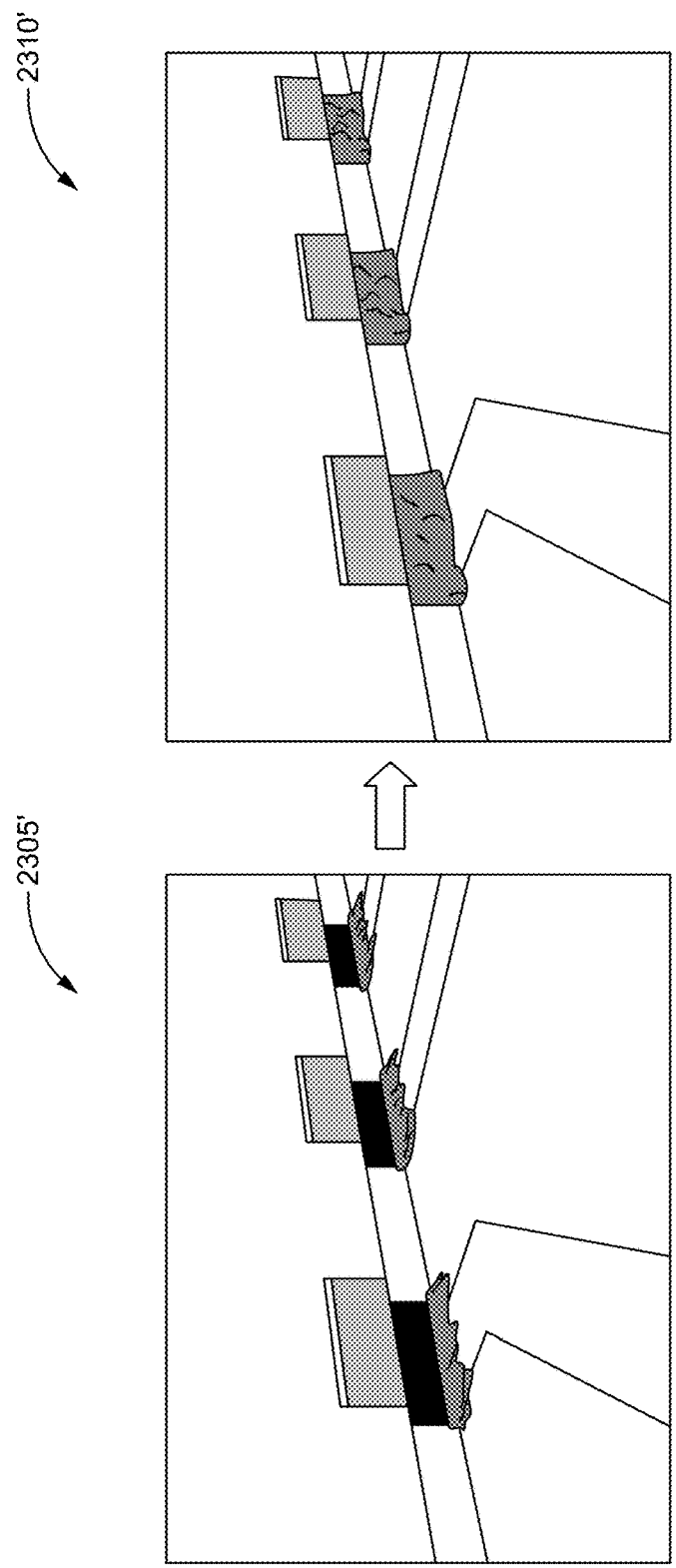
Figure 23C:
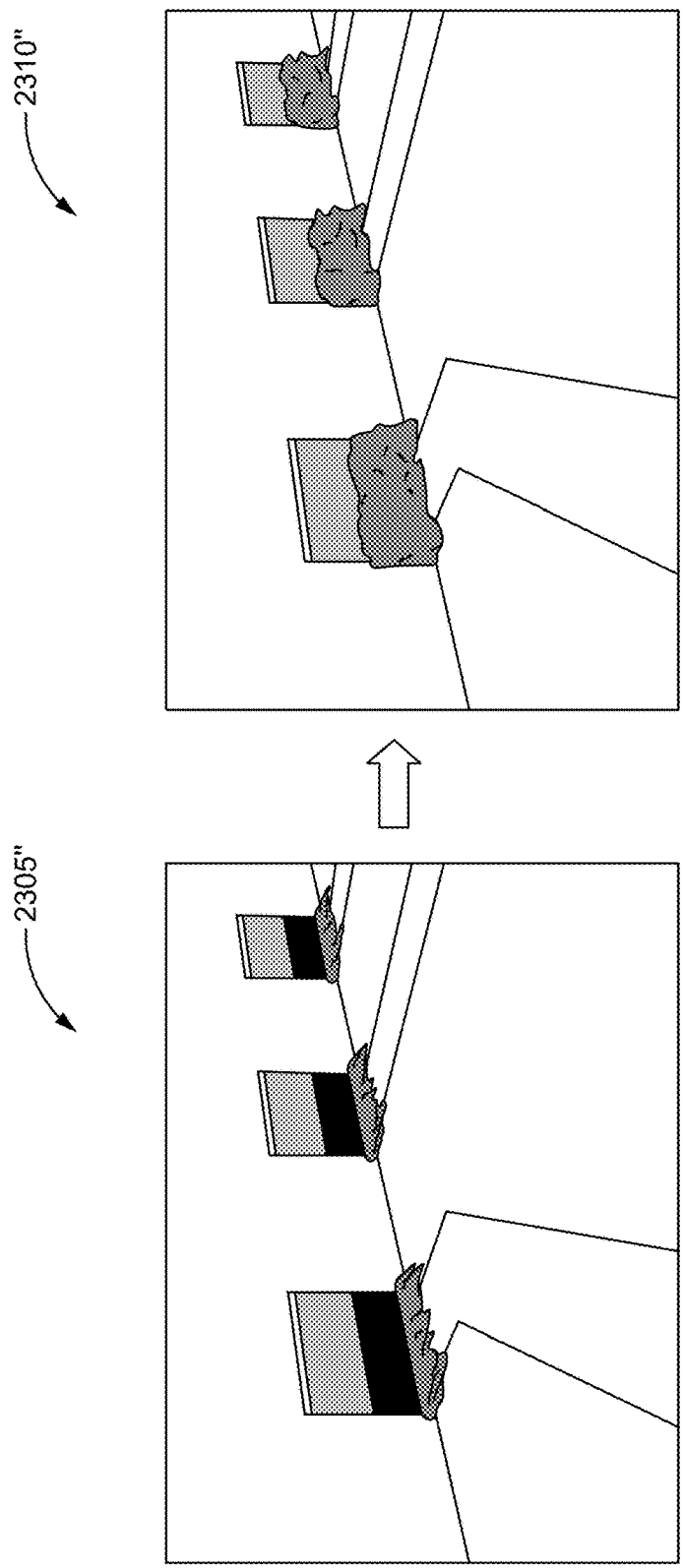

FIGS. 23A-23C illustrate other graphical explanations of applications according to some embodiments. FIG. 23A illustrates an application of the singulated semiconductor device of FIG. 22A, FIG. 23B illustrates an application of the singulated semiconductor device of FIG. 22B, and FIG. 23C illustrates an application of the singulated semiconductor device of FIG. 22C. In each of the FIGS. 23A-23C, the picture 2305, 2305', 2305" on the left shows a respective semiconductor package, on a PCB before reflow. Solder is applied between the plurality of contacts and PCB. After reflow, the result is shown in the picture 2310, 2310', 2310" on the right. The solder at least partially covers the side surfaces of the plurality of contacts, particularly the areas of the side surfaces that are plated, during soldering. The reliability of solder joint is good and can be determined as such by visual inspection.

One of ordinary skill in the art will realize other uses and advantages also exist. While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

I claim:

1. A semiconductor package comprising:
  a bottom package surface, a top package surface, and side package surfaces extending between the top package surface and the bottom package surface;
  a semiconductor die;
  a formed leadframe having a plurality of contacts, wherein each of the plurality of contacts includes an interfacing contact surface that is flush with the bottom package surface, an interior contact surface that is opposite the interfacing contact surface and that is electrically coupled with the semiconductor die, and a side contact surface that is at one of the side package surfaces;
  a molding compound encapsulating the semiconductor die and at least a portion of each of the plurality of contacts, wherein the molding compound includes a first portion and a second portion, wherein at least a part of a surface of first portion of the molding compound and a surface of the second portion of the molding compound have different textured consistencies;
  an internal plating layer between the formed leadframe and the molding compound, wherein the internal plating layer includes exterior ends that are flush with the second portion of the molding compound and is adhered to the interior contact surfaces of the plurality of contacts; and
  an external plating layer that is continuous plating layer directly adhered to both the interfacing surface and the side contact surface.

2. The semiconductor package of claim 1, wherein the thickness of each of the plurality of the contacts is the depth of the first portion of the molding compound.

3. The semiconductor package of claim 2, further comprising a bottom set of peripheral edges and a top set of peripheral edges.

4. The semiconductor package of claim 3, further comprising an intermediary set of peripheral edges located between the bottom set of peripheral edges and the top set of peripheral edges.

5. The semiconductor package of claim 4, wherein the first portion of the molding compound is between the bottom set of peripheral edges and the intermediary set of peripheral edges, and wherein the second portion of the molding compound is between the intermediary set of peripheral edges and the top set of peripheral edges.

6. The semiconductor package of claim 5, further comprising steps at sides of the semiconductor package, wherein each of the steps includes a landing surface at a side of the semiconductor package, runs the length of the side of the semiconductor package, separates a corresponding side package surface into a first portion of the corresponding side package surface and a second portion of the corresponding side package surface, and distinguishes the first portion of the molding compound from the second portion of the molding compound.

7. The semiconductor package of claim 6, wherein the first portion of the corresponding side package surface is a surface of the first portion of the molding compound, and the second portion of the corresponding side package surface is a surface of the second portion of the molding compound.

8. The semiconductor package of claim 7, wherein the internal plating layer further includes planar surfaces that are flush with the landing surfaces of the steps.

9. The semiconductor package of claim 8, wherein the external plating layer continuously extends from the side contact surface to and is directly adhered with the entirety of one of the planar surfaces of the internal plating layer.

10. The semiconductor package of claim 9, wherein the formed leadframe further includes:
  tie bars; and
  die attach pad coupled with the tie bars.

11. The semiconductor package of claim 10, wherein a portion of the tie bars is flush with the surface of first portion of the molding compound.

12. The semiconductor package of claim 11, wherein the portion of the tie bars that is flush with the surface of first portion of the molding compound, is externally plated.

13. The semiconductor package of claim 12, wherein the internal plating layer is also adhered with the tie bars.

14. A method of manufacturing semiconductor packages, comprising:
  obtaining an etched leadframe strip includes a plurality of dam bars and a plurality of contacts coupled with the plurality of dam bars;

at least partially plating a top side and at least partially plating a bottom side of the etched leadframe strip with a first plating material;

electrically coupling a plurality of semiconductor dice with the plurality of contacts;

encapsulating the plurality of semiconductor dice with a molding compound resulting in a molded leadframe strip;

performing a chemical etching procedure such that at least a portion of the etched leadframe strip is removed, exposing a first plurality of areas of the etched leadframe at a first portion of the molding compound;

plating the first plurality of areas of the etched leadframe with a second plating material; and performing partial cuts on the molding compound through a second portion of the molding compound and towards the plated areas, thereby singulating each of the semiconductor packages.

15. The method of claim 14, wherein a surface of the first portion of the molding compound and a surface the second portion of the molding compound of each of the singulated semiconductor packages have different surface topographies.

16. The method of claim 15, wherein portions of the first plating material that is between the etched leadframe strip and the molding compound are exposed on sides of each of the singulated semiconductor packages.

17. The method of claim 16, wherein the chemical etching procedure electrically isolates the plurality of semiconductor dice.

18. The method of claim 17, further comprising, after encaspulating the plurality of semiconductor dice and before performing a chemical etching procedure, performing a partial cuts on the bottom side of the etched leadframe and along the dam bars.

19. The method of claim 18, wherein at least one of the top side of the etched leadframe strip and the bottom side of the etched leaframe strip is fully plated with the first plating material.

20. The method of claim 19, wherein the partial cuts and the chemical etching procedure results in steps formed along sides of each of the singulated semiconductor packages.

* * * * *